(12) United States Patent
Takemura et al.

(10) Patent No.: US 8,129,100 B2
(45) Date of Patent: Mar. 6, 2012

(54) DOUBLE PATTERNING PROCESS

(75) Inventors: Katsuya Takemura, Joetsu (JP); Jun Hatakeyama, Joetsu (JP); Kazumi Noda, Joetsu (JP); Mutsuo Nakashima, Joetsu (JP); Masaki Ohashi, Joetsu (JP); Toshinobu Ishihara, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 385 days.

(21) Appl. No.: 12/418,090

(22) Filed: Apr. 3, 2009

(65) Prior Publication Data

US 2009/0253084 A1    Oct. 8, 2009

(30) Foreign Application Priority Data

Apr. 4, 2008  (JP) ................................ 2008-098024

(51) Int. Cl.
  *G03F 7/11*      (2006.01)
  *G03F 7/20*      (2006.01)
  *G03F 7/40*      (2006.01)
  *G03F 7/039*     (2006.01)
(52) U.S. Cl. ........................................ 430/326; 430/325
(58) Field of Classification Search ............... 430/270.1, 430/325, 326
  See application file for complete search history.

(56) References Cited

U.S. PATENT DOCUMENTS 4,775,609 A    10/1988    McFarland
(Continued)

FOREIGN PATENT DOCUMENTS

EP    0 361 907 A2    4/1990
(Continued)

OTHER PUBLICATIONS

B.J. Lin; "Semiconductor foundry, Lithography, and Partners". Micropatterning Division, TSMC, Inc., Proceedings of SPIE, vol. 4690, xxix, 2002.

(Continued)

*Primary Examiner* — Shean Wu
(74) *Attorney, Agent, or Firm* — Westerman, Hattori, Daniels & Adrian, LLP

(57) ABSTRACT

Double patterns are formed by coating a chemically amplified positive resist composition comprising an acid labile group-bearing resin and a photoacid generator and prebaking to form a resist film on a processable substrate, exposing the resist film to high-energy radiation, PEB, and developing with an alkaline developer to form a positive resist pattern, treating the positive resist pattern to be alkali soluble and solvent resistant, coating a negative resist composition and prebaking to form a reversal film, and exposing the reversal film to high-energy radiation, PEB, and developing with an alkaline developer to form a negative resist pattern. The last development step includes the reversal transfer step of dissolving away the positive resist pattern which has been converted to be soluble in developer.

14 Claims, 1 Drawing Sheet

U.S. PATENT DOCUMENTS

| | | | |
|---|---|---|---|
| 5,399,456 A | | 3/1995 | Spak et al. |
| 6,133,465 A | * | 10/2000 | Endo et al. ............ 556/436 |
| 6,448,420 B1 | | 9/2002 | Kinsho et al. |
| 6,936,400 B2 | | 8/2005 | Takasu et al. |
| 7,288,359 B2 | | 10/2007 | Iwasawa et al. |
| 2002/0146645 A1 | | 10/2002 | Tachikawa et al. |
| 2004/0241576 A1 | | 12/2004 | Iwashita et al. |
| 2004/0265745 A1 | | 12/2004 | Sho et al. |
| 2006/0134545 A1 | | 6/2006 | Iwashita et al. |
| 2006/0246377 A1 | | 11/2006 | Yamato et al. |
| 2009/0035697 A1 | | 2/2009 | Iwashita |
| 2009/0081595 A1 | * | 3/2009 | Hatakeyama et al. ........ 430/323 |
| 2009/0208886 A1 | * | 8/2009 | Takemura et al. ............ 430/326 |

FOREIGN PATENT DOCUMENTS

| | | |
|---|---|---|
| JP | 64-7525 U | 1/1989 |
| JP | 1-92741 A | 4/1989 |
| JP | 1-191423 A | 8/1989 |
| JP | 2-154266 A | 6/1990 |
| JP | 6-27654 A | 2/1994 |
| JP | 2000-327633 A | 11/2000 |
| JP | 2001-92154 A | 4/2001 |
| JP | 2002-268227 A | 9/2002 |
| JP | 2003-173027 A | 6/2003 |
| JP | 2004-4794 A | 1/2004 |
| JP | 2004-252146 A | 9/2004 |
| JP | 2004-294638 A | 10/2004 |
| JP | 2004-318080 A | 11/2004 |
| JP | 2004-341432 A | 12/2004 |
| JP | 2005-3862 A | 1/2005 |
| JP | 2005-3863 A | 1/2005 |
| JP | 2005-43420 A | 2/2005 |
| JP | 2005-336452 A | 12/2005 |
| JP | 2006-145775 A | 6/2006 |
| JP | 2006-145788 A | 6/2006 |
| JP | 2006-163066 A | 6/2006 |
| JP | 2006-195050 A | 7/2006 |
| JP | 2006-215067 A | 8/2006 |
| JP | 2006-301289 A | 11/2006 |
| JP | 2006-317803 A | 11/2006 |
| JP | 2006-350198 A | 12/2006 |
| WO | 2004/074242 A2 | 9/2004 |
| WO | 2004/074936 A1 | 9/2004 |

OTHER PUBLICATIONS

Soichi Owa, et al.; "Immersion lithography; its potential performance and issues", Optical Microlithography XVI, Proceedings of SPIE, vol. 5040, 2003, p. 724.

M. Maenhoudt, et al.; "Double Patterning scheme for sub-0.25 k1 single damascene structures at NA=0.75, λ=193nm", Optical Microlithography XVIII, Proceedings of SPIE, vol. 5754, 2005, p. 1508.

M. Shibuya, et al.; "Performance of Resolution Enhancement Technique Using Both Multiple Exposure and Nonlinear Resist", Jpn. J. Appl. Phys. vol. 33, pp. 6874-6877, Part 1, No. 12B, Dec. 1994.

* cited by examiner

DOUBLE PATTERNING PROCESS

CROSS-REFERENCE TO RELATED APPLICATION

This non-provisional application claims priority under 35 U.S.C. §119(a) on Patent Application No. 2008-098024 filed in Japan on Apr. 4, 2008, the entire contents of which are hereby incorporated by reference.

TECHNICAL FIELD

This invention relates to a double patterning process for forming a first pattern of reversal transfer and a second negative pattern simultaneously in an overlapping manner, involving the steps of forming a positive pattern through exposure and development, and heat treatment for converting the positive pattern to be alkali soluble, coating a second negative resist composition thereon, and forming a second negative pattern through exposure, bake and development, wherein the first pattern which has been converted to be alkali soluble can be removed at the same time as the last development.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690 xxix).

In the ArF immersion lithography, the space between the projection lens and the wafer is filled with water. Since water has a refractive index of 1.44 at 193 nm, pattern formation is possible even using a lens having a numerical aperture (NA) of 1.0 or greater. Theoretically, it is possible to increase the NA to nearly 1.44. It was initially recognized that the resolution could be degraded and the focus be shifted by a variation of water's refractive index with a temperature change. The problem of refractive index variation could be solved by controlling the water temperature within a tolerance of 1/100° C. while it was recognized that the impact of heat from the resist film upon light exposure drew little concern. There was a likelihood that micro-bubbles in water could be transferred to the pattern. It was found that the risk of bubble generation is obviated by thorough deaeration of water and the risk of bubble generation from the resist film upon light exposure is substantially nil. At the initial phase in 1980's of the immersion lithography, a method of immersing an overall stage in water was proposed. Later proposed was a partial-fill method of using a water feed/drain nozzle for introducing water only between the projection lens and the wafer so as to comply with the operation of a high-speed scanner. In principle, the immersion technique using water enabled lens design to a NA of 1 or greater. In optical systems based on traditional refractive index materials, this leads to giant lenses, which would deform by their own weight. For the design of more compact lenses, a catadioptric system was proposed, accelerating the lens design to a NA of 1.0 or greater. A combination of a lens having NA of 1.2 or greater with strong resolution enhancement technology suggests a way to the 45-nm node (see Proc. SPIE, Vol. 5040, p 724). Efforts have also been made to develop lenses of NA 1.35.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line-edge roughness (LER) of resist coating, defect-free MoSi laminate mask, reduced aberration of reflection mirror, and the like.

The water immersion lithography using a NA 1.35 lens achieves an ultimate resolution of 40 to 38 nm at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5O_{12}$) having a refractive index of at least 2 is the most promising material, but has the problems of birefringence and noticeable absorption. Even if a projection lens material with a refractive index of 1.8 or greater is developed, the liquid with a refractive index of 1.65 limits the NA to 1.55 at most, failing in resolution of 32 nm despite successful resolution of 35 nm. For resolution of 32 nm, a liquid with a refractive index of 1.8 or greater and resist and protective films with a refractive index of 1.8 or greater are necessary. Among the materials with a refractive index of 1.8 or greater, the high refractive index liquid seems least available. Such a liquid material has not been discovered because a tradeoff between absorption and refractive index is recognized in the art. In the case of alkane compounds, bridged cyclic compounds are preferred to linear ones in order to increase the refractive index, but the cyclic compounds undesirably have too high a viscosity to follow high-speed scanning on the exposure tool stage. If a liquid with a refractive index of 1.8 is developed, then the component having the lowest refractive index is the resist film, suggesting a need to increase the refractive index of a resist film to 1.8 or higher.

The process that now draws attention under the above-discussed circumstances is a double patterning process involving a first set of exposure and development to form a first pattern and a second set of exposure and development to form a pattern between features of the first pattern. See Proc. SPIE, Vol. 5754, p 1508 (2005). A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern.

An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching.

In either process, the hard mask is processed by two dry etchings. Both the former and latter processes require two etchings for substrate processing, leaving the issues of a reduced throughput and deformation and misregistration of the pattern by two etchings.

One method that proceeds with a single etching is by using a negative resist material in a first exposure and a positive resist material in a second exposure. Another method is by using a positive resist material in a first exposure and a negative resist material in a higher alcohol of 4 or more carbon atoms, in which the positive resist material is not dissolvable, in a second exposure. Since negative resist materials with low resolution are used, these methods entail degradation of resolution.

A method which does not involve post-exposure bake (PEB) and development between first and second exposures is the simplest method with high throughputs. This method involves first exposure, replacement by a mask having a shifted pattern drawn, second exposure, PEB, development and dry etching. However, the energy of light for second exposure offsets the energy of light for first exposure so that the contrast becomes zero, leading to a failure of pattern formation. If an acid generator capable of two photon absorption or a contrast enhancement layer (CEL) is used to provide nonlinear acid generation, then the energy offset is relatively reduced even when second exposure is performed at a half-pitch shifted position. Thus a pattern having a half pitch corresponding to the shift can be formed, though at a low contrast. See Jpn. J. Appl. Phy. Vol. 33 (1994) p 6874-6877, Part 1, No. 12B, December 1994. In this regard, if the mask is replaced on every exposure, the throughput is substantially reduced. Then first exposure is performed on a certain number of wafers before second exposure is performed. Due to acid diffusion during the standing time between the first and second exposures, there can occur dimensional variations which are of concern.

In addition to the double patterning technique, the technology for forming a fine space pattern or hole pattern includes use of negative resist, thermal flow, and RELACS. The negative resist material suffers from the problem that the resist itself has a low resolution as discussed above. The thermal flow is another process of forming a fine space pattern. The space pattern once formed is heated at a temperature above the glass transition temperature (Tg) of the resist pattern, causing the pattern to flow to narrow the spaces. The RELACS known as a further process of forming a fine space pattern is by applying on the space pattern a composition in a solvent in which the resist pattern is not soluble and adding chemical attachment by heat, thereby narrowing the space.

The method of forming a negative pattern by reversal of a positive pattern is well known from the past. For example, JP-A 2-154266 and JP-A 6-27654 disclose naphthoquinone resists capable of pattern reversal. JP-A 64-7525 describes exposure of selected portions of a film to focused ion beam (FIB) for curing and flood exposure whereby the cured portions are left behind. JP-A 1-191423 and JP-A 1-92741 describe exposure of a photosensitive agent of naphthoquinone diazide to form an indene carboxylic acid, heat treatment in the presence of a base into an indene which is alkali insoluble, and flood exposure to effect positive/negative reversal.

As to the positive/negative reversal method including exchange of developers, attempts were made to form negative patterns by development in an organic solvent of hydroxystyrene partially protected with tert-butoxycarbonyl (t-BOC) groups, and by development with super-critical carbon dioxide.

As to the positive/negative reversal method utilizing silicon-containing materials it is proposed to form a fine hole pattern by covering a space portion of a positive resist pattern with a silicon-containing film, effecting oxygen gas etching for etching away the positive pattern portion, thus achieving positive/negative reversal to leave a silicon-containing film pattern. See JP-A 2001-92154 and JP-A 2005-43420.

All the foregoing methods based on positive/negative reversal are impractical due to process complexity and fail to form a fine pattern by further processing a pattern reversed film.

CITATION LIST

Patent Document 1: JP-A 2-154266
Patent Document 2: JP-A 6-027654
Patent Document 3: JP-A 64-007525
Patent Document 4: JP-A 1-191423
Patent Document 5: JP-A 1-092741
Patent Document 6: JP-A 2001-092154
Patent Document 7: JP-A 2005-043420
Non-Patent Document 1: Proc. SPIE, Vol. 4690, xxix
Non-Patent Document 2: Proc. SPIE, Vol. 5040, p 724
Non-Patent Document 3: Proc. SPIE, Vol. 5754, p 1508 (2005)
Non-Patent Document 4: Jpn. J. Appl. Phy. Vol. 33 (1994) p 6874-6877, Part 1, No. 12B, December 1994

SUMMARY OF INVENTION

In connection with the fabrication of LSIs which are advancing toward higher integration and operating speeds, double patterning is proposed and reported as being able to process to a very fine pattern rule. However, the process is not simple, and is regarded rather complex as requiring first lithography, subsequent etching, second lithography, and further etching (two lithography and two etching steps). There is a desire to have a technique capable of processing by a single etching after patterning by two lithography processes. However, the technique of converting the first pattern to be insoluble in an organic solvent used in the second resist composition, and improvements in the resolving performance of both the first and second resist compositions remain as outstanding problems to be solved.

In addition to the double patterning technique, the technology for forming fine spaces is very important and includes use of negative resist, thermal flow, and RELACS. The negative resist material suffers from the problem that the resist itself has a low resolution. The thermal flow is another process of forming a fine space pattern. Because the quantity of pattern material available for flow is reduced as the feature size becomes finer, the thermal flow process becomes difficult to reserve a sufficient quantity of flow. In general, resist compositions capable of high resolution performance have a high glass transition temperature (Tg) so that a sufficient flow may not occur during the thermal flow step at a certain heating temperature. It is also said that the size reduction by thermal flow encounters a limit. The RELACS known as a further process of forming a fine space pattern is by adding chemical attachment to the space pattern by heat, thereby narrowing the space. There are problems that the amount of attachment varies depending on the type of resist composition of which spaces are formed, and variations occur during dimensional shrinkage by heat. Another potential problem is a likelihood of generating pattern defects.

In connection with the fabrication of LSIs which are advancing toward higher integration and operating speeds, there is a structure layer which requires a very fine pattern rule, especially fine space pattern. However, improving the miniaturization of only a space pattern is insufficient. Because in the same layer, there may be present an isolated line and a pattern having different pitch or different line/space ratio (duty ratio), the techniques for miniaturizing both spaces and isolated lines must be compatible. Since the factor for enhancing the resolution of spaces is utterly different from the factor for improving the resolution of isolated lines, the techniques for miniaturizing spaces and isolated lines are generally in tradeoff relationship as well as the improvement in process margin. Solving the miniaturization of spaces and isolated lines at the same time becomes more difficult as high-density integration and high-speed operation are accelerated.

On the other hand, if a positive pattern once formed at a high resolution can be reversed to be negative, a fine space pattern is obtainable. As mentioned above, a variety of methods for reversing a positive image formed of a positive resist material capable of high resolution into a negative pattern have been reported. All these methods based on positive/negative reversal are impractical due to process complexity. They fail to form a fine pattern by further processing a pattern reversed film. In the related art, only examples of reversal transfer are known while there are no examples of double patterning in which lithographic patterning is applied to a film subject to reversal transfer.

Accordingly, an object of the invention is to provide a double pattern forming process which can form a fine size pattern through simple reversal of a positive pattern resulting from patterning of a positive resist film.

The inventors have found that when a resin in a first chemically amplified positive resist composition of which a positive resist pattern is composed is subjected to partial crosslinking treatment, the crosslinking reaction is controlled to proceed to such an extent to provide the necessary organic solvent resistance and to keep a solubility in an alkaline developer; that when a reversal film is coated thereon, a fine space pattern can be formed through positive/negative reversal by the treatment. Additionally, when the film to be coated for reversal transfer purpose is a negative resist film, the film material to which the first resist pattern is reversal transferred can be processed by lithography. This enables double patterning.

Accordingly, in a first aspect, the invention provides a double pattern forming process comprising the steps of:

coating a chemically amplified positive resist composition onto a processable substrate, said resist composition comprising a resin comprising recurring units having an alkali-soluble group protected with an acid labile group which is eliminatable with acid, a photoacid generator, and a solvent, and prebaking the resist composition to remove the unnecessary solvent and form a resist film, exposing the resist film to high-energy radiation in a first pattern of exposed and unexposed areas, post-exposure baking for causing the acid generated by the acid generator upon exposure to act on the acid labile groups on the resin whereby the acid labile groups on the resin in the exposed area undergo elimination reaction so that the resin in the exposed area becomes alkali soluble, and developing the exposed resist film with an alkaline developer to form a first positive resist pattern, treating the first resist pattern so as to eliminate the acid labile groups on the resin in the first resist pattern and to induce crosslinking in the resin to such an extent that the resin may not lose a solubility in an alkaline developer, for thereby endowing the first resist pattern with resistance to an organic solvent to be used in a reversal film-forming composition, coating a reversal film-forming composition thereon to form a second resist film, said reversal film-forming composition being a chemically amplified negative resist composition comprising a resin comprising recurring units having an alkali-soluble group, a photoacid generator, an acid crosslinker, and a solvent, and prebaking the second resist composition to remove the unnecessary solvent and form the second resist film, and exposing the second resist film to high-energy radiation in a second pattern of exposed and unexposed areas, post-exposure baking for causing the acid generated upon exposure to act on the crosslinker, thereby converting the resin in the exposed area to be insoluble in alkaline developer, and developing the exposed second resist film with an alkaline developer to form a second negative resist pattern, wherein the last step of developing the exposed second resist film with an alkaline developer to form a second negative pattern includes the reversal transfer step of dissolving away the first positive pattern which has been converted to be soluble in the alkaline developer, so as to define a space pattern in the second negative resist film, thereby forming a reversal transfer pattern of the first positive resist film as well as the step of forming the second negative pattern.

The inventors have found that partial crosslinking between molecules of the resin of which the positive pattern of the first resist film is composed has a level that maintains a solubility in an alkaline developer resulting from elimination of acid labile groups and provides resistance to an organic solvent at the same time. This permits removal of the positive pattern portion in the final step of positive/negative reversal to be implemented with an alkaline developer, thus achieving a significant simplification of the process. Additionally, the film subject to reversal transfer is made of a chemically amplified negative resist composition which can be processed by lithography. This enables double patterning.

According to a preferred embodiment, in the step of exposing, baking and developing to form a second negative resist pattern, exposure to the second pattern is performed over the first positive pattern so as to define spaces, which are removable by alkaline development, between spaces in the space pattern resulting from reversal transfer of the first positive pattern, whereby alternate patterns of lines and spaces are formed on the processable substrate. Then, fine lines and spaces can be formed (or patterned) on the processable substrate by two lithography steps. Since this need be followed by a single etching only, a simplified double patterning process is provided.

In a preferred embodiment, in the step of exposing, baking and developing to form a second negative resist pattern, exposure to the second pattern is performed at a position remote from the first (positive) resist pattern, whereby the second negative resist pattern is formed on the processable substrate apart from the pattern resulting from reversal transfer of the first resist pattern.

This embodiment also provides a simplified double patterning process involving two lithographic steps to form patterns on the processable substrate and subsequent single etching. In the single patterning process (involving a single exposure step for patterning), improving the process margins of a fine space pattern and a pattern having an isolated line or different pitch or different line/space ratio (duty ratio) is believed quite difficult because of their tradeoff relationship. The double patterning process of the invention enables to improve both the process margins. That is, the reversed first resist pattern enables resolution of fine spaces, and a pattern having mixed isolated lines or different pitch or different line/space ratio (duty ratio) can be formed from the second negative resist composition. This leads to the advantage of improving the process margins of both the patterns.

In a preferred embodiment for implementing the step of forming a first resist pattern, the chemically amplified positive resist composition comprises a resin comprising (A) recurring units having a lactone ring and (B) recurring units of alicyclic structure having an alkali-soluble group protected with an acid labile group which is eliminatable with acid. While the lactone ring structure is known to impart adhesion to the resist film, the resin comprising such units is advantageously used in crosslink formation in the step of endowing the first resist pattern with organic solvent resistance.

In a preferred embodiment, the chemically amplified positive resist composition comprises a resin comprising (A) recurring units having a 7-oxanorbornane ring and (B) recurring units having an alkali-soluble group protected with an acid labile group of alicyclic structure which is eliminatable with acid, and the step of treating the first resist pattern so as to eliminate the acid labile groups on the resin in the first resist pattern is performed by heating whereby elimination of acid labile groups and crosslinking of the resin simultaneously take place. The 7-oxanorbornane ring advantageously serves to impart organic solvent resistance.

In a preferred embodiment, the recurring units having a 7-oxanorbornane ring are recurring units having the general formula (a).

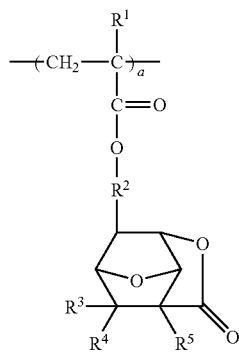

(a)

Herein $R^1$ is hydrogen or methyl, $R^2$ is a single bond or a straight, branched or cyclic $C_1$-$C_6$ alkylene group which may have an ether or ester group, and which has a primary or secondary carbon atom through which it is linked to the ester moiety in the formula, $R^3$, $R^4$, and $R^5$ are each independently hydrogen or a straight, branched or cyclic $C_1$-$C_6$ alkyl group, and "a" is a number in the range: $0<a<1.0$.

In a preferred embodiment, the recurring units having an alkali-soluble group protected with an acid labile group which is eliminatable with acid are recurring units having the general formula (b):

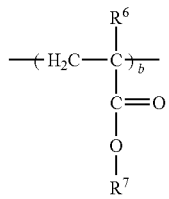

(b)

Herein $R^6$ is hydrogen or methyl, $R^7$ is an acid labile group, and b is a number in the range: $0<b\leq0.8$. The inclusion of units of the illustrated structure ensures that the dissolution rate is readily increased by reaction with acid, improving the resolution performance of the first resist pattern and facilitating removal with the alkaline developer of the second resist film serving as the film subject to reversal transfer.

In a preferred embodiment, the chemically amplified negative resist composition serving as a composition for forming a reversal film of the first resist pattern comprises a resin comprising recurring units having an alkali-soluble group which is a fluorinated hydroxyalkyl group.

In a preferred embodiment, the recurring units having a fluorinated hydroxyalkyl group are recurring units having the general formula (U) or (V).

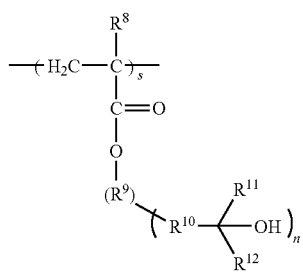

(U)

Herein $R^8$ is hydrogen or methyl, $R^9$ is a (n+1)-valent $C_1$-$C_{20}$ hydrocarbon group which may contain a heteroatom, $R^{10}$ is a single bond, $C_1$-$C_4$ alkylene group, or $C_1$-$C_4$ alkylene group in which some or all hydrogen atoms are substituted by fluorine atoms, $R^{11}$ and $R^{12}$ are each independently hydrogen, fluorine, $C_1$-$C_4$ alkyl group, or $C_1$-$C_4$ alkyl group in which some or all hydrogen atoms are substituted by fluorine atoms, at least either one of $R^{11}$ and $R^{12}$ contains fluorine, or either one of $R^{11}$ and $R^{12}$ may bond with $R^9$ to form a ring, n is 1 or 2, and s is a number in the range: $0<s\leq0.8$.

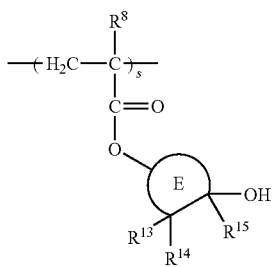
(V)

Herein $R^8$ is hydrogen or methyl, E is a $C_3$-$C_{12}$ cyclic hydrocarbon or bridged cyclic hydrocarbon group, which may contain hydroxy, —O— or —S—, $R^{13}$, $R^{14}$ and $R^{15}$ are each independently hydrogen, fluorine, or trifluoromethyl, at least one of $R^{13}$, $R^{14}$ and $R^{15}$ contains at least one fluorine atom, and s is a number in the range: $0 < s \leq 0.8$.

In a preferred embodiment, the chemically amplified negative resist composition comprises a resin comprising, in addition to the recurring units having a fluorinated hydroxyalkyl group, recurring units having the general formula (W).

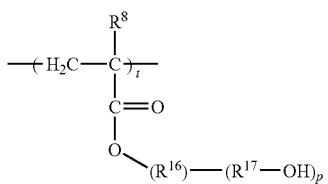
(W)

Herein $R^8$ is hydrogen or methyl, $R^{16}$ is a (p+1)-valent $C_1$-$C_{20}$ hydrocarbon group which may contain a heteroatom, $R^{17}$ is a single bond or $C_1$-$C_3$ alkylene group, p is an integer of 1 to 3, and t is a number in the range: $0 < t \leq 0.8$.

In a preferred embodiment, the chemically amplified negative resist composition comprises a resin comprising recurring units having an alkali-soluble group which is a fluorinated hydroxyalkyl group, the resin being a polysiloxane compound. This embodiment is advantageous in improving etching selectivity relative to the processable substrate.

In a preferred embodiment, the polysiloxane compound comprises recurring structural units having the general formulae (2) and (3).

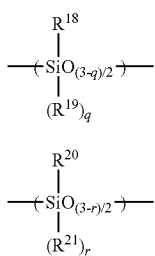

Herein $R^{18}$ is a $C_3$-$C_{20}$ monovalent organic group of straight, branched, cyclic or polycyclic structure which has a hydroxyl group on a carbon atom as a functional group, which has in total at least three fluorine atoms substituted on the carbon atoms bonded to the hydroxyl-bonded carbon atom, and which may contain a halogen, oxygen or sulfur atom in addition to the fluorine atoms; $R^{19}$ is a $C_1$-$C_6$ monovalent hydrocarbon group of straight, branched or cyclic structure; $R^{20}$ is a $C_3$-$C_{20}$ monovalent organic group of straight, branched, cyclic or polycyclic structure which has a hydroxymethyl group as a functional group, and which may further contain a halogen, oxygen or sulfur atom; $R^{21}$ is as defined for $R^{19}$; q is 0 or 1, and r is 0 or 1.

In a preferred embodiment, the step of treating the first resist pattern for endowing the first resist pattern with resistance to an organic solvent to be used in a reversal film-forming composition includes heating at a higher temperature than in the prebaking and PEB steps.

A pattern forming process using a protective coating is also contemplated herein. A further embodiment of the invention is a double pattern forming process comprising the steps of:

coating a chemically amplified positive resist composition onto a processable substrate, said resist composition comprising a resin comprising recurring units having an alkali-soluble group protected with an acid labile group which is eliminatable with acid, a photoacid generator, and a solvent, and prebaking the resist composition to remove the unnecessary solvent to form a resist film, coating a protective film-forming composition onto the resist film and heating to remove an unnecessary solvent to form a protective film, exposing the resist film to high-energy radiation in a first pattern of exposed and unexposed areas, post-exposure baking for causing the acid generated by the acid generator upon exposure to act on the acid labile groups on the resin whereby the acid labile groups on the resin in the exposed area undergo elimination reaction so that the resin in the exposed area becomes alkali soluble, and developing the exposed resist film with an alkaline developer to form a first positive resist pattern, treating the first resist pattern so as to eliminate the acid labile groups on the resin in the first resist pattern and to induce crosslinking in the resin to such an extent that the resin may not lose a solubility in an alkaline developer, for thereby endowing the first resist pattern with resistance to an organic solvent to be used in a reversal film-forming composition, coating a reversal film-forming composition thereon to form a second resist film, said reversal film-forming composition being a second chemically amplified negative resist composition comprising a resin comprising recurring units having an alkali-soluble group, a photoacid generator, an acid crosslinker and a solvent, and prebaking the second resist composition to remove the unnecessary solvent to form the second resist film, coating a protective film-forming composition onto the reversal film and heating to remove an unnecessary solvent to form a protective film, and exposing the second resist film to high-energy radiation in a second pattern of exposed and unexposed areas, post-exposure baking for causing the acid generated upon exposure to act on the crosslinker whereby the resin in the exposed area is converted to be insoluble in alkaline developer, and developing the exposed second resist film with an alkaline developer to form a second negative resist pattern, wherein the last step of developing the exposed second resist film with an alkaline developer to form a second negative pattern includes the reversal transfer step of dissolving away the first positive pattern which has been converted to be soluble in the alkaline developer, so as to define a space pattern in the second negative resist film, thereby forming a reversal transfer pattern of the first positive resist film as well as the step of forming the second negative pattern.

ADVANTAGEOUS EFFECTS OF INVENTION

According to the invention, a second negative resist composition serving as the reversal film-forming composition is coated onto the positive resist pattern. Even when a second resist film serving as the reversal film is formed by coating the negative resist composition in solution form in a hydroxyl-containing solvent or a highly polar solvent such as an ester or ketone, the second resist pattern made of the reversal film-forming material can fill in gaps (or spaces) in the first positive resist pattern without causing damage to the first positive resist pattern. In addition, the positive pattern resulting from the first positive resist film can be dissolved away in an alkaline developer. Thus positive/negative reversal can be carried out at a high accuracy through simple steps.

Image reversal from a positive pattern to a negative pattern by this method ensures that using a first fine line pattern, a fine space pattern of the same size can be reversal-formed. In the case of a trench pattern, a line pattern having a capability to form a finer feature size is formed through exposure, and this is converted into a trench pattern by the image reversal technology described above, whereby an ultra-fine trench pattern can be formed.

This positive/negative reversal method may be advantageously utilized in the following case. Due to an overdose of exposure, a finer size pattern can be formed from a positive resist film. While it is technically very difficult to form isolated spaces (trench pattern) below the exposure threshold, an ultra-fine trench pattern can be formed by first forming positive pattern lines thinner than the ordinary exposure threshold by virtue of an overdose of exposure and then reversing the pattern according to the method of the invention.

In this way, double patterning is enabled by transferring fine lines of the first resist to the second resist film through positive/negative reversal, thereby forming an ultra-fine space pattern and subjecting the second resist film to resolution.

BRIEF DESCRIPTION OF DRAWINGS

FIG. 1(A) illustrating a processable substrate and a first resist film disposed on a substrate;

FIG. 1(B) illustrating that the first resist film is exposed and developed;

FIG. 1(B-1) illustrating that lines of thinner size are finished in the first resist film by over-exposure and development;

FIG. 1(C) illustrating that the first resist pattern is deprotected and crosslinked;

FIG. 1(D) illustrating thick coating of a second resist composition for reversal transfer;

FIG. 1(D-1) illustrating thin coating of a second resist composition for reversal transfer;

FIG. 1(E-1) illustrating that a second resist space pattern is formed between first resist pattern by exposure;

FIG. 1(E-2) illustrating double pattern formation;

FIG. 1(E-3) illustrating another double patterning embodiment wherein exposure is performed at a position remote from the reversed first resist pattern;

FIG. 1(E-4) illustrating the other double patterning embodiment wherein fine spaces and isolated lines are formed through exposure at a position remote from the first resist pattern.

DESCRIPTION OF THE PREFERRED EMBODIMENTS

Figure 1:
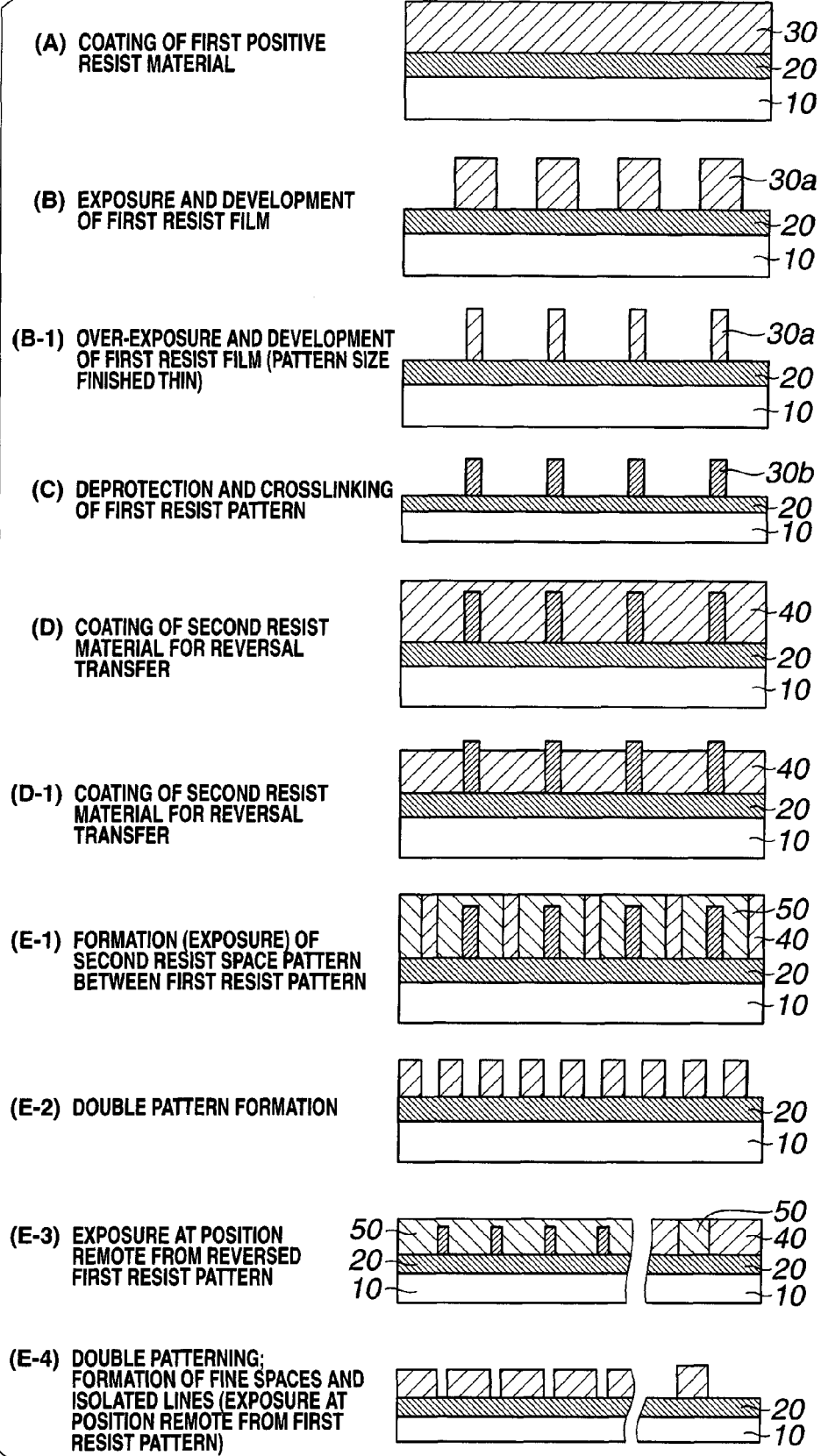
FIG. 1 schematically illustrates in cross-sectional view the double pattern forming process of the invention.

The terms "a" and "an" herein do not denote a limitation of quantity, but rather denote the presence of at least one of the referenced item. As used herein, the notation ($C_n$-$C_m$) means a group containing from n to m carbon atoms per group. The abbreviation "phr" refers to parts by weight per 100 parts by weight of resin. The terms "converted" and "reversed" are used interchangeably in the context that resist film is converted from an alkali-insoluble state to an alkali-soluble state, and the same applies to the term "reversal."

There were several problems to be overcome in the course of development works. In the situation where a reversal film is formed on a once formed positive pattern, how to deposit a new coating without disrupting the underlying pattern is one of such problems. Our initial approach to this problem is to form a reversal film after a positive pattern is crosslinked and insolubilized in a solvent.

In the invention, a film subject to reversal transfer is a second resist film so that double patterns may be formed. The inventors have found that insolubilization of the first pattern in a solvent used in coating of the second resist composition for forming a reversal film is implemented by utilizing crosslinking of the first pattern. It is preferred that this crosslinking reaction is performed by the existing technique or in the existing equipment in the current semiconductor device fabrication system, especially based on lithography. For example, it is believed unfavorable to introduce a high-energy radiation irradiating step capable of photo-reaction to facilitate crosslinking reaction because of a negative impact on productivity. It is also believed unfavorable to build a special expensive processing unit such as a high-energy radiation irradiating unit in the system.

It is desired that crosslinking of the first resist pattern to acquire resistance to an organic solvent used in the second resist composition serving as the reversal film be accomplished only by high-temperature baking. If possible only by high-temperature baking, the invention achieves outstanding practical effects because high-temperature hot plates are commonly used in the semiconductor device fabrication system.

In general, the solvents used in negative resist compositions are alcohols, for example, 2-methyl-1-butanol. Some alcoholic solvents may not dissolve the first positive resist film or pattern, while the first positive resist film or pattern is not fully insoluble in many alcoholic solvents. Thus, the first resist film, after patterning, can be damaged by the solvent for the second resist composition due to possible changes of polarity on the pattern surface or the like. Accordingly, the first resist pattern must have been crosslinked and thus fully insolubilized with respect to the solvent for the second resist composition.

It is also required that crosslinking of the first resist pattern to acquire resistance to an organic solvent used in the second resist composition serving as the reversal film do not detract from a high solubility of the first resist pattern in alkaline developer which is requisite for subsequent removal of the first resist pattern.

Making studies on the composition of a first chemically amplified positive resist material and the treating conditions thereof so as to induce thermal crosslinkage to impart resistance to an organic solvent used in the second resist material serving as the reversal film, the inventors have reached the present invention.

Another problem to be overcome is how to selectively remove the first positive pattern relative to the reversal film. Like the equipment referred to above, the means of removing the first pattern also exists in the current semiconductor fabrication system. In particular, it is preferred to remove the first pattern by the existing technique or unit used in the lithography system. It would be desirable to effect removal simply with an alkaline developer. Dry etching may also be used, with the disadvantages of process complexity and a lower throughput. It is desired to remove the first pattern by means of an alkaline development unit existing in the lithography system and transfer its image to a second pattern if possible.

It has been found that the pattern of unexposed areas in the first positive resist film is, of course, insoluble in an alkaline developer because alkali-soluble groups are kept protected with acid labile groups which are eliminatable with acid, and that when heated, a minor amount of acid which has diffused from exposed areas and remains in the pattern reacts with acid labile groups at high temperature to eliminate the acid labile groups so that the pattern of first positive resist film becomes alkali soluble. It has also been found that some acid labile groups are thermally eliminated by heating at high temperature. It is confirmed that by heating at high temperature, the first resist pattern is converted from the alkaline developer-insoluble positive behavior to an alkaline developer-soluble behavior. The reversal of the positive pattern of first resist film to alkaline solubility means that the first resist film can be readily removed together with the second resist film subject to reversal transfer, using an alkaline developer. Thus the reversed first resist pattern can be removed more readily than the second resist film during the alkaline development step of patterning the second resist film, achieving a high efficiency.

Making studies on a first resist composition and treating conditions thereof so as to induce crosslinking reaction in the first resist pattern to enhance resistance to an organic solvent used in coating of a second resist film subject to reversal transfer while maintaining alkali solubility of the reversed first resist pattern, the inventors have established a double pattern forming process involving reversal transfer of the first positive resist pattern to the second resist film and patterning of the second resist film.

Besides the problems to be overcome, there are several issues which must be taken into account in the practice of the invention.

A first issue relates to the thickness of a first resist film and a second resist film. To remove the first resist pattern which has been converted to be alkali soluble from the second resist film during alkaline development, the top of the first resist pattern must be exposed over the upper surface of the second resist film because otherwise the first resist pattern is not contacted with the alkaline developer or removed. Accordingly, it must be considered that the height of the first resist film pattern is increased and the coating thickness of the second resist film is reduced. However, it is generally believed favorable that the second resist film overlies and covers the first resist pattern because otherwise the height (aspect ratio=height/size of line pattern) of the second resist pattern becomes lower and due to process management. Coverage of the first resist pattern with the second resist film ensures that the second resist film fills in between features of the first resist pattern. Coverage of the first resist pattern with the second resist film, however, prevents the reversed first resist pattern from being removed by alkaline development. Thus the second resist film is designed to have some solubility in an alkaline developer so that the second resist film is somewhat slimmed (reduced in thickness) with the alkaline developer to provide access to alkali-soluble portions of the first resist pattern by the alkaline developer, allowing the developer to contact the first resist pattern.

However, in the invention, the second resist film to which the first resist pattern is transferred and which is to be patterned is a negative resist film. In general, for improved resolution performance, the negative resist film is generally designed so as to have an increased rate of alkaline dissolution in unexposed areas to enhance dissolution contrast. It becomes advantageous in implementing the invention that the second resist film overlying the first resist film which has been converted to be alkaline developer soluble has a rate of dissolution in advance.

Since the second resist film has a rate of dissolution in alkaline developer because of the negative type, the alkaline developer can gain an access and contact to the first resist pattern which has been converted to be alkali soluble. Then, the first resist pattern can be removed by alkaline dissolution from the second resist film as the reversal transfer film. Consideration is needed at this point. A possibility must be considered that the acid remaining in the first pattern or the acid generated by thermal decomposition of the acid generator remaining in the first pattern promote crosslinkage of the negative resist film to render the film insolubilized. If the acid remaining or newly generated in the first resist pattern invites even some crosslinkage of the negative resist film of the second resist material, then the negative resist film may be more or less insolubilized, which in turn, detracts from the resolution ability of the second resist film or prevents the alkaline developer from contacting the first resist pattern which has been converted to be soluble in alkaline developer. This risk must be taken into account.

Also, if the thickness of the second resist film coated is extremely thick, or if the second resist film overlying the first resist pattern is extremely thick, then the alkaline developer cannot reach the first resist pattern which has been converted to be soluble in alkaline developer, even when the second resist film has some solubility in alkaline developer. This leads to a failure in removal of the reversed first resist pattern. This risk must also be taken into account. It is then essential that the thickness of the second resist film be thinner than the thickness of the first resist film, provided that the thickness is measured as coated on a flat substrate. In an example where the first resist film is coated to a thickness of 1,200 Å on a flat substrate, if the second resist film is coated to a thickness of 600 Å on a flat substrate, the second resist film fills in between features of the first resist pattern and also overlies the first resist pattern. Since the second resist film overlying the first resist film has alkaline solubility due to the negative type, the second resist film is readily slimmed down to the first resist pattern, allowing the alkaline developer to contact the reversed first resist pattern and achieving reversal transfer of the first resist pattern.

The height of the first resist pattern is also an important consideration. When the first resist film is coated and patterned, the resulting first resist pattern often suffers from a top loss, that is, becomes lower in height. In addition, the first resist pattern undergoes thermal shrinkage under the action of heat released in the step of heating at high temperature the first resist pattern to induce crosslinking reaction to enhance its resistance to solvent used in coating of the second resist material, and this thermal shrinkage must also be taken into account. Therefore, the height of the first resist pattern prior to coating of the second resist material is important. The second resist film must be buried in the first resist pattern beyond that height, and overlie the first resist pattern.

It is preferred, needless to say, that the height of the first resist pattern prior to coating of the second resist material be higher, and the first resist pattern experience a less top loss. The reason is that if the first resist film experiences a substantial top loss and its pattern has a reduced height, the second resist film overlying the first resist pattern becomes thin and so, the double patterns including the reversal-transferred first resist pattern and the second resist pattern are finished to a reduced height (aspect ratio). The first resist composition must be formulated so that the first resist pattern subject to reversal transfer may have a height.

With the height of the first resist pattern taken into account, the preferred thicknesses of the first and second resist films coated are as follows. The thickness of the second resist film as coated on a flat substrate is preferably 60% to 50% of the thickness of the first resist film as coated on a flat substrate. If their thicknesses are below the range, the double patterns including the pattern of reversal transfer of the first resist pattern and the second resist pattern fail to acquire a height.

As described above, some acid which has diffused from exposed areas and remains in the first resist pattern or the acid generated by thermal decomposition of the photoacid generator in the resist composition remaining in the first resist pattern during the step of heating at high temperature for endowing the first resist pattern with resistance to solvent for the second resist film while maintaining a solubility in alkaline developer of the first resist pattern serves as a catalyst for promoting crosslinking reaction for embodying the desired effect to the solvent of the second resist material. In connection with this, positive addition to the first resist composition of a thermal acid generator capable of generating acid under the action of heat was devised for the purpose of making up for some acid in the first resist pattern. Regrettably, it was found that excess thermal acid generator added to the first resist composition can adversely affect the resolution performance and process margin of the first resist film when it is patterned. For example, the thermal acid generators are ammonium salts of acids. It is inferred that an anion exchange occurs between the ammonium salt and an onium salt used as the photoacid generator within the resist material, failing to achieve the desired resolution capability. For example, a resist material having a thermal acid generator added is observed as behaving to enhance the diffusion of acid acting on acid labile groups within the resist film. The enhanced acid diffusion exacerbates process margins of a resist pattern to be formed such as exposure latitude and mask error factor (MEF). In addition, when a thermal acid generator is positively added, it functions advantageously to assist the first resist film in developing alkali solubility and promoting crosslinking reaction to endow resistance to organic solvent used in coating of the second resist film. However, as discussed above, if excess acid is generated and remains in the first resist pattern, it noticeably acts on the crosslinking component in the second negative resist film, giving rise to the problem that in transfer of the reversed first resist pattern, the second resist film serving as a transfer film can become insolubilized and a space pattern to be transferred is not available. Moreover, if excess acid is generated and remains in the first resist pattern and diffuses noticeably into the second resist film, then it may act on the crosslinking component throughout the second resist film. Then the overall second resist film is converted to be alkali insoluble, failing to transfer the first resist pattern. Still worse than the failure to form a second resist pattern, the overall second resist film can be left intact.

It was also found that the addition of a thermal acid generator can deteriorate the thermal properties of the first resist pattern. The thermal acid generator added behaves as a plasticizer in the step of heating at high temperature the first resist pattern to induce crosslinkage to endow it with resistance to solvent for the second resist material, giving rise to the problem that the first resist pattern undergoes thermal flow during this heating step.

As discussed above, the addition of a thermal acid generator to the first resist composition is preferred in that it assists the first resist pattern in developing alkaline solubility and promotes crosslinking reaction to endow resistance to organic solvent used in coating of the second resist material, but excess addition gives rise to several problems. The thermal acid generator is added in such amounts as to avoid any substantial impacts on the lithography of patterning the first resist film, on the thermal properties of the first resist pattern, and on the second resist film. The amount of thermal acid generator added is generally up to 5%, preferably up to 3%, and more preferably 1 to 0.01% based on the weight of the base resin in the first resist composition.

While several issues to be considered in the practice of the invention are discussed, attention must also be paid to the thermal properties of the first resist pattern and the temperature associated with the step of heating at high temperature the first resist pattern to assist it in developing alkaline solubility and to facilitate crosslinking reaction to endow it with resistance to organic solvent used in coating of the second resist material.

The temperature associated with the step of heating at high temperature the first resist pattern to assist it in developing alkaline solubility and to facilitate crosslinking reaction to endow it with resistance to organic solvent used in coating of the second resist material should desirably be higher than the temperatures encountered in the process for patterning the first resist film involving coating, prebaking, exposure and PEB. If crosslinking reaction occurs even at a temperature which is close to the temperatures of prebaking and PEB in the first resist film patterning process, this leads to the risk that crosslinking reaction takes place during patterning of the first resist film, failing to avoid negative impacts on lithographic characteristics. It is undesirable that crosslinking reaction occur at a higher temperature than the glass transition temperature (Tg) of the first resist pattern. The reason is that if the first resist pattern is heated at a higher temperature than its Tg, the first resist pattern undergoes thermal flow to enlarge the pattern size or to disable fine-size processing. If thermal flow occurs, the resist pattern is reduced in height.

The temperature associated with the step of heating at high temperature the first resist pattern to assist it in developing alkaline solubility and to facilitate crosslinking reaction to endow it with resistance to organic solvent used in coating of the second resist material is preferably at least 150° C., and more preferably in the range of 180 to 220° C. A photoacid generator and a basic compound in a resist material generally serve as plasticizers to reduce the Tg of the resist pattern so that the thermal flow incipient temperature becomes lower. Since the photoacid generator and basic compound are components commonly compounded in the resist material, the Tg of the base resin itself must be elevated depending on the addition and plasticizing effects of these components. Accordingly, the base resin has an optimum Tg of at least 150° C., and preferably at least 180° C. If the heating temperature to facilitate crosslinking reaction is above 220° C., an appropriate first resist pattern to be reversal-transferred to the second resist film cannot be formed due to substantial thermal shrinkage and thermal damages of the first resist pattern. As discussed above, little crosslinking reaction takes place when the heating temperature to facilitate crosslinking reaction is below 150° C.

A further issue to be considered in the practice of the invention is a rate of dissolution in alkaline developer of the first resist pattern which has been converted to be alkali soluble. As described above, a minor amount of acid which has diffused from exposed areas and remains in the pattern reacts with acid labile groups at high temperature to eliminate the acid labile groups so that the first positive resist pattern becomes alkali soluble, and some acid labile groups are thermally eliminated by heating at high temperature. Thus, the first resist pattern can be converted from the alkaline developer-insoluble positive behavior to the alkaline developer-soluble behavior by heating at high temperature. An appropriate measure of dissolution rate is that the reversed first resist pattern has a dissolution rate in excess of 2 nm/sec when developed with a 2.38 wt % aqueous solution of tetramethylammonium hydroxide (TMAH) commonly used in the alkaline development of resist films.

Making extensive investigations on the task of converting the first positive resist pattern to be alkali soluble, the task of endowing the first resist pattern with organic solvent resistance during coating of the second resist material serving as a reversal transfer film, and other issues to be overcome in implementing the invention, the inventors have completed the double patterning process.

Now the invention is described in further detail.

The base resin in the first positive resist composition used in the pattern forming process is advantageously a polymer comprising recurring units having a lactone ring, more specifically recurring units having a 7-oxanorbornane ring, and preferably recurring units of the general formula (a). These units are used as adhesive units. The process is advantageously applicable with this polymer without adding a further component to the base resin.

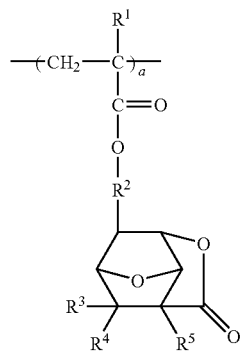

(a)

Herein $R^1$ is hydrogen or methyl, $R^2$ is a single bond or a straight, branched or cyclic $C_1$-$C_6$ alkylene group which may have an ether (—O—) or ester (—COO—) group, and which has a primary or secondary carbon atom through which it is linked to the ester moiety in the formula, $R^3$, $R^4$, and $R^5$ are each independently hydrogen or a straight, branched or cyclic $C_1$-$C_6$ alkyl group, and "a" is a number in the range: 0<a<1.0.

Examples of the $C_1$-$C_6$ alkylene group include methylene, ethylene, n-propylene, isopropylene, n-butylene, isobutylene, sec-butylene, n-pentylene, isopentylene, cyclopentylene, n-hexylene, and cyclohexylene.

Examples of the $C_1$-$C_6$ alkyl group include methyl, ethyl, n-propyl, isopropyl, n-butyl, isobutyl, sec-butyl, n-pentyl, isopentyl, cyclopentyl, n-hexyl, and cyclohexyl.

The monomers from which recurring units of formula (a) are derived are monomers Ma of the following formula wherein $R^1$ to $R^5$ are as defined above.

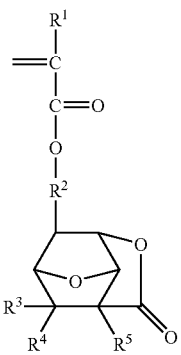

Ma

Exemplary monomers Ma are shown below.

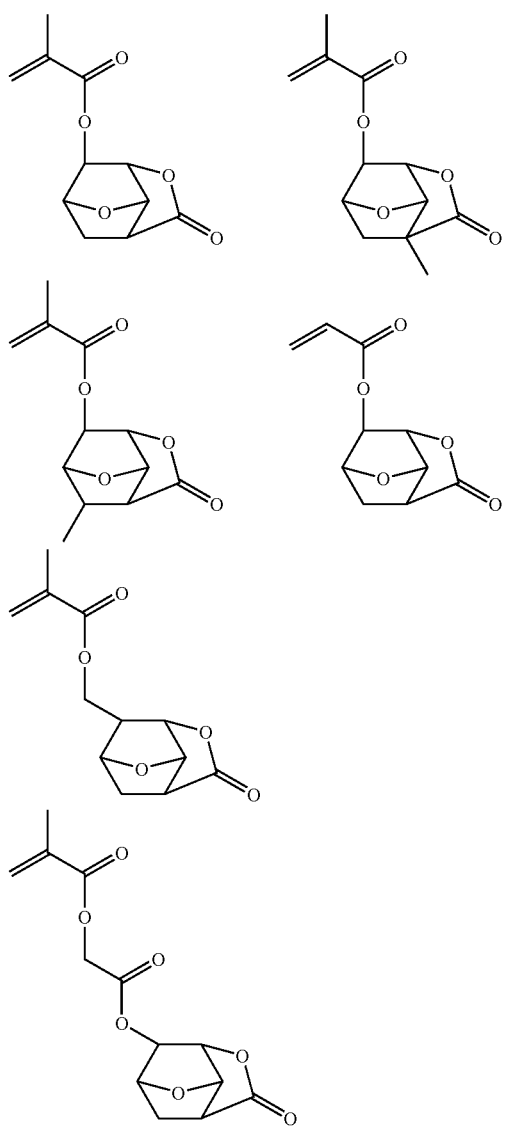

-continued

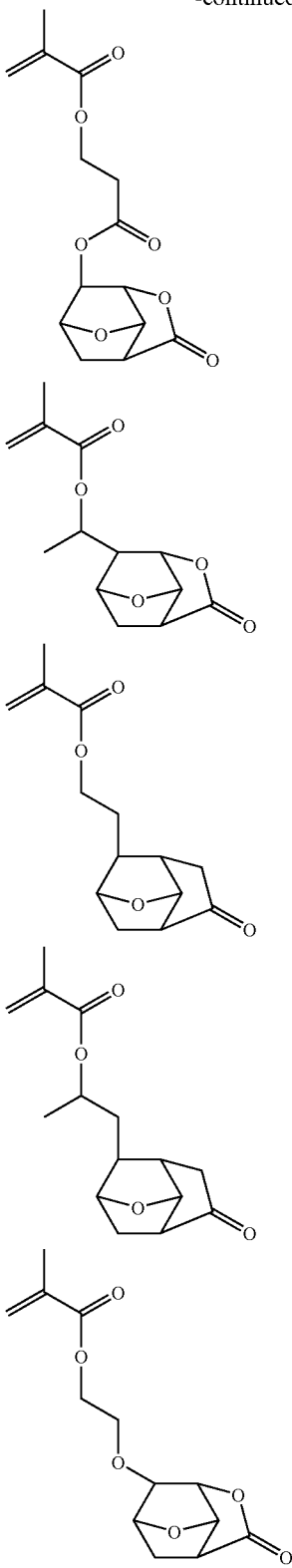

In the embodiment of the process, once a first resist pattern is formed through exposure and development, deprotection of acid labile groups and crosslinking are brought about under the action of acid and heat. A second resist film serving as a reversal film is coated thereon, patterned and alkali developed. The first resist pattern is removed at the same time as the last development, forming double patterns.

The acid contributing to crosslinking reaction may include the acid which has diffused from exposed areas and remains in the first resist pattern and the acid resulting from thermal decomposition of the residual photoacid generator by heating. Further a minor amount of a thermal acid generator capable of generating an acid upon heating may be added to the resist composition.

The first resist pattern based on the polymer comprising recurring units having 7-oxanorbornane rings and recurring units having acid labile groups is converted into a film which is alkali soluble as a result of deprotection of acid labile groups and which is insoluble in a solvent (i.e., solvent in a reversal film or second resist pattern-forming composition) as a result of crosslinking of 7-oxanorbornane ring. Therefore, even when a solution of reversal or second resist film-forming material in an organic solvent is coated on the first resist pattern, no intermixing occurs between the first resist pattern and the reversal film-forming second resist composition.

During subsequent treatment with an alkaline developer for patterning the second resist film, a surface layer of the reversal or second resist film is dissolved down to the level of the first resist pattern, after which dissolution of the first resist pattern is commenced, whereby image reversal is accomplished. With respect to the dissolution mechanism that the second resist film (subject to reversal transfer) overlying the first resist pattern is dissolved down to the level of the reversed first resist pattern, the second resist film subject to reversal transfer has a rate of dissolution due to the negative type so that it may be slimmed down to the level of the reversed first resist pattern whereby the first resist pattern can be dissolved away in the alkaline developer and removed.

If a polymer comprising oxirane or oxetane-bearing recurring units is used as the resist base resin, it fails to function as the desired first positive resist material in the inventive process, because the oxirane or oxetane ring has so high a rate of acid-catalyzed cleavage reaction that crosslinking takes place at the resist processing temperature, for example, a post-exposure baking (PEB) temperature of about 90 to 130° C., whereby the polymer becomes alkali insoluble. In contrast, the inventive polymer undergoes no crosslinking at the heating temperature range of PEB because the 1,4-epoxy bond of 7-oxanorbornane ring is low reactive in the acid-catalyzed cleavage reaction as compared with the oxirane or oxetane ring. The recurring units having 7-oxanorbornane ring are stable relative to acid during the process until development, and serve as hydrophilic groups to exert the function of improving adhesion and alkali solubility. However, under the action of acid remaining in the pattern after development or acid generated upon heating and heating at or above 160° C., the 1,4-epoxy bond of 7-oxanorbornane ring is cleaved so that crosslinking reaction takes place whereby the polymer becomes insoluble in the solvent and at the same time, the acid and heat cause deprotection of acid labile groups whereby alkali solubility is increased.

The base resin in the first positive resist composition used in the pattern forming process is advantageously a polymer comprising crosslinkable recurring units represented by the general formula (a) and recurring units having an acid labile group represented by the following general formula (b).

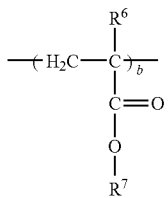
(b)

Herein $R^6$ is hydrogen or methyl, $R^7$ is an acid labile group, and b is a number in the range: $0<b\leqq0.8$.

The monomers from which recurring units of formula (b) are derived are monomers Mb of the following general formula wherein $R^6$ and $R^7$ are as defined above.

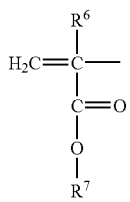
Mb

The acid labile group represented by $R^7$ in formula (b) may be selected from a variety of such groups, specifically groups of the following formulae (AL-10) and (AL-11), tertiary alkyl groups of the following formula (AL-12), and oxoalkyl groups of 4 to 20 carbon atoms, but not limited thereto.

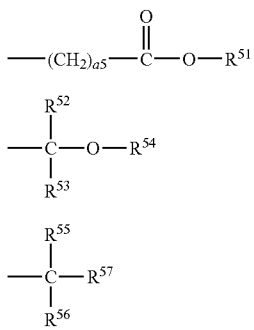

In formulae (AL-10) and (AL-11), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

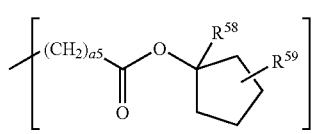
(AL-10)-1

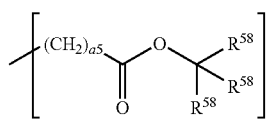
(AL-10)-2

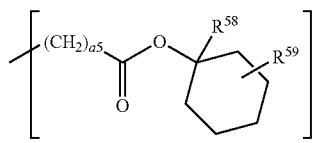
(AL-10)-3

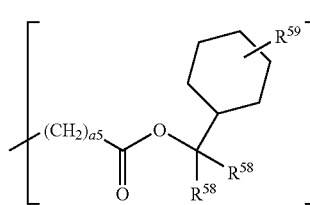
(AL-10)-4

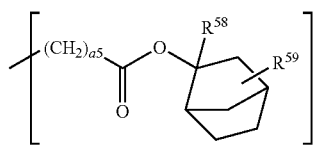
(AL-10)-5

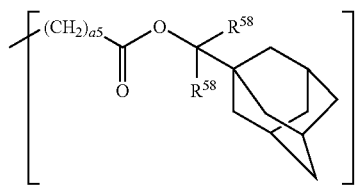
(AL-10)-6

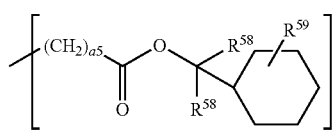
(AL-10)-7

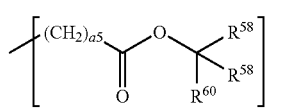
(AL-10)-8

(AL-10)-9

[—(CH₂)ₐ₅—O—C(R⁵⁸)(R⁵⁸)—(adamantyl with R⁵⁹)]
         ‖
         O (AL-10)-10

[—(CH₂)ₐ₅—O—C(R⁵⁸)—(adamantyl)]
         ‖
         O

In formulae (AL-10)-1 to (AL-10)-10, R⁵⁸ is independently a straight, branched or cyclic $C_1$-$C_8$ alkyl group, $C_6$-$C_{20}$ aryl group or $C_7$-$C_{20}$ aralkyl group; R⁵⁵ is hydrogen or a straight, branched or cyclic $C_1$-$C_{20}$ alkyl group; R⁶⁰ is a $C_6$-$C_{20}$ aryl group or $C_7$-$C_{20}$ aralkyl group; and "a5" is an integer of 0 to 10.

Illustrative examples of the acetal group of formula (AL-11) include those of the following formulae (AL-11)-1 to (AL-11)-34.

(AL-11)-1  —CH₂—O—CH₃

(AL-11)-2  —CH₂—O—CH₂—CH₃

(AL-11)-3  —CH₂—O—(CH₂)₂—CH₃

(AL-11)-4  —CH₂—O—(CH₂)₃—CH₃

(AL-11)-5  —CH₂—O—CH(CH₃)—CH₃

(AL-11)-6  —CH₂—O—C(CH₃)₂—CH₃

(AL-11)-7  —CH(CH₃)—O—CH₃

(AL-11)-8  —CH(CH₂CH₃)—O—CH₃

(AL-11)-9  —CH(CH₂CH₂CH₃)—O—CH₃ (with (CH₂)₂ branch)

(AL-11)-10  —CH(CH₃)—O—CH₂—CH₃

(AL-11)-11  —CH(CH₂CH₃)—O—CH₂—CH₃

(AL-11)-12  —CH(CH(CH₃)CH₃)—O—CH₂—CH₃

(AL-11)-13  —CH(CH₃)—O—(CH₂)₂—CH₃

(AL-11)-14  —CH(CH₂CH₃)—O—(CH₂)₂—CH₃

(AL-11)-15  —CH(CH(CH₃)₂)—O—(CH₂)₂—CH₃

(AL-11)-16  —CH₂—O—(cyclopentyl)

(AL-11)-17  —CH₂—O—(cyclohexyl)

(AL-11)-18  —C(CH₃)₂—O—CH₃

(AL-11)-19  —C(CH₃)₂—O—CH₂—CH₃

(AL-11)-20  —CH₂—O—(phenyl)

(AL-11)-21  —CH₂—O—CH₂—(phenyl)

(AL-11)-22  —CH₂—O—CH₂CH₂—(phenyl)

(AL-11)-23  —CH₂—O—(cyclohexyl)

(AL-11)-24  —CH₂—O—CH₂—(cyclohexyl)

(AL-11)-25  —CH₂—O—(norbornyl)

(AL-11)-26  —CH₂—O—CH₂—(norbornyl)

(AL-11)-27  —CH₂—O—(bicyclic group)

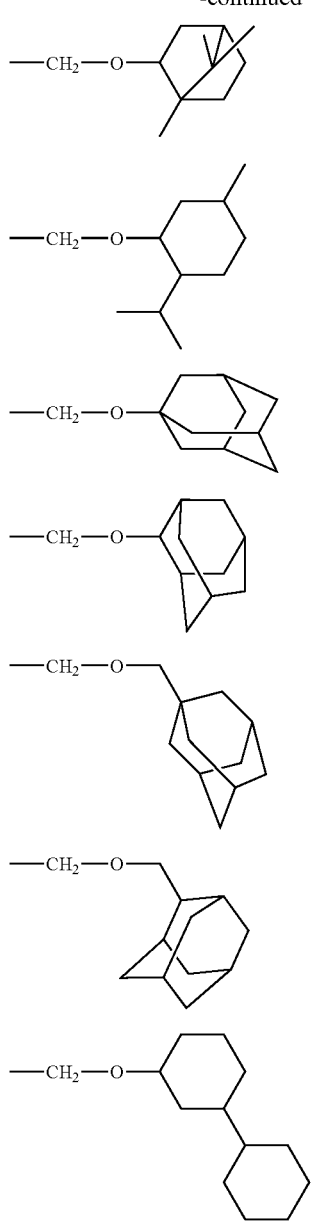

Other examples of acid labile groups include those of the following formula (AL-11a) or (AL-11b) while the polymer may be crosslinked within the molecule or between molecules with these acid labile groups.

(AL-11a)

$$-\overset{R^{61}}{\underset{R^{62}}{C}}(O-R^{63})_{b5}-O-A-[O-(R^{63}-O)_{d5}\overset{R^{61}}{\underset{R^{62}}{C}}-]_{c5}$$

(AL-11b)

$$-\overset{R^{61}}{\underset{R^{62}}{C}}-O-R^{63}-B-A-[B-(R^{63}-O)_{d5}\overset{R^{61}}{\underset{R^{62}}{C}}-]_{c5}$$

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl groups or halogen atoms. The subscript c5 is preferably an integer of 1 to 3.

The crosslinking acetal groups of formulae (AL-11a) and (AL-11b) are exemplified by the following formulae through (AL-11)-42.

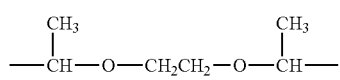
(AL-11)-35

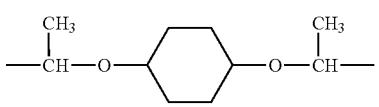
(AL-11)-36

(AL-11)-37

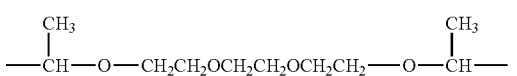
(AL-11)-38

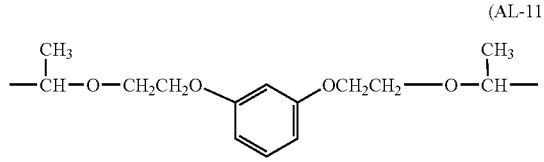
(AL-11)-39

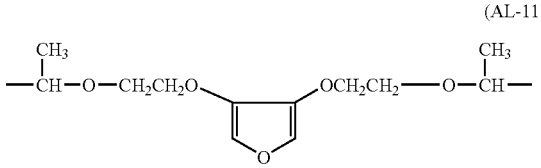
(AL-11)-40

-continued
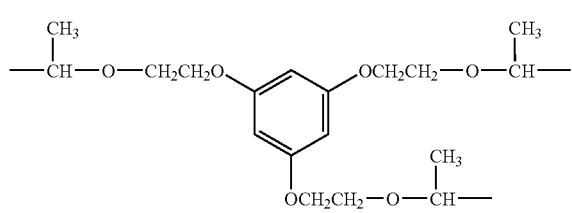
(AL-11)-41
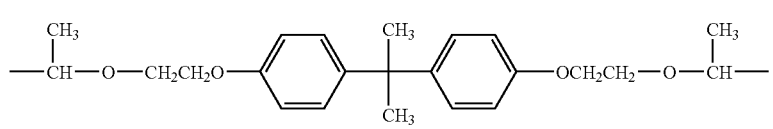
(AL-11)-42
Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.
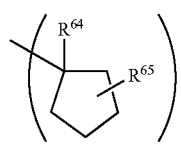
(AL-12)-1
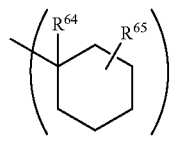
(AL-12)-2
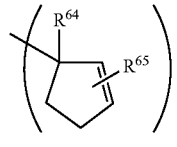
(AL-12)-3
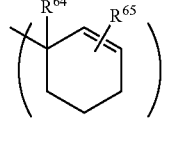
(AL-12)-4
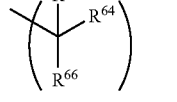
(AL-12)-5
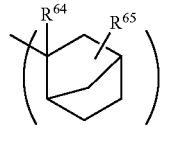
(AL-12)-6
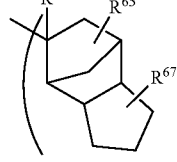
(AL-12)-7
-continued
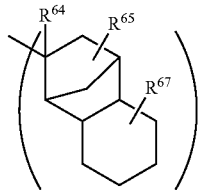
(AL-12)-8
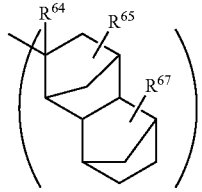
(AL-12)-9
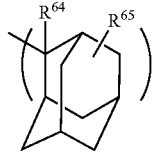
(AL-12)-10
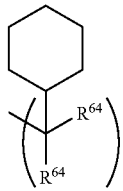
(AL-12)-11
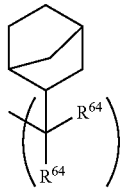
(AL-12)-12
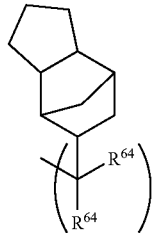
(AL-12)-13

-continued (AL-12)-14
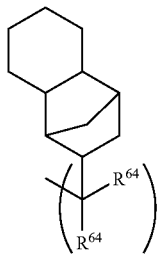

(AL-12)-15
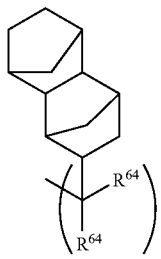

(AL-12)-16
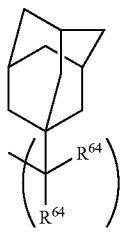

Herein $R^{64}$ is independently a straight, branched or cyclic $C_1$-$C_8$ alkyl group, $C_6$-$C_{20}$ aryl group or $C_7$-$C_{20}$ aralkyl group; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With $R^{68}$ representative of a di- or more valent alkylene or arylene group included as shown in formulae (AL-12)-17 and (AL-12)-18, the polymer may be crosslinked within the molecule or between molecules. In formulae (AL-12)-17 and (AL-12)-18, $R^{64}$ is as defined above; $R^{68}$ is a straight, branched or cyclic $C_1$-$C_{20}$ alkylene group or arylene group, which may contain a heteroatom such as oxygen, sulfur or nitrogen; and b6 is an integer of 1 to 3.

(AL-12)-17
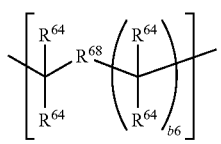

(AL-12)-18
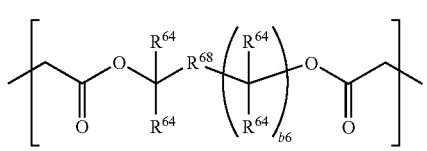

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

—(CH$_2$)$_4$OH (AL-13)-1

—(CH$_2$)$_2$O(CH$_2$)$_3$CH$_3$ (AL-13)-2

 (AL-13)-3

—(CH$_2$)$_2$O(CH$_2$)$_2$OH (AL-13)-4

—(CH$_2$)$_6$OH (AL-13)-5

 (AL-13)-6

 (AL-13)-7

Of the acid labile groups of formula (AL-12), groups having an exo-form structure represented by the formula (AL-12)-19 are preferred.

(AL-12)-19
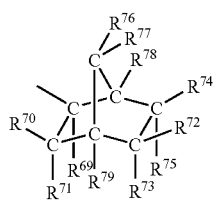

Herein, $R^{69}$ is a straight, branched or cyclic $C_1$-$C_8$ alkyl group or a substituted or unsubstituted $C_6$-$C_{20}$ aryl group; $R^{70}$ to $R^{75}$, $R^{78}$ and $R^{79}$ are each independently hydrogen or a monovalent hydrocarbon group, typically alkyl, of 1 to 15 carbon atoms which may contain a heteroatom; and $R^{76}$ and $R^{77}$ are hydrogen. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$, taken together, may form a ring with the carbon atom(s) to which they are attached, and in this case, each R is a divalent hydrocarbon group, typically alkylene, of 1 to 15 carbon atoms which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19:
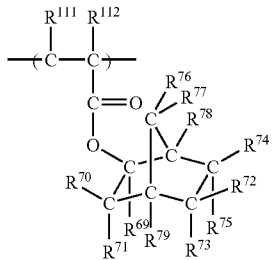
are derived are described in U.S. Pat. No. 6,448,420 (JP-A 2000-327633). It is noted that $R^{111}$ and $R^{112}$ are each independently hydrogen, methyl, —COOCH$_3$, —CH$_2$COOCH$_3$ or the like. Illustrative non-limiting examples of suitable monomers are given below.
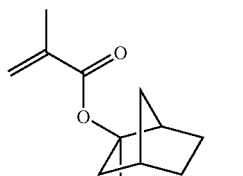
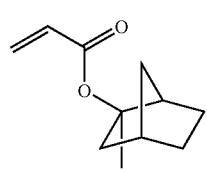
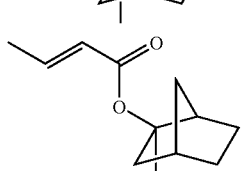
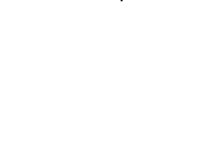
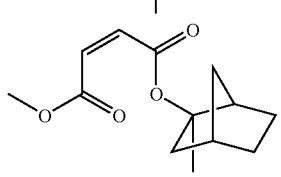
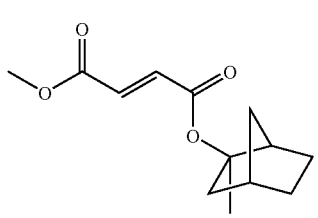
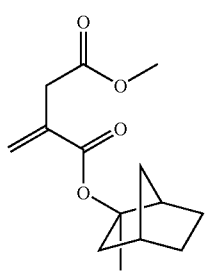
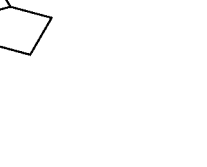
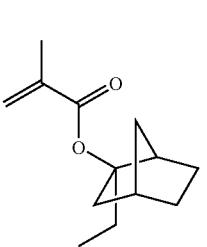
-continued
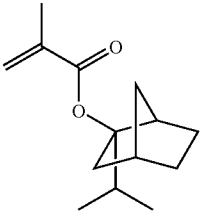
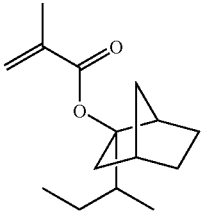
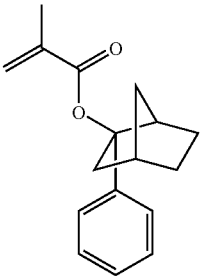
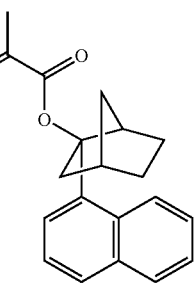
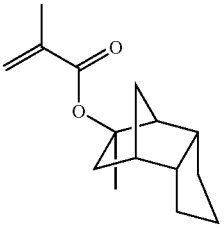
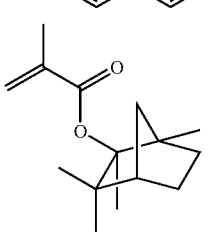
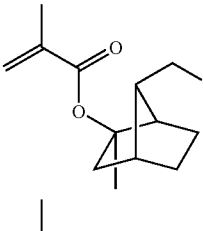
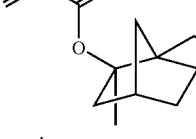
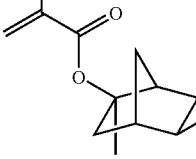
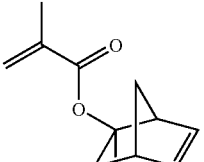
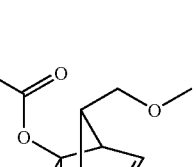
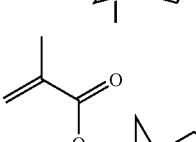
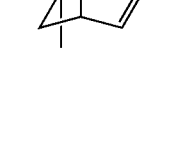

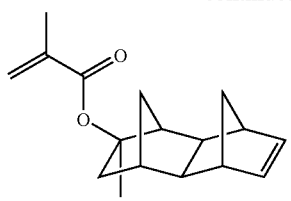

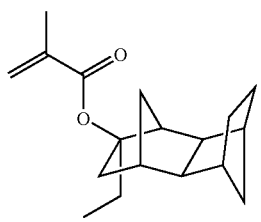

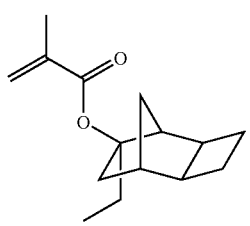

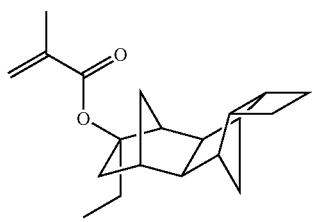

Also included in the acid labile groups of formula (AL-12) are acid labile groups having furandiyl, tetrahydrofurandiyl or oxanorbornanediyl as represented by the following formula (AL-12)-20.

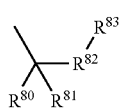
(AL-12)-20

Herein, $R^{80}$ and $R^{81}$ are each independently a monovalent hydrocarbon group, typically a straight, branched or cyclic $C_1$-$C_{10}$ alkyl. $R^{80}$ and $R^{81}$, taken together, may form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic $C_1$-$C_{10}$ alkyl, which may contain a heteroatom.

Examples of the monomers from which the recurring units substituted with acid labile groups having furandiyl, tetrahydrofurandlyl and oxanorbornanediyl as represented by the formula:

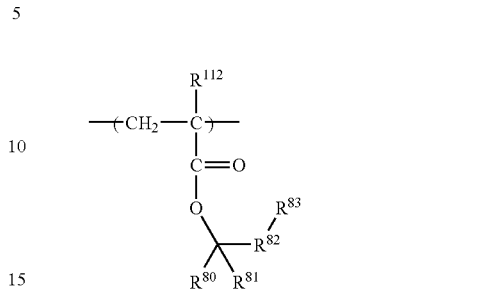

(wherein $R^{80}$ to $R^{83}$, and $R^{112}$ are as defined above) are derived are shown below. Note that Me is methyl and Ac is acetyl.

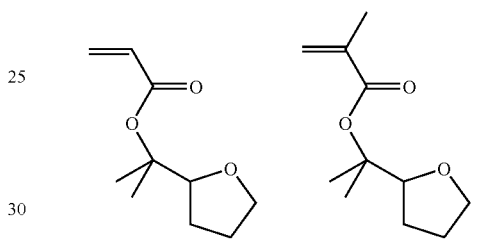

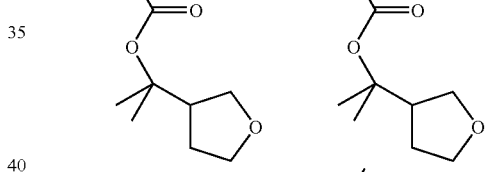

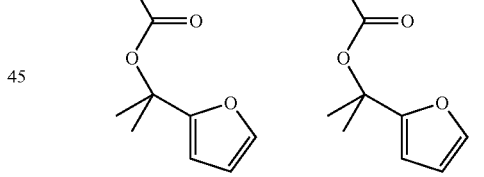

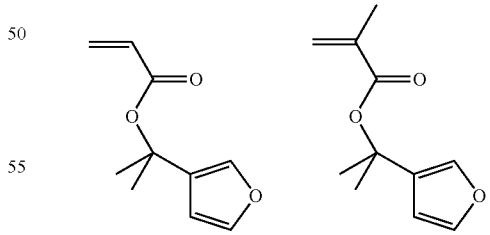

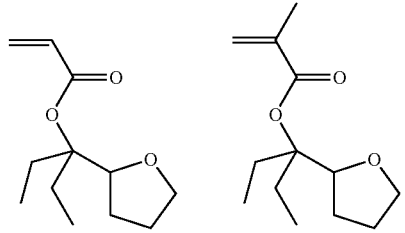

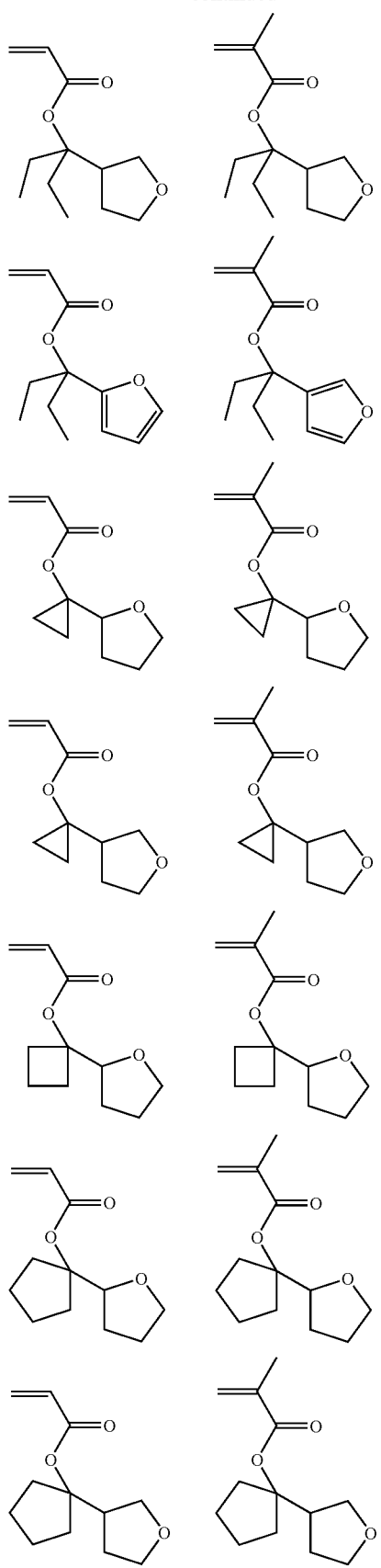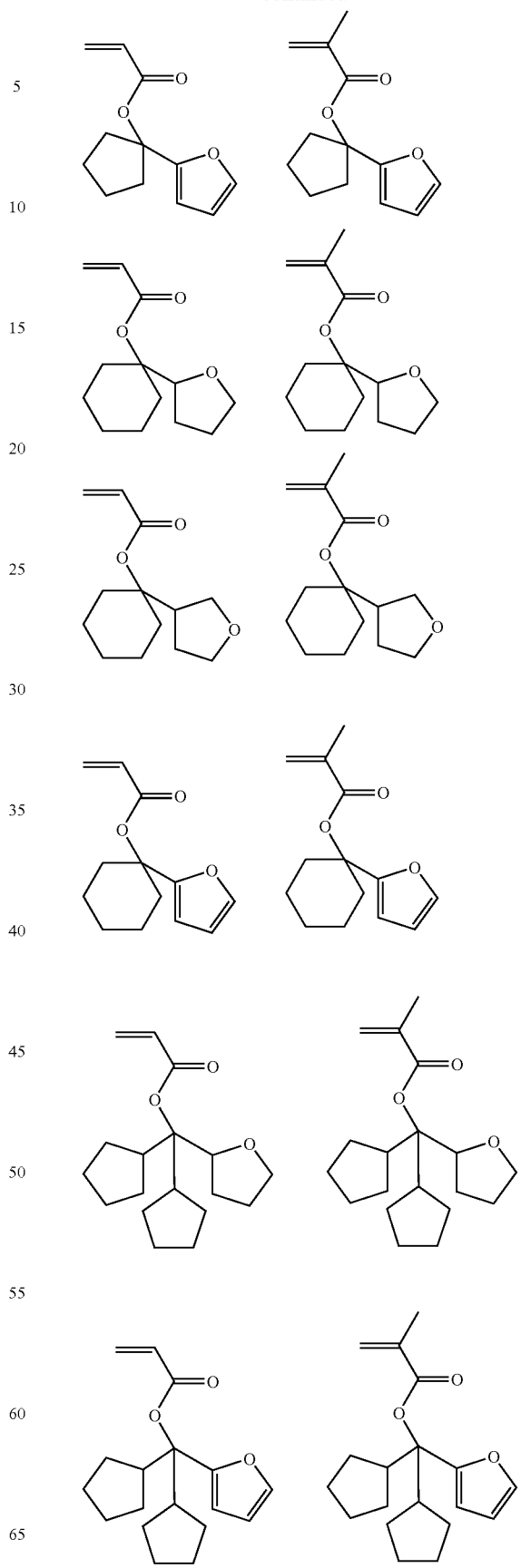

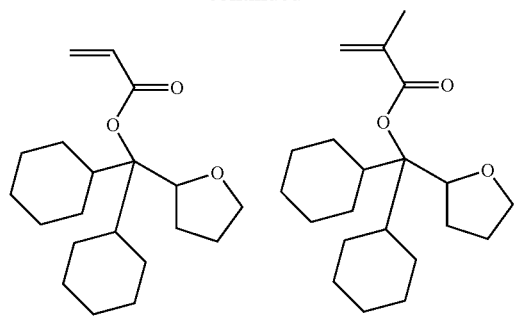
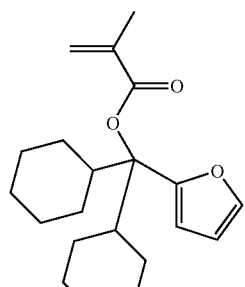
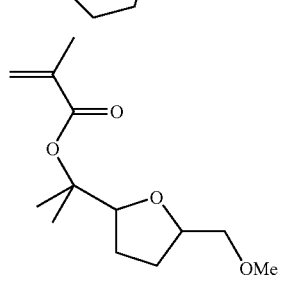
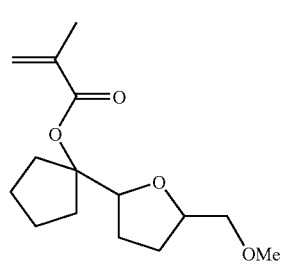
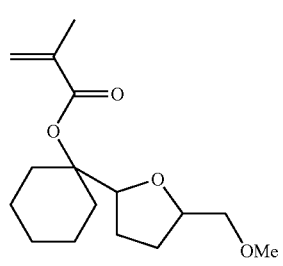
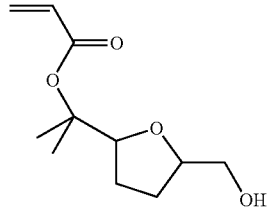
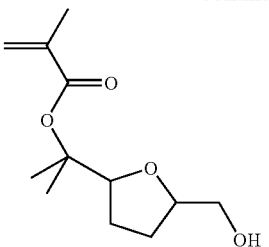
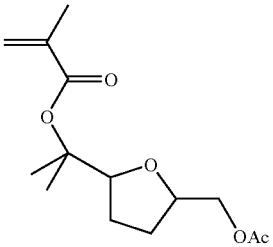
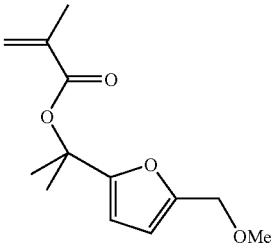
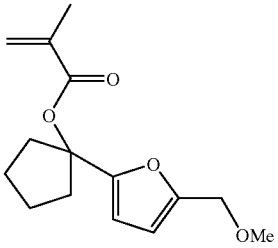
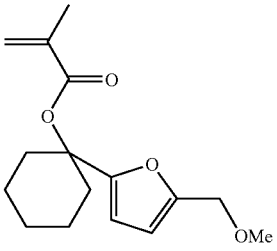
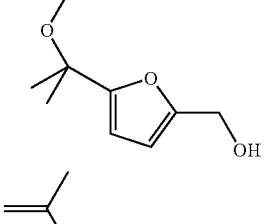
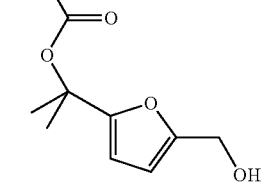

-continued

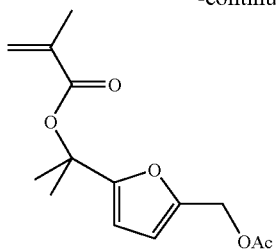

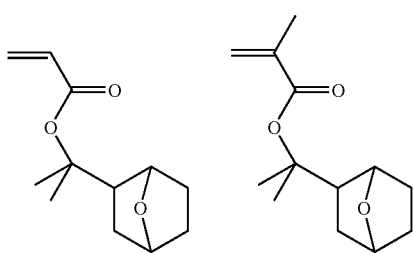

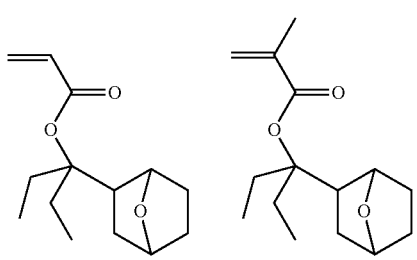

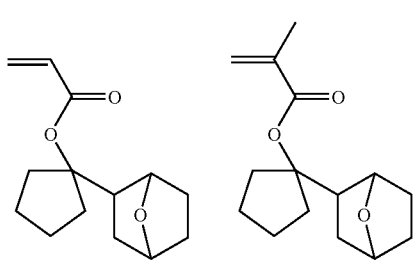

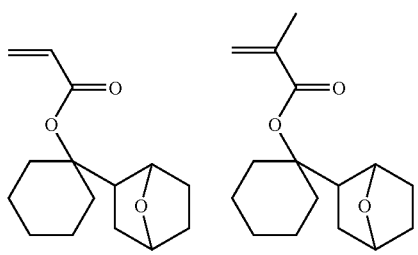

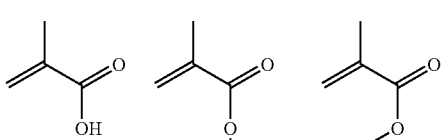

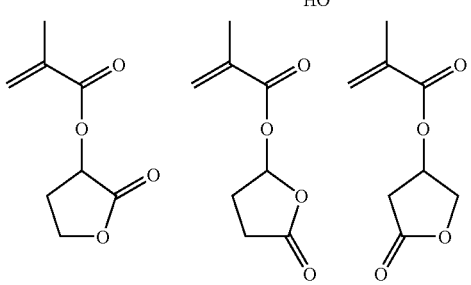

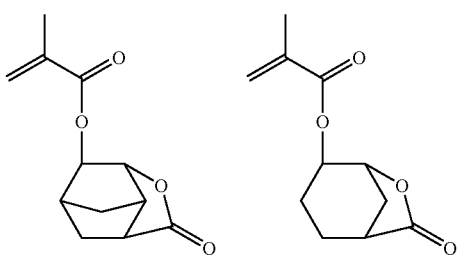

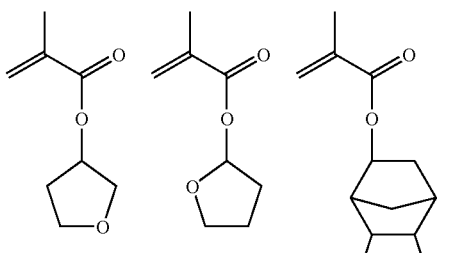

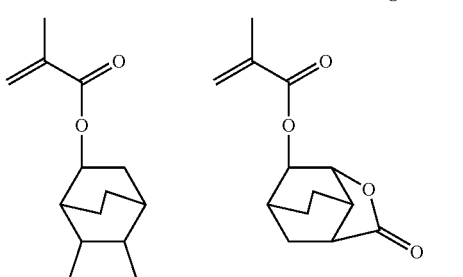

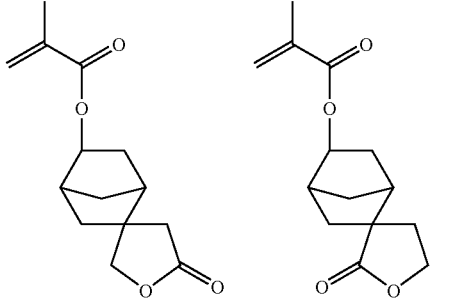

While the polymer used herein preferably includes recurring units of formula (a) and recurring units of formula (b), it may have copolymerized therein recurring units (d) derived from monomers having adhesive groups such as hydroxy, cyano, carbonyl, ester, ether groups, lactone rings, carbonyl groups or carboxylic anhydride groups. Examples of monomers from which recurring units (d) are derived are given below.

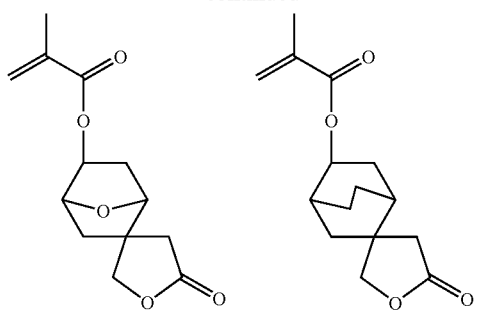
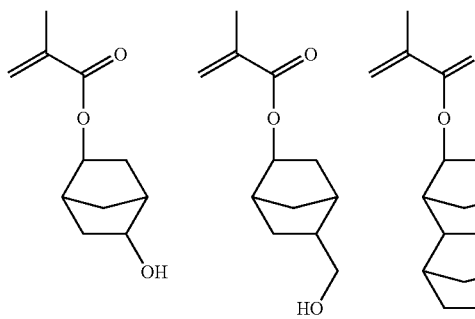
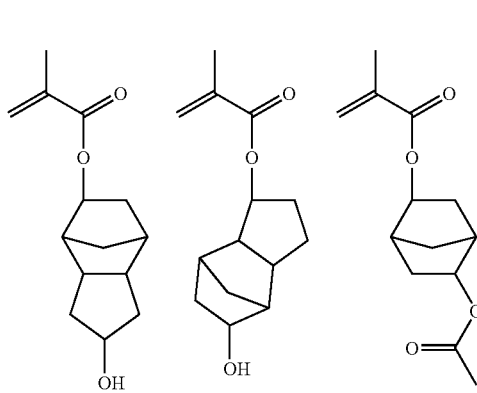
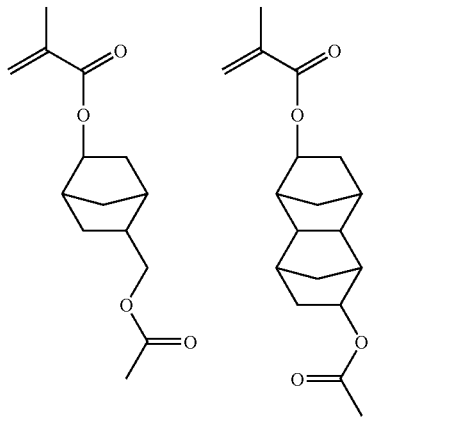
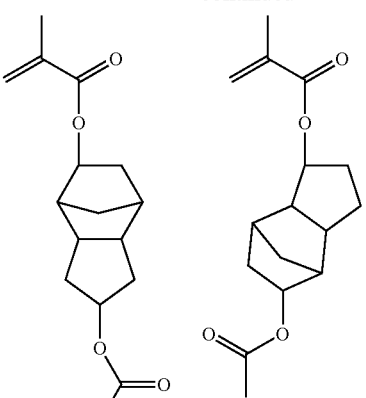

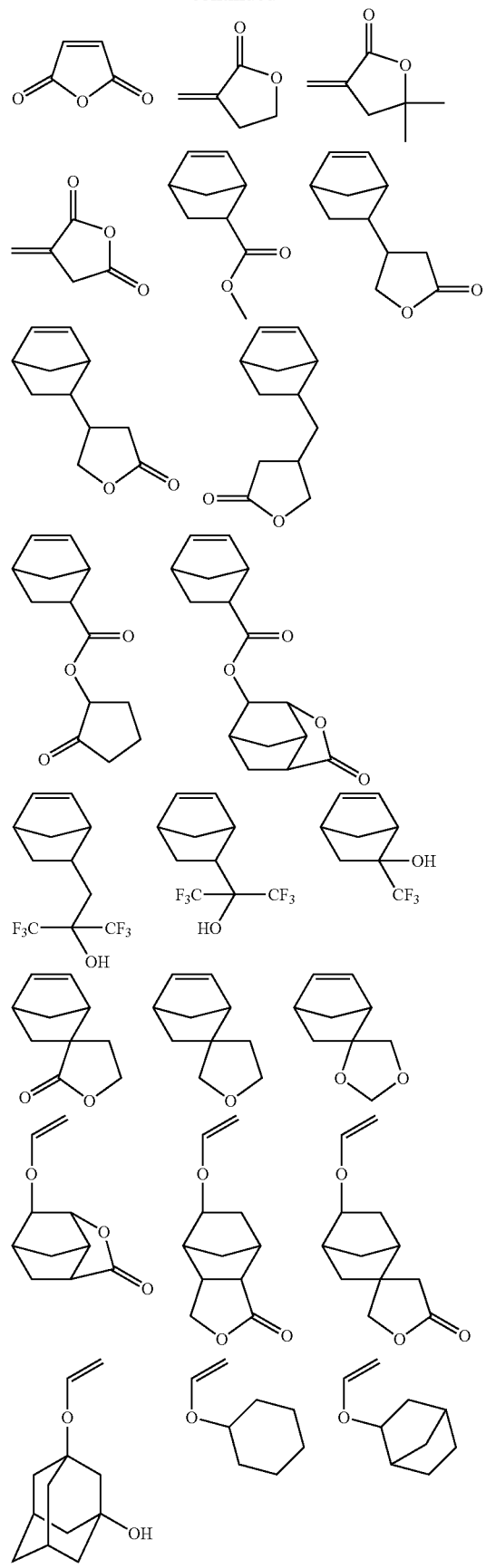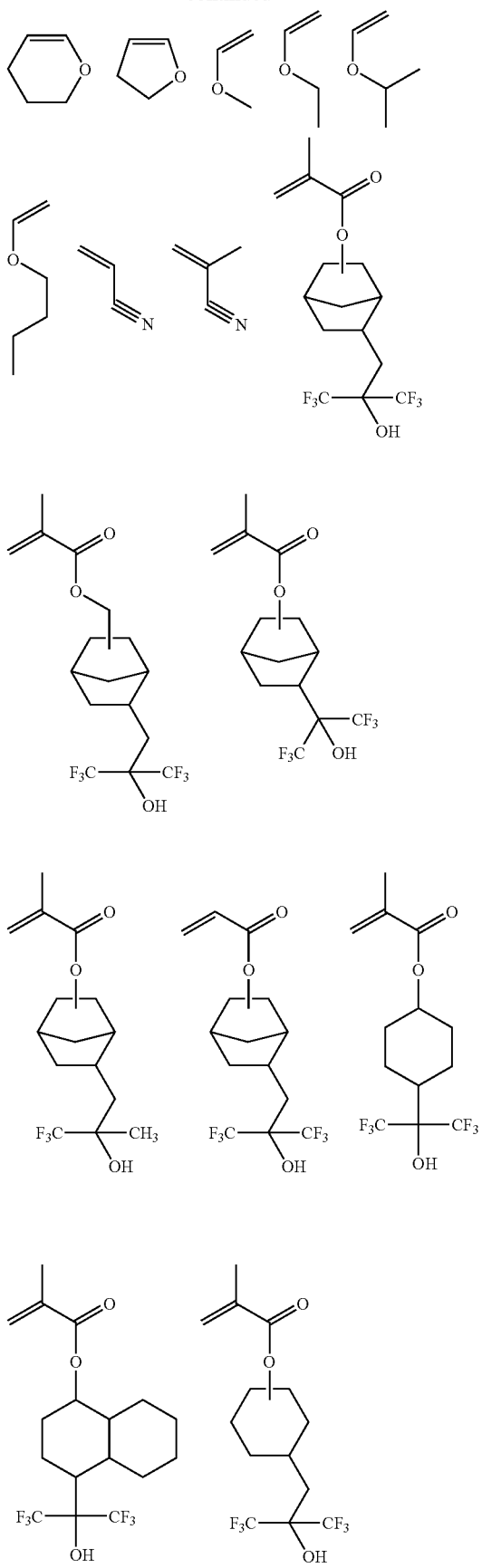

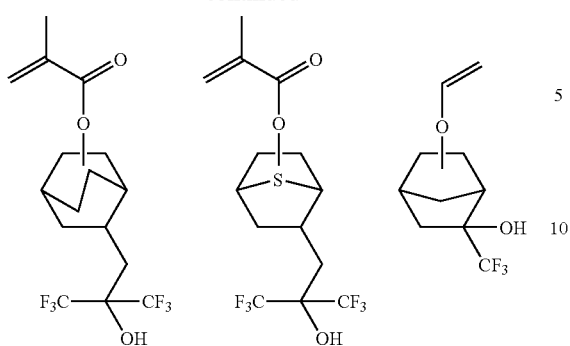
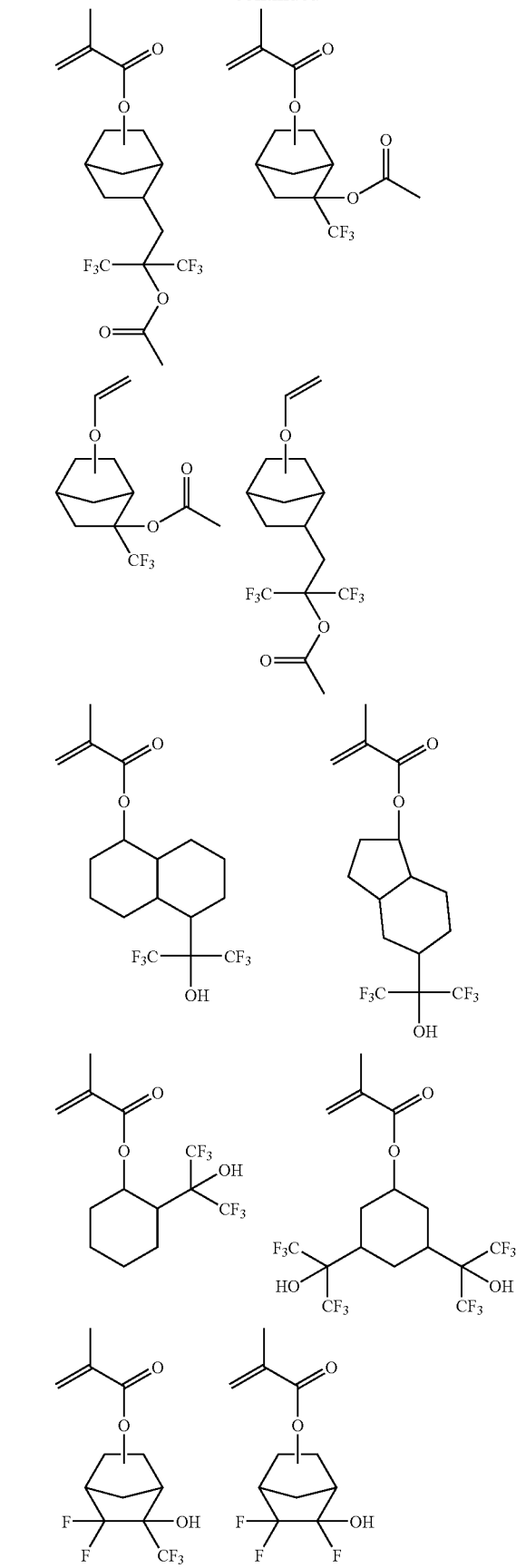

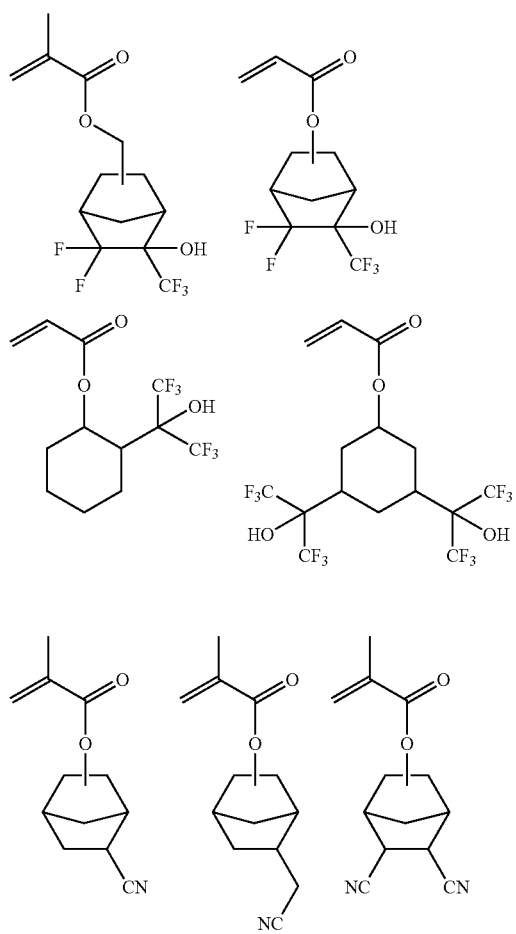
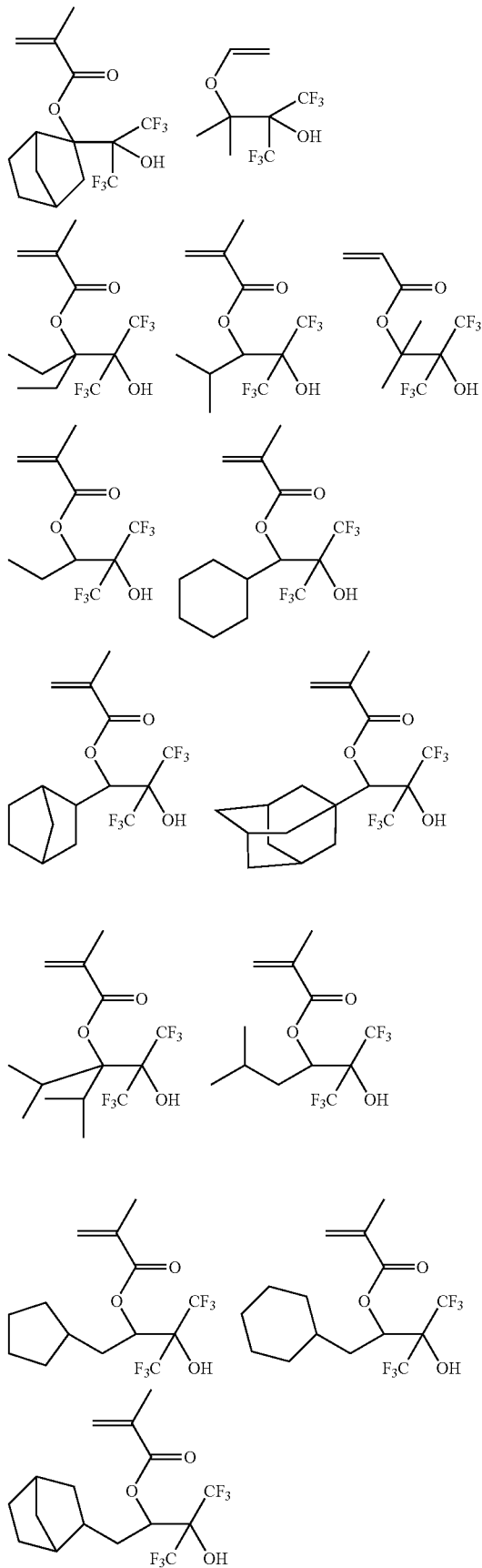

-continued
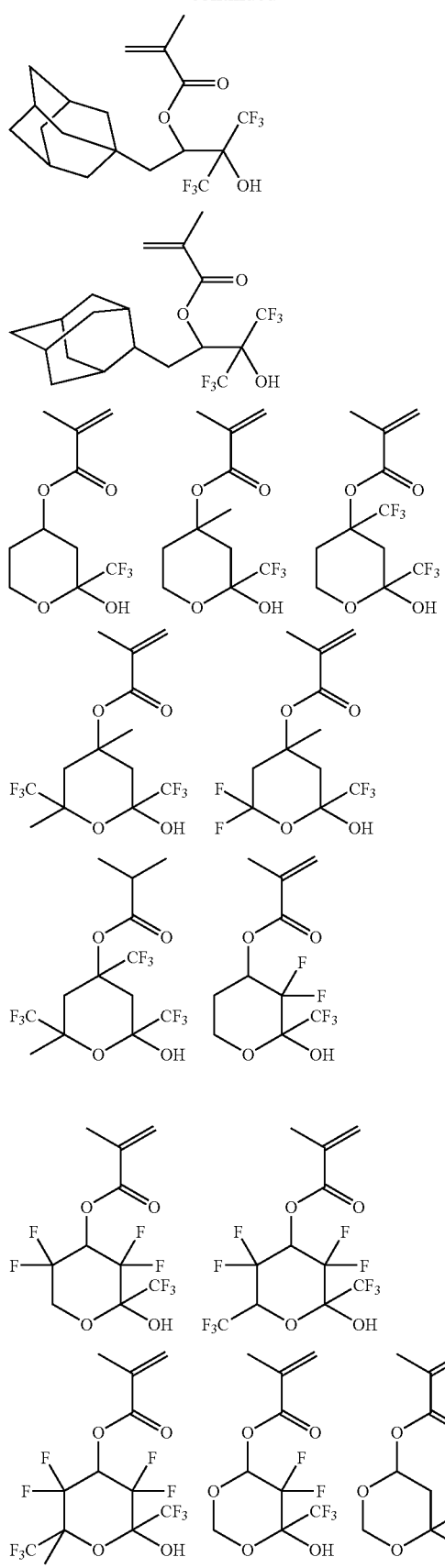
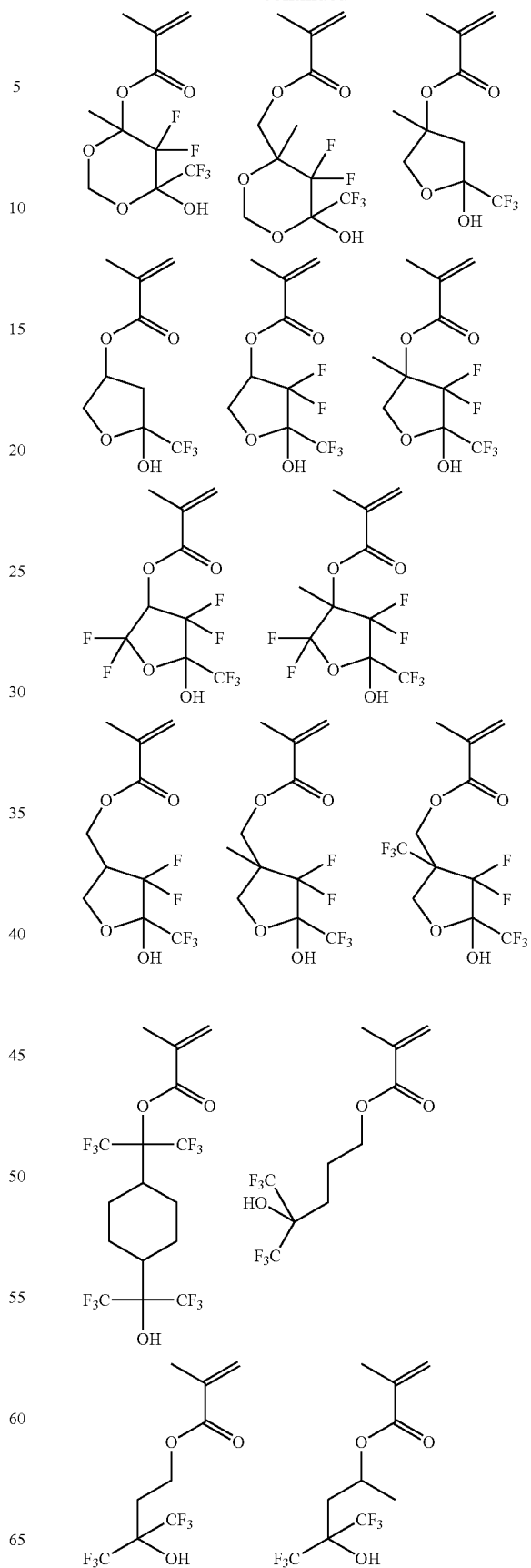

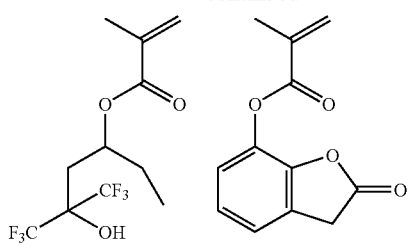
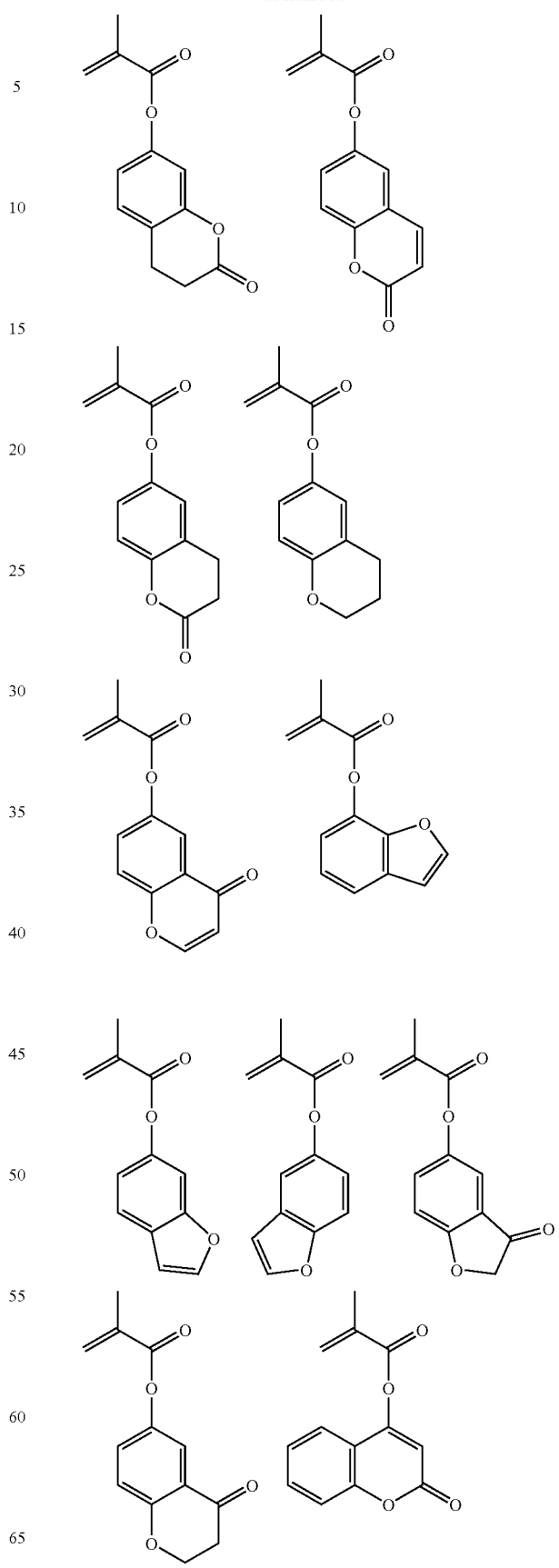

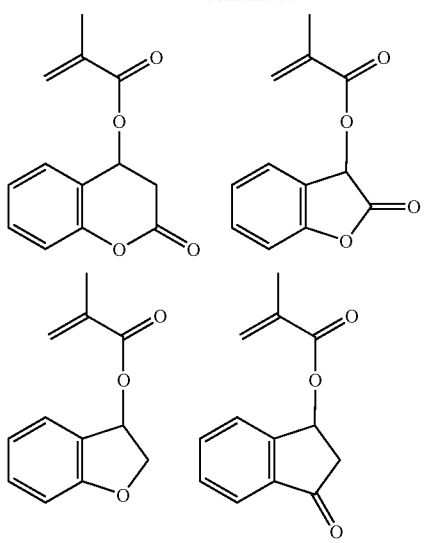
Of the recurring units (d), those having an α-trifluoromethyl alcohol group or carboxyl group are preferably incorporated in copolymers because they improve the alkali dissolution rate of the developed pattern after heating. Examples of recurring units having a carboxyl group are given below.
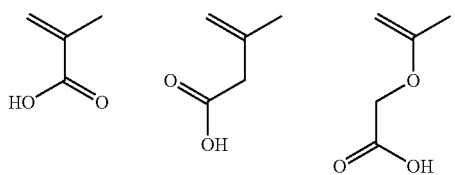
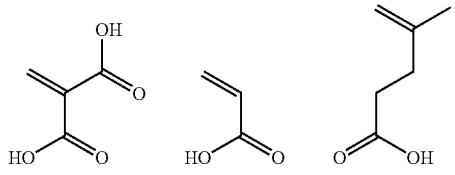
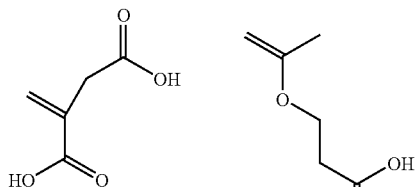
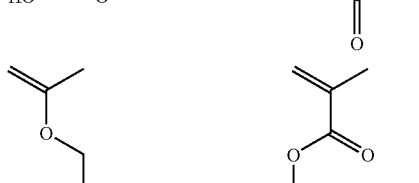
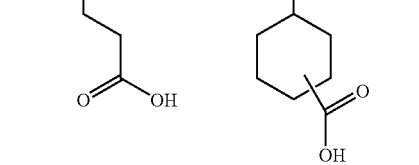
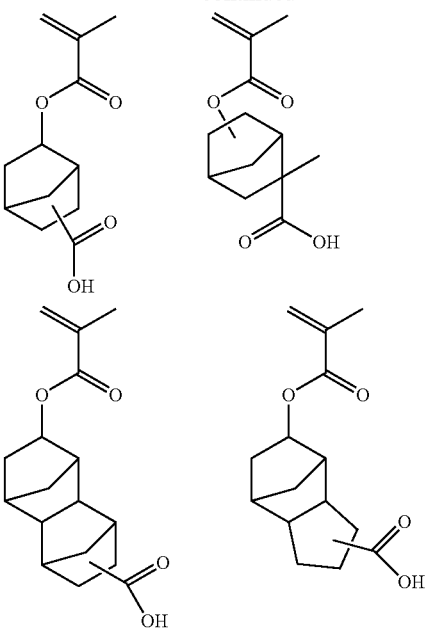
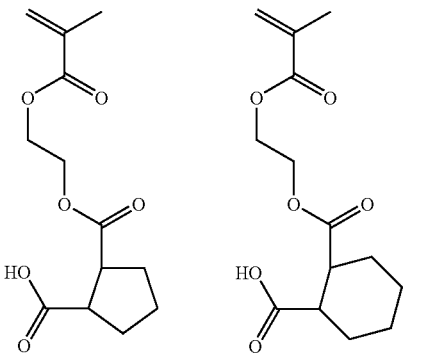
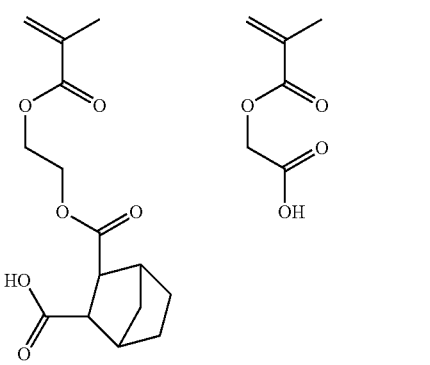

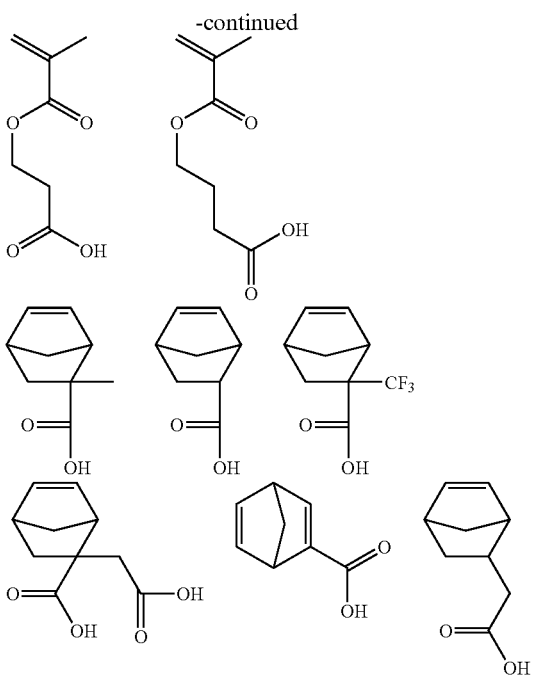

In the polymer of the invention, the recurring units (a), (b) and (d) are present in proportions a, b, and d, respectively, which satisfy the range: $0 \leq a < 1.0$, $0 < b \leq 0.8$, $0.1 \leq a+b \leq 1.0$, $0 \leq d < 1.0$, and preferably the range: $0.1 \leq a \leq 0.9$, $0.1 \leq b \leq 0.7$, $0.2 \leq a+b \leq 1.0$, and $0 \leq d \leq 0.9$, provided that $a+b+d=1$.

It is noted that the meaning of $a+b=1$ is that in a polymer comprising recurring units (a) and (b), the sum of recurring units (a) and (b) is 100 mol % based on the total amount of entire recurring units. The meaning of $a+b<1$ is that the sum of recurring units (a) and (b) is less than 100 mol % based on the total amount of entire recurring units, indicating the inclusion of other recurring units, for example, units (d).

The polymer serving as the base resin in the positive resist material used in the pattern forming process of the invention should preferably have a weight average molecular weight (Mw) in the range of 1,000 to 500,000, and more preferably 2,000 to 30,000, as measured by gel permeation chromatography (GPC) using polystyrene standards. With too low a Mw, the efficiency of thermal crosslinking in the resist material after development may become low. With too high a Mw, the polymer may lose alkali solubility and give rise to a footing phenomenon after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight and/or dispersity is acceptable.

The polymer as used herein may be synthesized by any desired method, for example, by dissolving unsaturated bond-containing monomers corresponding to the respective units (a), (b) and (d) in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomers may be kept as such, or the acid labile group may be once removed with an acid catalyst and thereafter protected or partially protected.

As described previously, the pattern forming process of the invention comprises the steps of coating the positive resist composition described above onto a substrate, prebaking the resist composition to form a resist film, exposing a selected area of the resist film to high-energy radiation, post-exposure baking, and developing the resist film with an alkaline developer to dissolve the exposed area thereof to form a resist pattern such as a line pattern. The subsequent step is to treat the resist pattern (area unexposed to high-energy radiation) so as to utilize the acid remaining in the resist pattern or to generate acid, thereby eliminating acid labile groups on the polymer (i.e., deprotection) and inducing crosslinking in the polymer. In this deprotected and crosslinked state, the polymer has a dissolution rate in excess of 2 nm/sec, preferably of 3 to 5,000 nm/sec, and more preferably 4 to 4,000 nm/sec in an alkaline developer. It is preferred in attaining the objects of the invention that the dissolution rate of the polymer is higher than the dissolution rate of the second resist material to form a reversal film in the same alkaline developer by a factor of 2 to 250,000, and especially 5 to 10,000.

In order that the polymer have a desired dissolution rate in the deprotected and crosslinked state, the polymer formulation is preferably designed such that the acid labile group-bearing recurring units of formula (b) account for 10 mol % to 90 mol %, and more preferably 12 mol % to 80 mol % of the entire recurring units.

First Resist Composition

In addition to the polymer or base resin described above, the chemically amplified positive resist composition used in the pattern forming process of the invention may further comprise an organic solvent, a compound capable of generating an acid in response to high-energy radiation (known as "acid generator"), and optionally, a dissolution inhibitor, a basic compound, a surfactant, and other components.

Solvent

The organic solvent used herein may be any organic solvent in which the base resin, acid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, diethylene glycol dimethyl ether, 1-ethoxy-2-propanol and PGMEA, and mixtures thereof are preferred because the acid generator is most soluble therein.

The organic solvent is preferably used in an amount of 200 to 3,000 parts by weight, more preferably 400 to 2,000 parts by weight per 100 parts by weight of the base resin.

Acid Generator

The acid generators used herein include the following:
(i) onium salts of the formula (P1a-1), (P1a-2), (P1a-3) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.
(i) Onium Salts of Formula (P1a-1), (P1a-2) and (P1a-3):

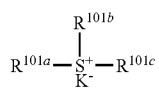  (P1a-1)

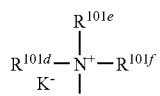  (P1a-2)

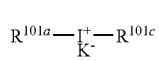  (P1a-3)

Herein, $R^{101a}$, $R^{101b}$ and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all hydrogen atoms may be replaced by alkoxy groups. Also, $R^{101b}$ and $R^{101c}$, taken together, may form a ring with the sulfur or iodine atom to which they are attached. $R^{101b}$ and $R^{101c}$ each are alkylene groups of 1 to 6 carbon atoms when they form a ring. K$^-$ is a sulfonate in which at least one alpha-position is fluorinated, or a perfluoroalkylimidate or perfluoroalkylmethidate. $R^{101d}$, $R^{101e}$, $R^{101f}$, and $R^{101g}$ stand for hydrogen atoms, straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all hydrogen atoms may be replaced by alkoxy groups. A pair of $R^{101d}$ and $R^{101e}$ or a combination of $R^{101d}$, $R^{101e}$ and $R^{101f}$ may form a ring with the nitrogen atom to which they are attached, and $R^{101d}$ and $R^{101e}$ or $R^{101d}$, $R^{101a}$ and $R^{101f}$, taken together, denote an alkylene group of 3 to 10 carbon atoms or a hetero-aromatic ring having the nitrogen atom (in the formula) incorporated therein, when they form a ring.

Of the onium salts having formulae (P1a-1), (P1a-2) and (P1a-3), those of formula (P1a-1) function as a photoacid generator, those of formula (P1a-2) function as a thermal acid generator, and those of formula (P1a-3) have both the functions of a photoacid generator and a thermal acid generator. In a system having (P1a-1) combined with (P1a-2), generator (P1-a) generates an acid upon exposure, with which pattern formation is performed, and generator (P1a-2) generates an acid when heated at high temperature after development, with which crosslinking is efficiently performed.

Examples of K$^-$ include perfluoroalkanesulfonates such as triflate and nonaflate; imidates such as bis(trifluoromethylsulfonyl)imide, bis(perfluoroethylsulfonyl)imide, and bis(perfluorobutylsulfonyl)imide; methidates such as tris(trifluoromethylsulfonyl)methide and tris(perfluoroethylsulfonyl)methide; sulfonates having fluorine substituted at α-position as represented by of the general formula (K-1) and sulfonates having fluorine substituted at α-position as represented by of the general formula (K-2).

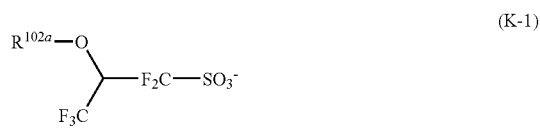  (K-1)

  (K-2)

In formula (K-1), $R^{102a}$ is hydrogen, or a straight, branched or cyclic $C_1$-$C_{20}$ alkyl or acyl group, $C_2$-$C_{20}$ alkenyl group, or $C_6$-$C_{20}$ aryl or aryloxy group, which may have an ether group, ester group, carbonyl group or lactone ring, or in which some or all hydrogen atoms may be substituted by fluorine atoms. In formula (K-2), $R^{102b}$ is hydrogen, or a straight, branched or cyclic $C_1$-$C_{20}$ alkyl group, $C_2$-$C_{20}$ alkenyl group, or $C_6$-$C_{20}$ aryl group.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary oxoalkenyl groups include 2-oxo-4-cyclohexenyl and 2-oxo-4-propenyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl.

Examples of the non-nucleophilic counter ion represented by K$^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, 1,2,3,4,5-pentafluorobenzenesulfonate; and alkylsulfonate ions such as mesylate and butanesulfonate.

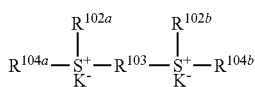

(P1b)

Herein, $R^{102a}$ and $R^{102b}$ independently represent straight, branched or cyclic $C_1$-$C_8$ alkyl groups. $R^{103}$ represents a straight, branched or cyclic $C_1$-$C_{10}$ alkylene group. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1) and (P1a-2).

(ii) Diazomethane Derivatives of Formula (P2)

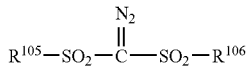

(P2)

Herein, $R^{105}$ and $R^{106}$ independently represent straight, branched or cyclic $C_1$-$C_{12}$ alkyl or halogenated alkyl groups, $C_6$-$C_{20}$ aryl or halogenated aryl groups, or $C_7$-$C_{12}$ aralkyl groups.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

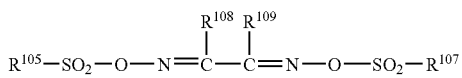

(P3)

Herein, $R^{107}$, $R^{108}$, and $R^{109}$ independently represent straight, branched or cyclic $C_1$-$C_{12}$ alkyl or halogenated alkyl groups, $C_6$-$C_{20}$ aryl or halogenated aryl groups, or $C_7$-$C_{12}$ aralkyl groups. Also, $R^{108}$ and $R^{109}$, taken together, may form a cyclic structure. $R^{108}$ and $R^{109}$ each are a straight or branched alkylene group of 1 to 6 carbon atoms when they form a cyclic structure.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

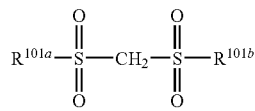

(P4)

Herein, $R^{101a}$ and $R^{101b}$ are as defined above.

(v) Sulfonic Acid esters of N-hydroxyimide Compounds of Formula (P5)

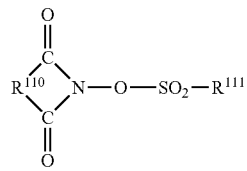

(P5)

Herein, $R^{110}$ is a $C_6$-$C_{10}$ arylene group, $C_1$-$C_6$ alkylene group, or $C_2$-$C_6$ alkenylene group wherein some or all hydrogen atoms may be replaced by straight or branched $C_1$-$C_4$ alkyl or alkoxy groups, nitro, acetyl, or phenyl groups. $R^{111}$ is a straight, branched or cyclic $C_1$-$C_8$ alkyl group, alkenyl, alkoxyalkyl, phenyl or naphthyl group wherein some or all hydrogen atoms may be replaced by $C_1$-$C_4$ alkyl or alkoxy groups, phenyl groups (which may have substituted thereon a $C_1$-$C_4$ alkyl or alkoxy, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the $C_1$-$C_4$ alkyl groups include methyl, ethyl, propyl, isopropyl, n-butyl, isobutyl and tert-butyl; and the $C_1$-$C_4$ alkoxy groups include methoxy, ethoxy, propoxy, isopropoxy, n-butoxy, isobutoxy, and tert-butoxy. The phenyl groups which may have substituted thereon a $C_1$-$C_4$ alkyl or alkoxy, nitro, or acetyl group include phenyl, tolyl, p-tert-butoxyphenyl, p-acetylphenyl and p-nitrophenyl. The hetero-aromatic groups of 3 to 5 carbon atoms include pyridyl and furyl.

Illustrative examples of the acid generator include:
onium salts such as
diphenyliodonium trifluoromethanesulfonate,
(p-tert-butoxyphenyl)phenyliodonium trifluoromethane-sulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethane-sulfonate,
bis(p-tert-butoxyphenyl)phenylsulfonium trifluoromethane-sulfonate,
tris(p-tert-butoxyphenyl)sulfonium trifluoromethane-sulfonate,
triphenylsulfonium p-toluenesulfonate,
(p-tert-butoxyphenyl)diphenylsulfonium p-toluene-sulfonate,
bis(p-tert-butoxyphenyl)phenylsulfonium p-toluene-sulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethane-sulfonate,
cyclohexylmethyl(2-oxocyclohexyl)sulfonium p-toluene-sulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
(2-norbornyl)methyl(2-oxocyclohexyl)sulfonium trifluoro-methanesulfonate,
ethylenebis[methyl(2-oxocyclopentyl)sulfonium trifluoro-methanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as
bisnaphthylsulfonylmethane, bistrifluoromethylsulfonyl-methane,
bismethylsulfonylmethane, bisethylsulfonylmethane,
bispropylsulfonylmethane, bisisopropylsulfonylmethane,
bis-p-toluenesulfonylmethane, and bisbenzenesulfonyl-methane;
β-ketosulfone derivatives such as
2-cyclohexylcarbonyl-2-(p-toluenesulfonyl)propane and
2-isopropylcarbonyl-2-(p-toluenesulfonyl)propane;
disulfone derivatives such as
diphenyl disulfone deratives and
dicyclohexyl disulfone derivatives;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methane-sulfonate,
N-hydroxy-5-norbornene-2,3-dicarboxyimide trifluoromethane-sulfonate, and N-hydroxy-5-norbornene-2,3-dicarboxyimide p-toluenesulfonate.

Preferred among these acid generators are onium salts such as triphenylsulfonium trifluoromethanesulfonate,
(p-tert-butoxyphenyl)diphenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluoromethane-sulfonate,
(2-norbornyl)methyl(2-oxocylohexyl)sulfonium trifluoromethanesulfonate, and
1,2'-naphthylcarbonylmethyltetrahydrothiophenium triflate; diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;
glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane; and sulfonic acid esters of N-hydroxyimide compounds such as
N-hydroxysuccinimide methanesulfonate,
N-hydroxysuccinimide trifluoromethanesulfonate,
N-hydroxysuccinimide 1-prbpanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

Also useful are acid generators of the oxime type described in WO 2004/074242 A2.

These acid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The acid generator is preferably added in an amount of 0.1 to 50 parts, and especially 0.5 to 40 parts by weight, per 100 parts by weight of the base resin. Less than 0.1 phr of the acid generator may generate a less amount of acid upon exposure, sometimes leading to a poor sensitivity and resolution whereas more than 50 phr of the acid generator may adversely affect the transmittance and resolution of resist. For example, where acid generators (P1a-1) and (P1a-2) are used in combination, they are mixed such that the mixture consists of 1 pbw of (P1a-1) and 0.001 to 1 pbw of (P1a-2) because generator (P1a-2) functions only as a thermal acid generator. Differently stated, the amount of thermal acid generator (P1a-2) added is preferably limited to such a level as to have no impact on the lithography of patterning the first resist film, no impact on the thermal properties of the first resist film, and no impact on the second resist film, and specifically to the range of 0.01 to 1 part by weight per 100 parts by weight of the base resin.

Dissolution Inhibitor

To the positive resist composition, especially chemically amplified positive resist composition, a dissolution inhibitor or regulator may be added. The dissolution inhibitor is a compound having on the molecule at least two phenolic hydroxyl groups, in which an average of from 0 to 100 mol % of all the hydrogen atoms on the phenolic hydroxyl groups are replaced by acid labile groups or a compound having on the molecule at least one carboxyl group, in which an average of 50 to 100 mol % of all the hydrogen atoms on the carboxyl groups are replaced by acid labile groups, both the compounds having a weight average molecular weight within a range of 100 to 1,000, and preferably 150 to 800.

The degree of substitution of the hydrogen atoms on the phenolic hydroxyl groups by acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups by acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

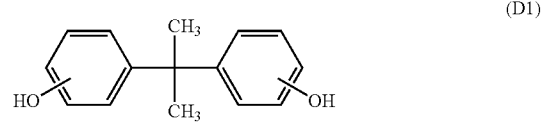

(D1)

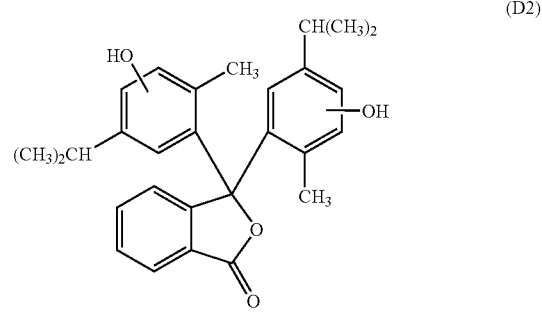

(D2)

(D3)

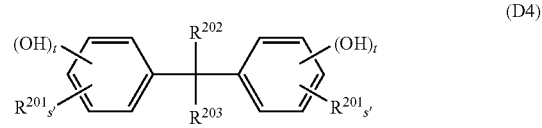

(D4)

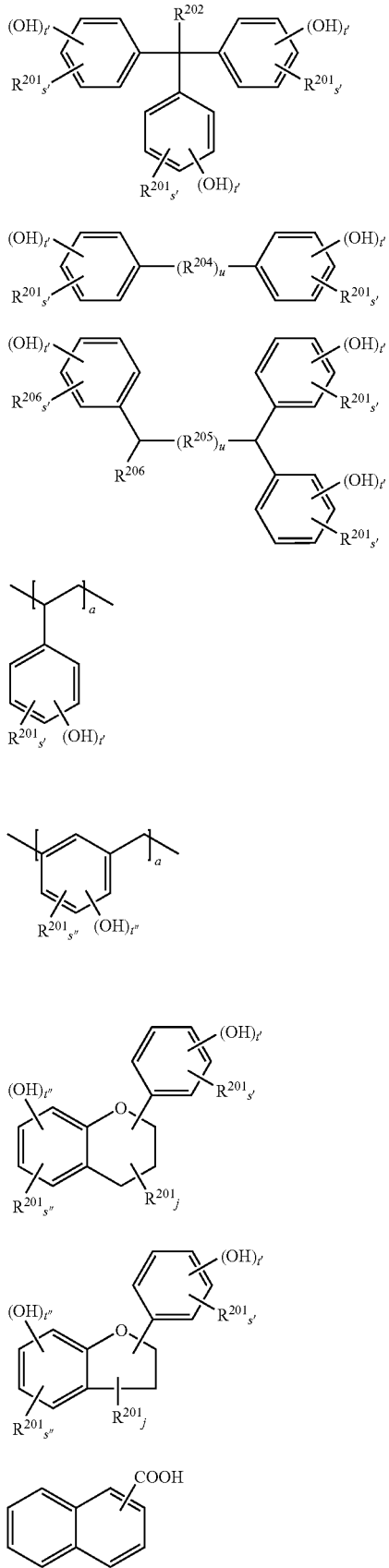

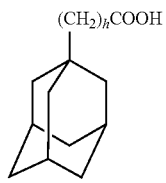

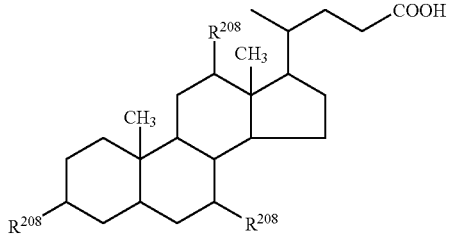

In these formulas, $R^{201}$ and $R^{202}$ are each hydrogen or a straight or branched $C_1$-$C_8$ alkyl or alkenyl; $R^{203}$ is hydrogen, a straight or branched $C_1$-$C_8$ alkyl or alkenyl, or —$(R^{207})_h$—COOH; $R^{204}$ is —$(CH_2)_i$— (where i=2 to 10), a $C_6$-$C_{10}$ arylene, carbonyl, sulfonyl, an oxygen atom, or a sulfur atom; $R^{205}$ is a $C_1$-$C_{10}$ alkylene, a $C_6$-$C_{10}$ arylene, carbonyl, sulfonyl, an oxygen atom, or a sulfur atom; $R^{206}$ is hydrogen, a straight or branched $C_1$-$C_8$ alkyl or alkenyl, or a hydroxyl-substituted phenyl or naphthyl; $R^{207}$ is a straight or branched $C_1$-$C_{10}$ alkylene; $R^{208}$ is hydrogen or hydroxyl; the letter j is an integer from 0 to 5; u and h are each 0 or 1; s, t, s', t', s", and t" are each numbers which satisfy s+t=8, s'+t'=5, and s"+t"=4, and are such that each phenyl structure has at least one hydroxyl group; and a is a number such that the compounds of formula (D8) or (D9) have a molecular weight of from 100 to 1,000.

The dissolution inhibitor may be formulated in an amount of 0 to 50 parts, preferably 5 to 50 parts, and more preferably 10 to 30 parts by weight, per 100 parts by weight of the base resin, and may be used singly or as a mixture of two or more thereof. Outside the range, a less amount of the dissolution inhibitor may fail to improve resolution whereas a larger amount may lead to slimming of the patterned film and a decline in resolution.

Basic Compound

A basic compound may be compounded in the chemically amplified positive resist composition. The basic compound used herein is preferably a compound capable of suppressing the rate of diffusion when the acid generated by the acid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, nitrogen-containing alcoholic compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene. Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and nitrogen-containing alcoholic compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

One or more basic compounds of the following general formula (B)-1 may also be added.

$$N(X)_n(Y)_{3-n} \qquad (B)\text{-}1$$

In the formula, n is equal to 1, 2 or 3; side chain Y is independently hydrogen or a straight, branched or cyclic alkyl group of 1 to 20 carbon atoms which may contain an ether or hydroxyl group; and side chain X is independently selected from groups of the following general formulas (X)-1 to (X)-3, and two or three X's may bond together to form a ring with the nitrogen atom to which they are attached.

$$-[R^{300}-O-R^{301}] \qquad (X)\text{-}1$$

$$-[R^{302}-O-R^{303}-\underset{\underset{O}{\|}}{C}-R^{304}] \qquad (X)\text{-}2$$

$$-[R^{305}-\underset{\underset{O}{\|}}{C}-O-R^{306}] \qquad (X)\text{-}3$$

In the formulas, $R^{300}$, $R^{302}$ and $R^{305}$ are independently straight or branched $C_1$-$C_4$ alkylene groups; $R^{301}$ and $R^{304}$ are independently hydrogen, straight, branched or cyclic $C_1$-$C_{20}$ alkyl groups which may contain one or more hydroxyl, ether, ester group or lactone ring; $R^{303}$ is a single bond or a straight or branched $C_1$-$C_4$ alkylene group; and $R^{306}$ is a straight, branched or cyclic $C_1$-$C_{20}$ alkyl group which may contain one or more hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine,
4,7,13,16,21,24-hexaoxa-1,10-diazabicyclo[8.8.8]hexacosane,
4,7,13,18-tetraoxa-1,10-diazabicyclo[8.5.5]eicosane,
1,4,10,13-tetraoxa-7,16-diazabicyclooctadecane,
1-aza-12-crown-4, 1-aza-15-crown-5, 1-aza-18-crown-6,
tris(2-formyloxyethyl)amine, tris(2-acetoxyethyl)amine,
tris(2-propionyloxyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine,
tris(2-methoxycarbonyloxyethyl)amine,
tris(2-tert-butoxycarbonyloxyethyl)amine,
tris[2-(2-oxopropoxy)ethyl]amine,
tris[2-(methoxycarbonylmethyl)oxyethyl]amine,
tris[2-(tert-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
N,N-bis(2-hydroxyethyl)-2-(methoxycarbonyl)ethylamine,
N,N-bis(2-acetoxyethyl)-2-(methoxycarbonyl)ethylamine,
N,N-bis(2-hydroxyethyl)-2-(ethoxycarbonyl)ethylamine,
N,N-bis(2-acetoxyethyl)-2-(ethoxycarbonyl)ethylamine,
N,N-bis(2-hydroxyethyl)-2-(2-methoxyethoxycarbonyl)ethylamine,
N,N-bis(2-acetoxyethyl)-2-(2-methoxyethoxycarbonyl)ethylamine,
N,N-bis(2-hydroxyethyl)-2-(2-hydroxyethoxycarbonyl)ethylamine,
N,N-bis(2-acetoxyethyl)-2-(2-acetoxyethoxycarbonyl)ethylamine,
N,N-bis(2-hydroxyethyl)-2-[(methoxycarbonyl)methoxycarbonyl]-ethylamine,
N,N-bis(2-acetoxyethyl)-2-[(methoxycarbonyl)methoxycarbonyl]-ethylamine,
N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)-ethylamine,
N,N-bis(2-acetoxyethyl)-2-(tetrahydrofurfuryloxycarbonyl)-ethylamine,
N,N-bis(2-hydroxyethyl)-2-[(2-oxotetrahydrofuran-3-yl)oxy-carbonyl]ethylamine,
N,N-bis(2-acetoxyethyl)-2-[(2-oxotetrahydrofuran-3-yl)oxy-carbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)-ethylamine,
N,N-bis(2-formyloxyethyl)-2-(2-formyloxyethoxycarbonyl)-ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

Also useful are basic compounds having cyclic structure, represented by the following general formula (B)-2.

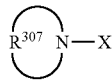

(B)-2

Herein X is as defined above, and $R^{307}$ is a straight or branched $C_2$-$C_{20}$ alkylene group which may contain one or more carbonyl, ether, ester or sulfide groups.

Illustrative examples of the compounds having formula (B)-2 include 1-[2-(methoxymethoxy)ethyl]pyrrolidine,
1-[2-(methoxymethoxy)ethyl]piperidine,
4-[2-(methoxymethoxy)ethyl]morpholine,
1-[2-[(2-methoxyethoxy)methoxy]ethyl]pyrrolidine,
1-[2-[(2-methoxyethoxy)methoxy]ethyl]piperidine,
4-[2-[(2-methoxyethoxy)methoxy]ethyl]morpholine,
2-(1-pyrrolidinyl)ethyl acetate, 2-piperidinoethyl acetate,
2-morpholinoethyl acetate, 2-(1-pyrrolidinyl)ethyl formate,
2-piperidinoethyl propionate,
2-morpholinoethyl acetoxyacetate,
2-(1-pyrrolidinyl)ethyl methoxyacetate,
4-[2-(methoxycarbonyloxy)ethyl]morpholine,
1-[2-(t-butoxycarbonyloxy)ethyl]piperidine,
4-[2-(2-methoxyethoxycarbonyloxy)ethyl]morpholine,
methyl 3-(1-pyrrolidinyl)propionate,
methyl 3-piperidinopropionate, methyl 3-morpholinopropionate,
methyl 3-(thiomorpholino)propionate,
methyl 2-methyl-3-(1-pyrrolidinyl)propionate,
ethyl 3-morpholinopropionate,
methoxycarbonylmethyl 3-piperidinopropionate,
2-hydroxyethyl 3-(1-pyrrolidinyl)propionate,
2-acetoxyethyl 3-morpholinopropionate,
2-oxotetrahydrofuran-3-yl 3-(1-pyrrolidinyl)propionate,
tetrahydrofurfuryl 3-morpholinopropionate,
glycidyl 3-piperidinopropionate,
2-methoxyethyl 3-morpholinopropionate,
2-(2-methoxyethoxy)ethyl 3-(1-pyrrolidinyl)propionate,
butyl 3-morpholinopropionate,
cyclohexyl 3-piperidinopropionate,
α-(1-pyrrolidinyl)methyl-γ-butyrolactone,
β-piperidino-γ-butyrolactone, β-morpholino-δ-valerolactone,
methyl 1-pyrrolidinylacetate, methyl piperidinoacetate,
methyl morpholinoacetate, methyl thiomorpholinoacetate,
ethyl 1-pyrrolidinylacetate, and
2-methoxyethyl morpholinoacetate.

Also, basic compounds having cyano group, represented by the following general formulae (B)-3 to (B)-6 are useful.

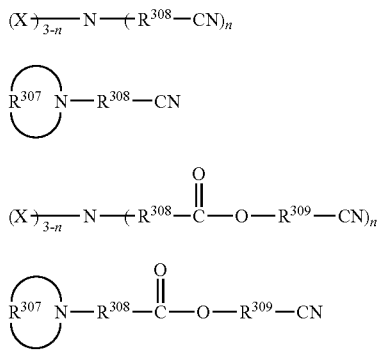

Herein, X, $R^{307}$ and n are as defined above, and $R^{308}$ and $R^{309}$ are each independently a straight or branched $C_1$-$C_4$ alkylene group.

Illustrative examples of the basic compounds having cyano group, represented by formulae (B)-3 to (B)-6, include
3-(diethylamino)propiononitrile,
N,N-bis(2-hydroxyethyl)-3-aminopropiononitrile,
N,N-bis(2-acetoxyethyl)-3-aminopropiononitrile,
N,N-bis(2-formyloxyethyl)-3-aminopropiononitrile,
N,N-bis(2-methoxyethyl)-3-aminopropiononitrile,
N,N-bis[2-(methoxymethoxy)ethyl]-3-aminopropiononitrile,
methyl N-(2-cyanoethyl)-N-(2-methoxyethyl)-3-aminopropionate,
methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile,
N-(2-acetoxyethyl)-N-(2-cyanoethyl)-3-aminopropiononitrile,
N-(2-cyanoethyl)-N-(2-formyloxyethyl)-3-aminopropiononitrile,
N-(2-cyanoethyl)-N-(2-methoxyethyl)-3-aminopropiononitrile,
N-(2-cyanoethyl)-N-[2-(methoxymethoxy)ethyl]-3-aminopropiono-nitrile,
N-(2-cyanoethyl)-N-(3-hydroxy-1-propyl)-3-aminopropiononitrile,
N-(3-acetoxy-1-propyl)-N-(2-cyanoethyl)-3-aminopropiononitrile,
N-(2-cyanoethyl)-N-(3-formyloxy-1-propyl)-3-aminopropiono-nitrile,
N-(2-cyanoethyl)-N-tetrahydrofurfuryl-3-aminopropiononitrile,
N,N-bis(2-cyanoethyl)-3-aminopropiononitrile,
diethylaminoacetonitrile,
N,N-bis(2-hydroxyethyl)aminoacetonitrile,
N,N-bis(2-acetoxyethyl)aminoacetonitrile,
N,N-bis(2-formyloxyethyl)aminoacetonitrile,
N,N-bis(2-methoxyethyl)aminoacetonitrile,
N,N-bis[2-(methoxymethoxy)ethyl]aminoacetonitrile,
methyl N-cyanomethyl-N-(2-methoxyethyl)-3-aminopropionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl]aminoacetonitrile,
N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N,N-bis(cyanomethyl)aminoacetonitrile,
1-pyrrolidinepropiononitrile, 1-piperidinepropiononitrile,
4-morpholinepropiononitrile, 1-pyrrolidineacetonitrile,
1-piperidineacetonitrile, 4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3-aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

Also, a polymer comprising recurring units having amino and fluoroalkyl groups may be added. This polymer orients or segregates at the resist surface after coating, preventing the resist pattern as developed from slimming and improving rectangularity. Polymers of the following formula are useful.

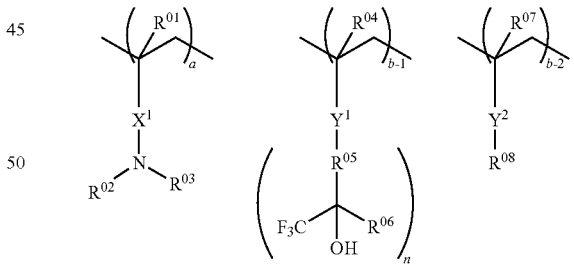

Herein $R^{01}$, $R^{04}$, and $R^{07}$ are each independently hydrogen or methyl. $X^1$, $Y^1$ and $Y^2$ are each independently a single bond, —O—$R^{09}$—, —C(=O)—O—$R^{09}$—, —C(=O)—NH—$R^{09}$—, a straight or branched $C_1$-$C_4$ alkylene, or phenylene group, wherein $R^{09}$ is a straight, branched or cyclic $C_1$-$C_{10}$ alkylene group which may contain an ester (—COO—) or ether (—O—) group. The subscript n is 1 or 2. In case of n=1, $Y^1$ is a single bond, —O—$R^{09}$—, —C(=O)—O—$R^{09}$—, —C(=O)—NH—$R^{09}$—, a straight or branched $C_1$-$C_4$ alkylene, or phenylene group, wherein $R^{09}$ is as defined above. In case of n=2, $Y^1$ is —O—$R^{101}$=, —C(=O)—O—$R^{101}$=, —C(=O)—NH—$R^{101}$=, a straight or branched C$_1$-C$_4$ alkylene group with one hydrogen atom eliminated, or a phenylene group with one hydrogen atom eliminated, wherein R$^{101}$ is a straight, branched or cyclic C$_1$-C$_{10}$ alkylene group with one hydrogen atom eliminated which may contain an ester or ether group. R$^{o2}$ and R$^{o3}$ are each independently hydrogen, a straight, branched or cyclic C$_1$-C$_{20}$ alkyl or C$_2$-C$_{20}$ alkenyl group which may contain a hydroxy, ether, ester, cyano, amino group, double bond or halogen atom, or a C$_6$-C$_{10}$ aryl group, or R$^{o2}$ and R$^{o3}$ may bond together to form a ring of 3 to 20 carbon atoms with the nitrogen atom to which they are attached. R$^{o5}$ is a straight, branched or cyclic C$_1$-C$_{12}$ alkylene group. R$^{o6}$ is hydrogen, fluorine, methyl, trifluoromethyl or difluoromethyl, or R$^{o6}$ and R$^{o5}$ may bond together to form an alicyclic ring of 2 to 12 carbon atoms with the carbon atom to which they are attached, which ring may contain an ether group, fluorinated alkylene group or trifluoromethyl group. R$^{o8}$ is a straight, branched or cyclic C$_1$-C$_{20}$ alkyl group which has at least one fluorine atom substituted thereon and which may contain an ether, ester or sulfonamide group. The subscripts a, b-1, and b-2 are numbers in the range: $0<a<1.0$, $0\leq(b-1)<1.0$, $0\leq(b-2)<1.0$, $0<(b-1)+(b-2)<1.0$, and $0.5\leq a+(b-1)+(b-2)\leq 1.0$.

The basic compound is preferably formulated in an amount of 0.001 to 2 parts, and especially 0.01 to 1 part by weight, per 100 parts by weight of the base resin. Less than 0.001 phr of the basic compound achieves no or little addition effect whereas more than 2 phr would result in too low a sensitivity.

Other Components

In the positive resist composition, a compound having a group =C—COOH in the molecule may be blended. Exemplary, non-limiting compounds having a carboxyl group include one or more compounds selected from Groups I and II below. Including this compound improves the post-exposure delay (PED) stability of the resist and ameliorates edge roughness on nitride film substrates.

Group I:

Compounds of general formulas (A1) to (A10) below in which some or all of the hydrogen atoms on the phenolic hydroxyl groups have been replaced by —R$^{401}$—COOH (wherein R$^{401}$ is a straight or branched alkylene of 1 to 10 carbon atoms), and in which the molar ratio C/(C+D) of phenolic hydroxyl groups (C) to =C—COOH groups (D) in the molecule is from 0.1 to 1.0.

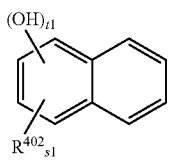

(A1)

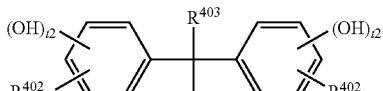

(A2)

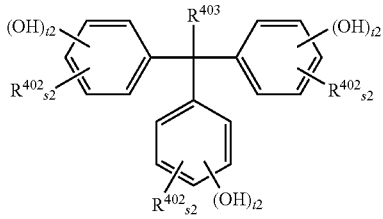

(A3)

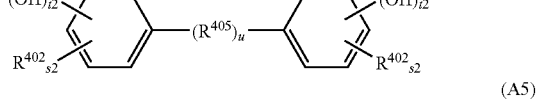

(A4)

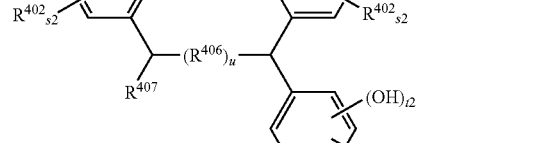

(A5)

(A6)

(A7)

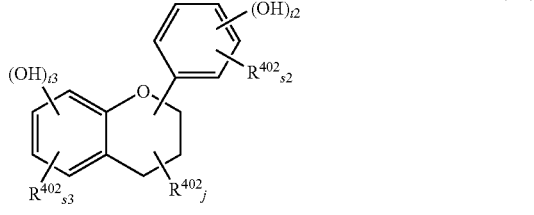

(A8)

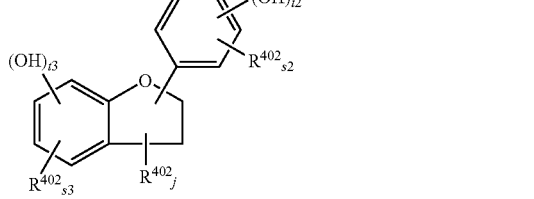

(A9)

(A10)

In these formulas, R$^{408}$ is hydrogen or methyl; R$^{402}$ and R$^{403}$ are each hydrogen or a straight or branched C$_1$-C$_8$ alkyl or alkenyl; R$^{404}$ is hydrogen, a straight or branched C$_1$-C$_8$ alkyl or alkenyl, or a —(R$^{409}$)$_h$—COOR' group (R' being hydrogen or —R$^{409}$—COOH); R$^{405}$ is —(CH$_2$)$_i$— (wherein i is 2 to 10), a C$_6$-C$_{10}$ arylene, carbonyl, sulfonyl, an oxygen atom, or a sulfur atom; R$^{406}$ is a C$_1$-C$_{10}$ alkylene, a C$_6$-C$_{10}$ arylene, carbonyl, sulfonyl, an oxygen atom, or a sulfur atom; R$^{407}$ is hydrogen, a straight or branched C$_1$-C$_8$ alkyl or alkenyl, or a hydroxyl-substituted phenyl or naphthyl; R$^{409}$ is a straight or branched C$_1$-C$_{10}$ alkyl or alkenyl or a —R$^{411}$—COOH group; R$^{410}$ is hydrogen, a straight or branched C$_1$-C$_8$ alkyl or alkenyl, or a —R$^{411}$—COOH group; R$^{411}$ is a straight or branched $C_1$-$C_{10}$ alkylene; h is an integer of 1 to 4, j is an integer from 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; u is an integer of 1 to 4; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

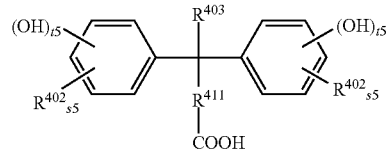
(A11)

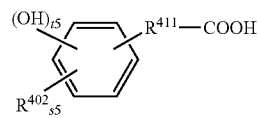
(A12)

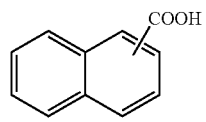
(A13)

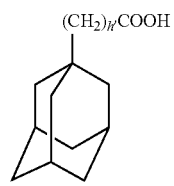
(A14)

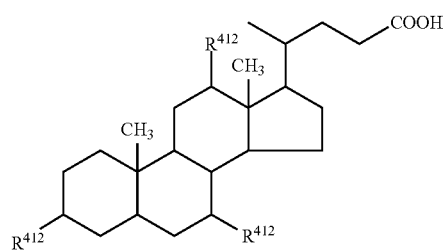
(A15)

In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h' is 0 or 1.

Illustrative, non-limiting examples of the compound having a carboxyl group include compounds of the general formulas (AI-1) to (AI-14) and (AII-1) to (AII-10) below.

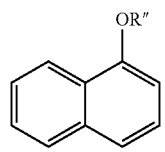
(AI-1)

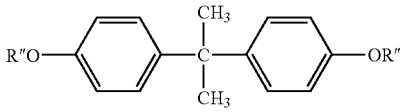
(AI-2)

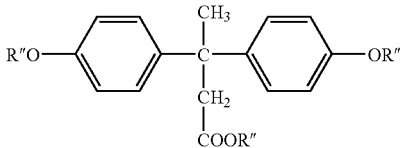
(AI-3)

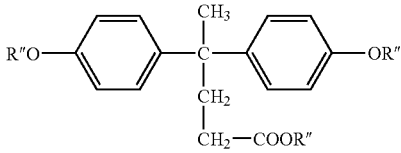
(AI-4)

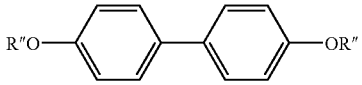
(AI-5)

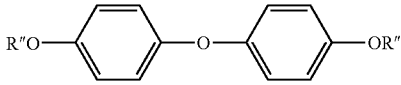
(AI-6)

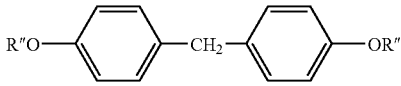
(AI-7)

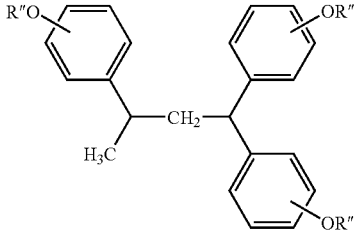
(AI-8)

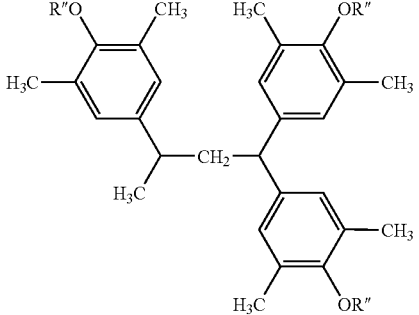
(AI-9)

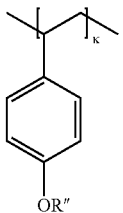
(AI-10)

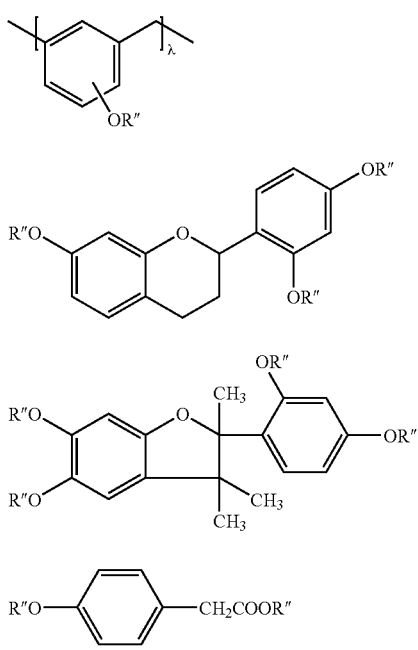

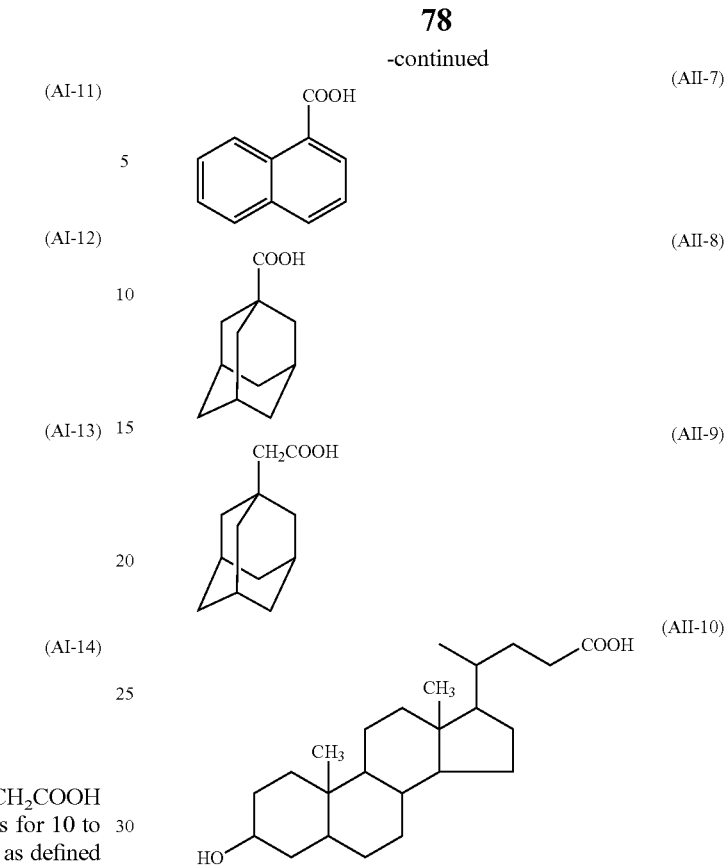

In the above formulas, R" is hydrogen or a —CH₂COOH group such that the —CH₂COOH group accounts for 10 to 100 mol % of R" in each compound, κ and λ are as defined above.

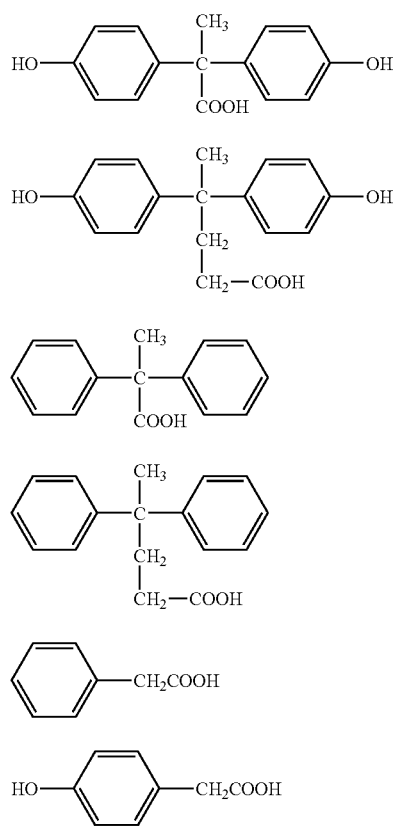

The carboxyl compound is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 phr of the compound may reduce the resolution of the resist composition.

The positive resist composition used herein may further include a surfactant for improving the coating characteristics.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dai-Nippon Ink & Chemicals, Inc.), Fluorad FC-430, FC-431 and FC-4430 (Sumitomo 3M Co., Ltd.), Asahiguard AG710, Surflon S-381, S-382, SCO1, SC102, SC103, SC104, SC105, SC106, Surfynol E1004, KH-10, KH-20, KH-30 and KH-40 (Asahi Glass Co., Ltd.); organosiloxane polymers KP-341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-430, FC-4430, Surflon S-381, Surfynol E1004, KH-20 and KH-30 are preferred. These surfactants may be used alone or in admixture.

To the positive resist composition, the surfactant is added in an amount of up to 2 parts, preferably up to 1 part by weight, per 100 parts by weight of the base resin.

Second Resist Composition

Now the second negative resist composition is described which is used to form a second resist film serving as a reversal film in the double pattern forming process of the invention. Suitable second negative resist compositions which can be used herein include those compositions well known from the following patents.

Document 1: WO 2004/074936

Document 2: JP-A 2006-215067

Document 3: JP-A 2006-301289

Document 4: JP-A 2006-317803

Document 5: JP-A 2006-350198

Document 6: JP-A 2004-004794

Document 7: JP-A 2004-252146

Document 8: JP-A 2004-294638

Document 9: JP-A 2004-318080

Document 10: JP-A 2004-341432

Document 11: JP-A 2005-003862

Document 12: JP-A 2005-003863

Document 13: JP-A 2005-336452

Document 14: JP-A 2006-145788

Document 15: JP-A 2006-163066

Document 16: JP-A 2006-195050

Document 17: JP-A 2006-145775

Specifically, the second resist composition is a chemically amplified negative resist composition (or material) comprising a resin, preferably a resin comprising recurring units having an alkali-soluble group which is a fluorinated hydroxyalkyl group. Preferably the recurring units having a fluorinated hydroxyalkyl group are recurring units having the general formula (U) or (V).

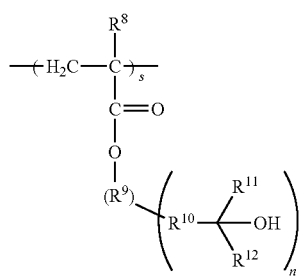
(U)

Herein $R^8$ is hydrogen or methyl, $R^9$ is a (n+1)-valent $C_1$-$C_{20}$ hydrocarbon group which may contain a heteroatom, $R^{10}$ is a single bond, $C_1$-$C_4$ alkylene group, or $C_1$-$C_4$ alkylene group in which some or all hydrogen atoms are substituted by fluorine atoms, $R^{11}$ and $R^{12}$ are each independently hydrogen, fluorine, $C_1$-$C_4$ alkyl group, or $C_1$-$C_4$ alkyl group in which some or all hydrogen atoms are substituted by fluorine atoms, at least either one of $R^{11}$ and $R^{12}$ contains fluorine, or either one of $R^{11}$ and $R^{12}$ may bond with $R^9$ to form a ring, n is 1 or 2, and s is a number in the range: $0 < s \leq 0.8$.

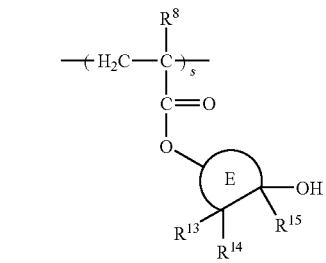
(V)

Herein $R^8$ is hydrogen or methyl, E is a $C_3$-$C_{12}$ cyclic hydrocarbon or bridged cyclic hydrocarbon group, which may contain hydroxy, —O— or —S—, $R^{13}$, $R^{14}$ and $R^{15}$ are each independently hydrogen, fluorine, or trifluoromethyl, at least one of $R^{13}$, $R^{14}$ and $R^{15}$ contains at least one fluorine atom, and s is a number in the range: $0 < s \leq 0.8$.

The recurring units having formulas (U) and (V) are derived from monomers MU and MV of the following formulas, respectively.

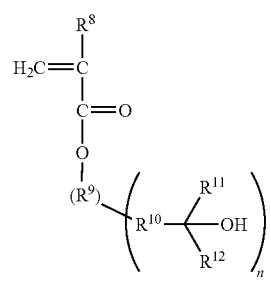
MU

Herein $R^8$, $R^9$, $R^{10}$, $R^{11}$, $R^{12}$ and n are as defined above.

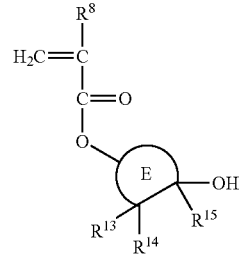
MV

Herein E, $R^8$, $R^{13}$, $R^{14}$ and $R^{15}$ are as defined above.

Suitable polymerizable monomers MU and MV of the structure having a fluorinated hydroxyalkyl group include a wide variety of monomers, and examples thereof are given below.

81
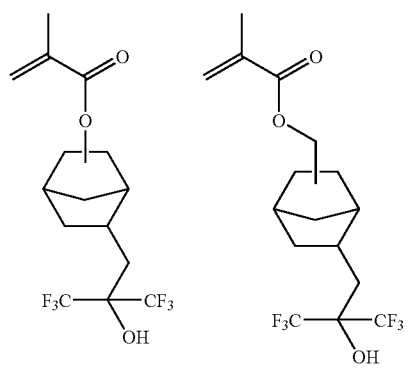
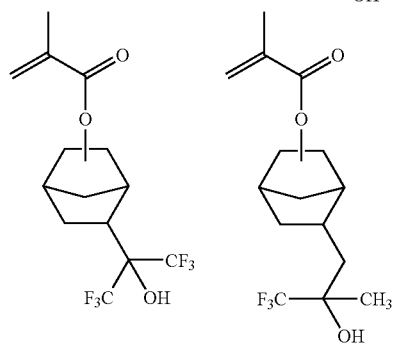
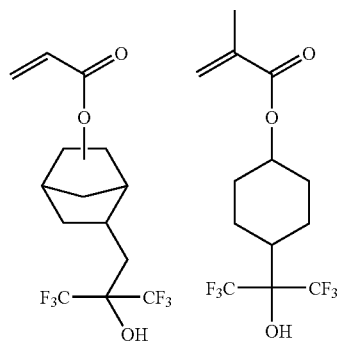
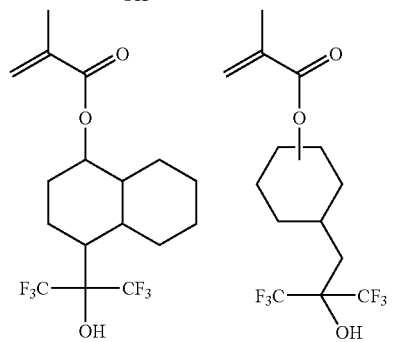
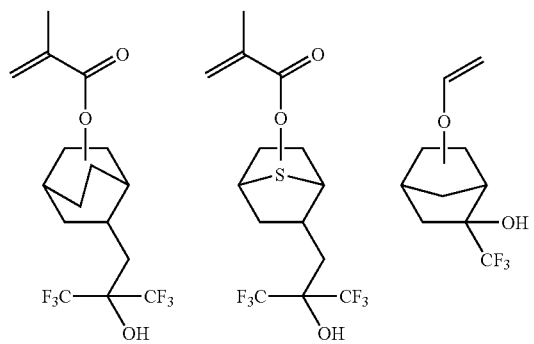
82
-continued
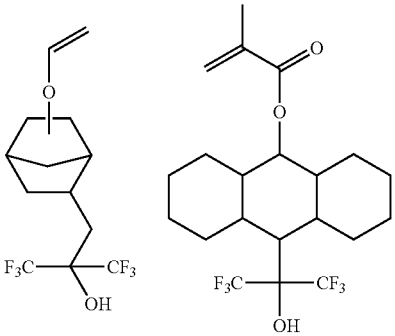
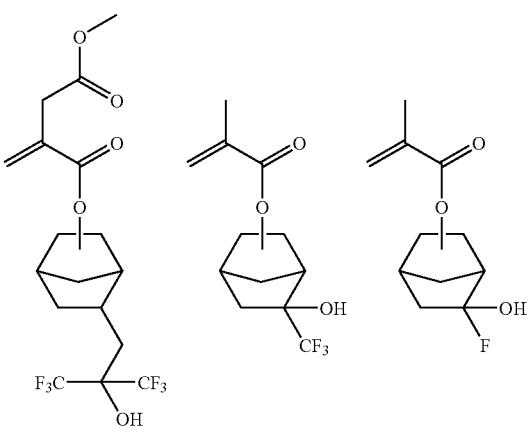
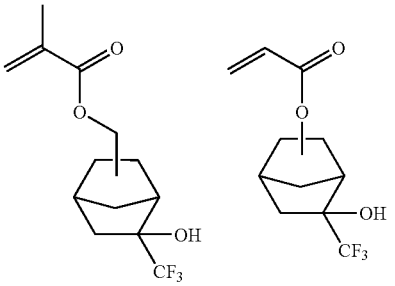
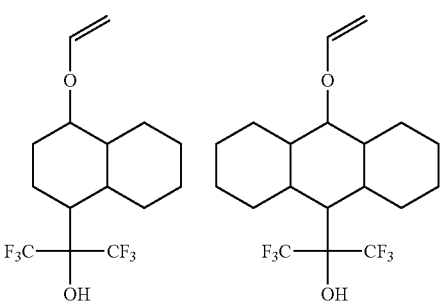

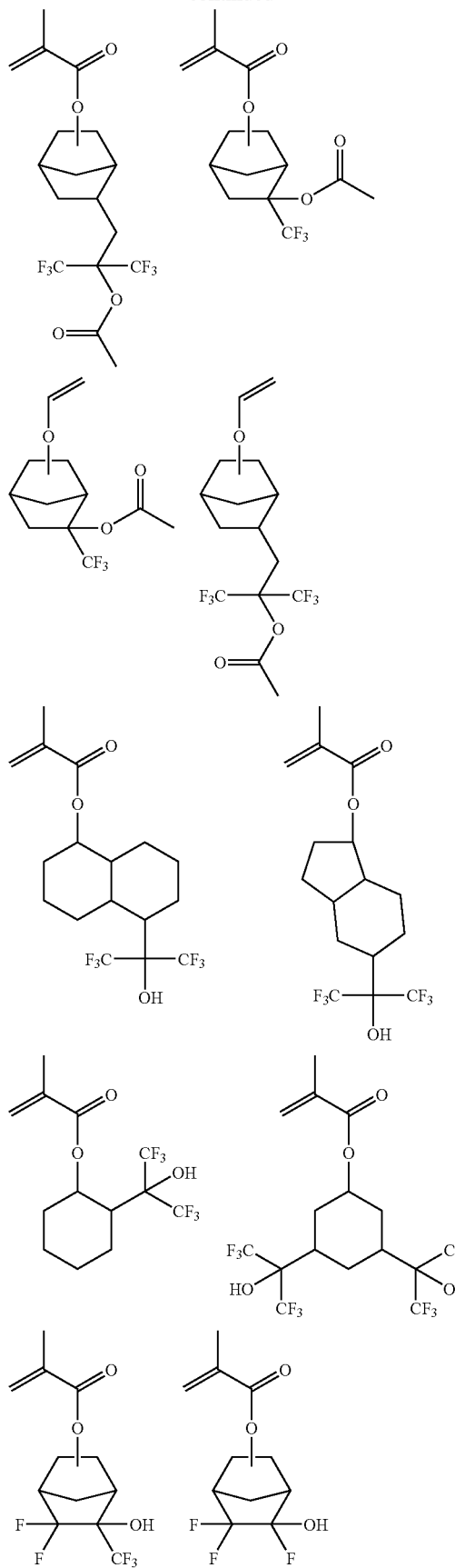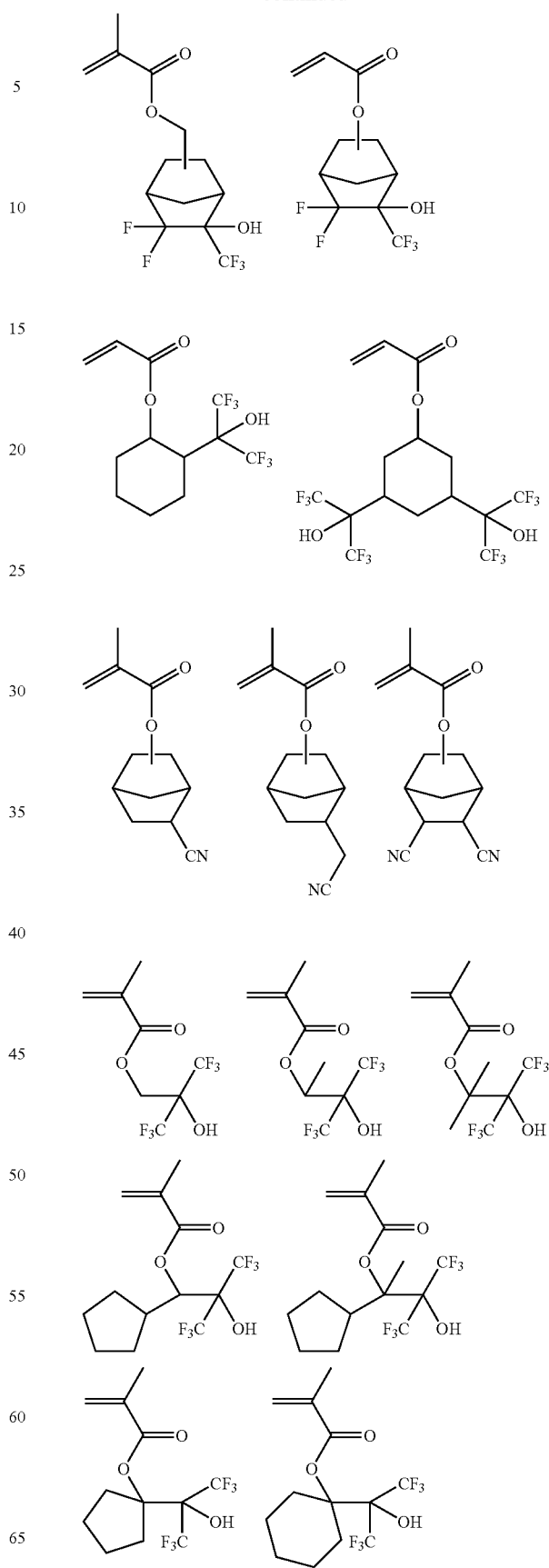

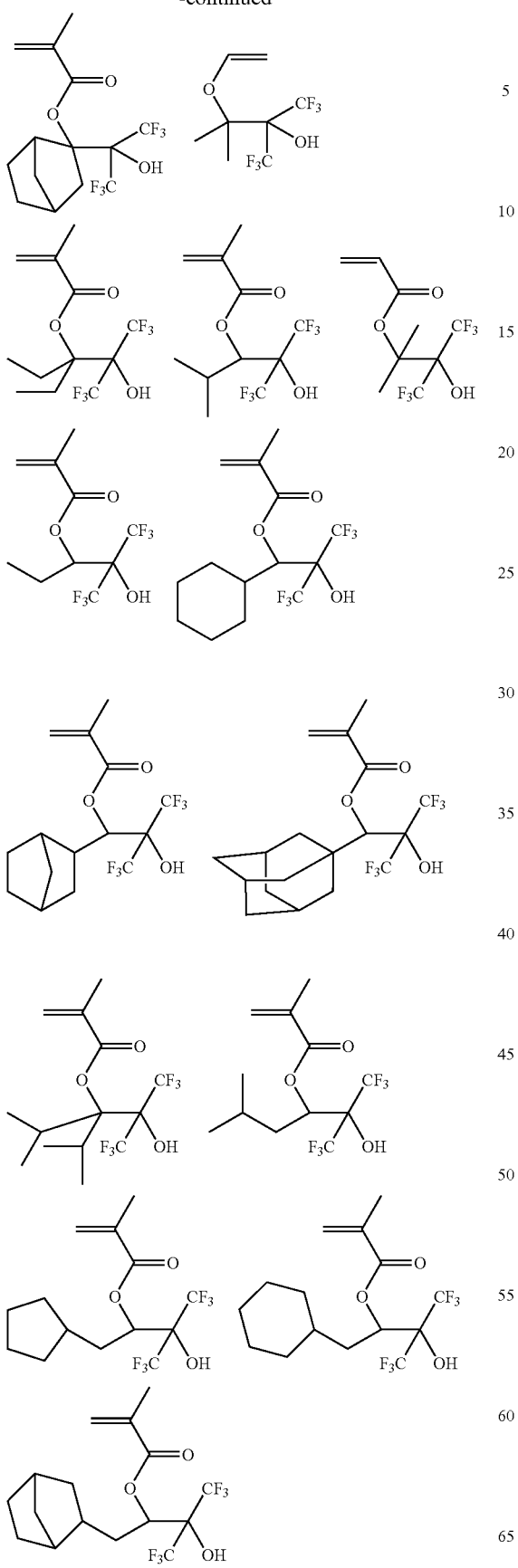
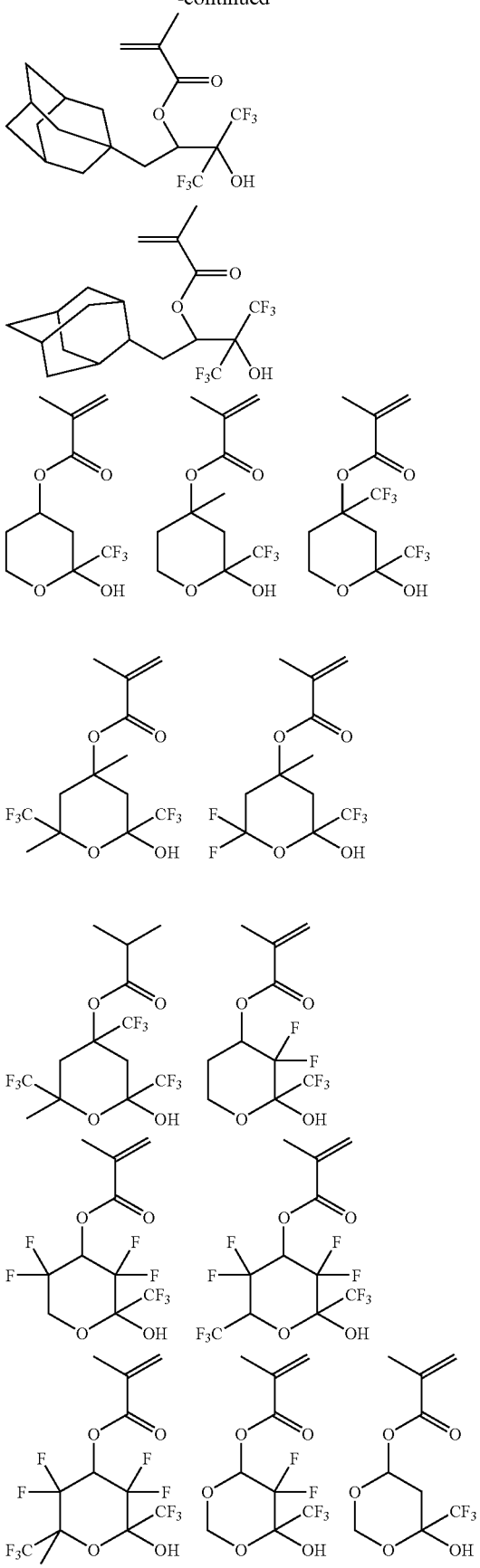

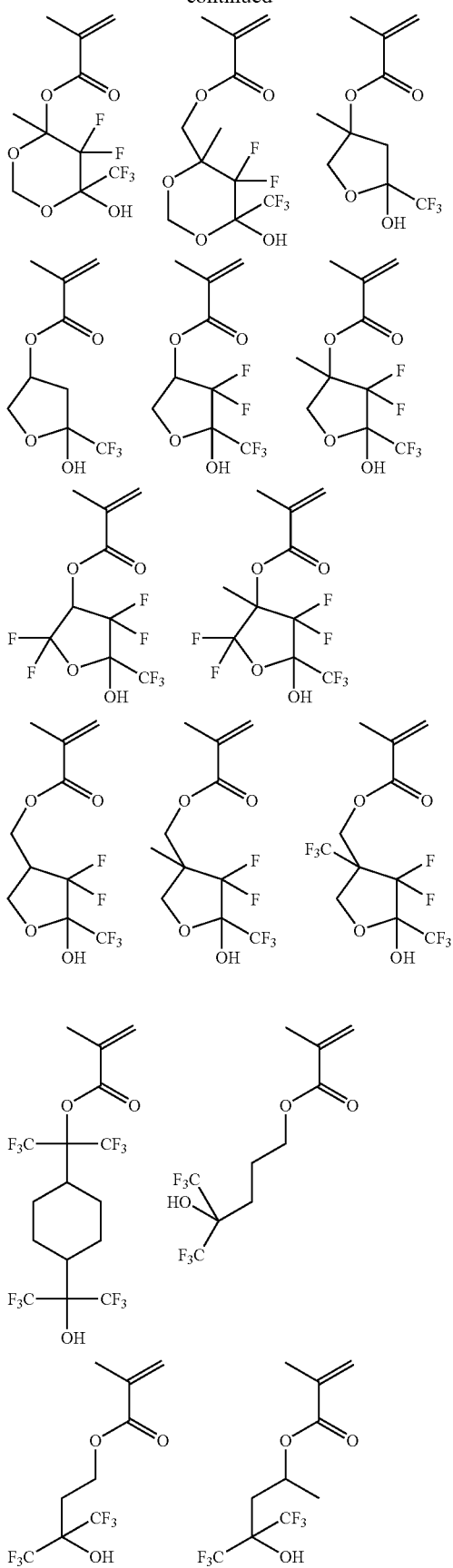

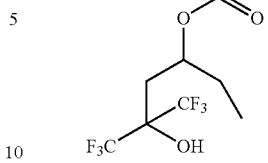

The monomers of the structure having a fluorinated hydroxyalkyl group may be used alone or in admixture for polymerization purpose.

More specifically, in the second chemically amplified negative resist composition, the preferred resin comprises recurring units of the structure having the general formula (W) in addition to the recurring units having a fluorinated hydroxyalkyl group.

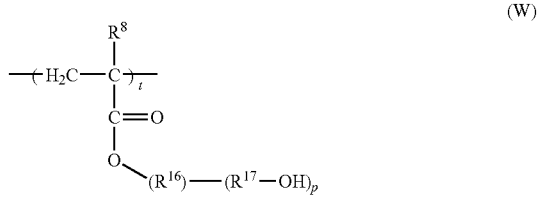

Herein $R^8$ is hydrogen or methyl, $R^{16}$ is a (p+1)-valent $C_1$-$C_{20}$ hydrocarbon group which may contain a heteroatom, $R^{17}$ is a single bond or $C_1$-$C_3$ alkylene group, p is an integer of 1 to 3, and t is a number in the range: $0<t\leq0.8$.

The recurring units having formula (W) are derived from monomers MW of the following formula.

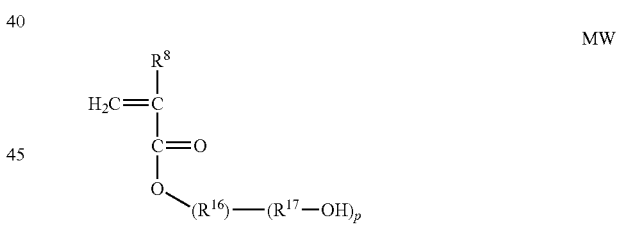

Herein $R^8$, $R^{16}$, $R^{17}$ and p are as defined above.

Suitable polymerizable monomers MW include a wide variety of monomers, and examples thereof are given below.

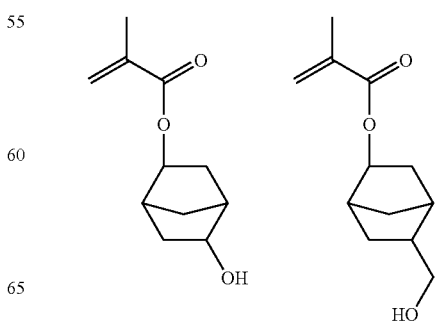

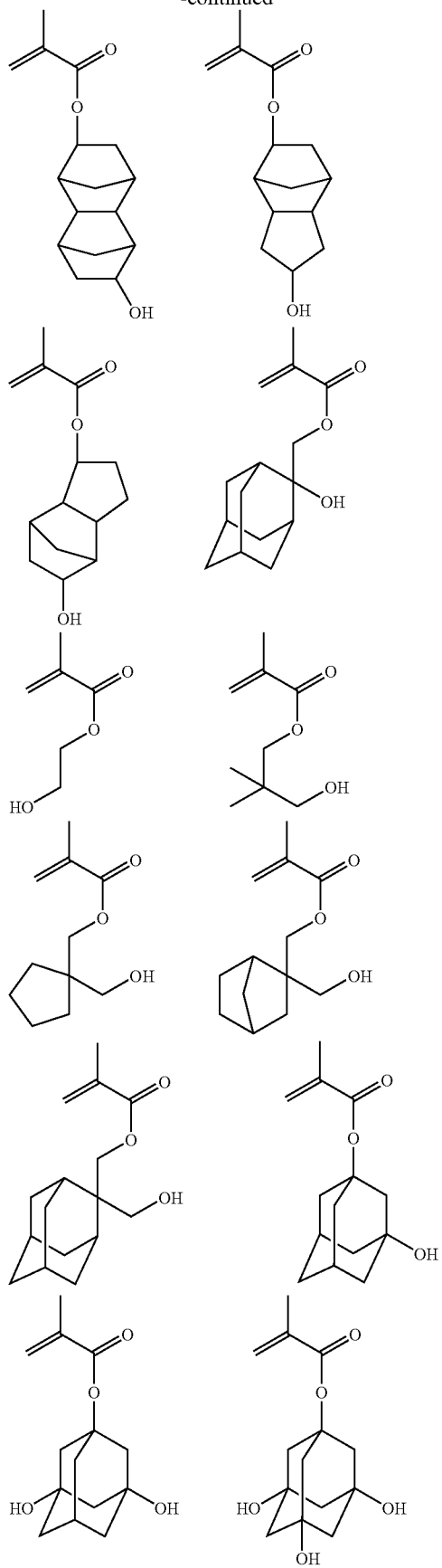
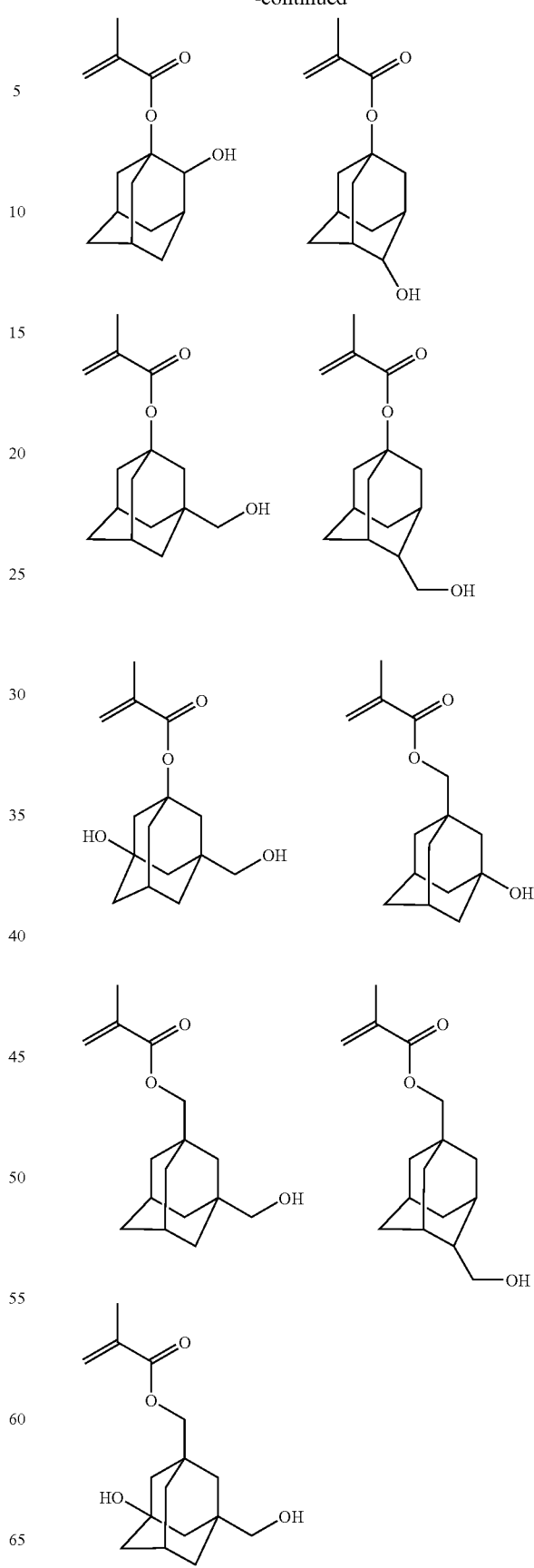

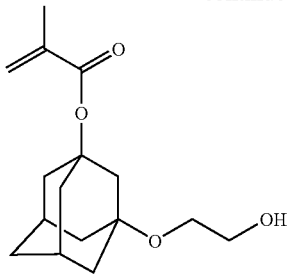

The monomers MW may be used alone or in admixture for polymerization purpose.

While the polymer used in the second negative resist composition preferably comprises recurring units of formulas (U), (V) and (W), it may further comprise other recurring units. Specifically, the polymer may have copolymerized therein recurring units (X) derived from monomers having adhesive groups such as hydroxy, cyano, carbonyl, ester, ether groups, lactone rings, carbonyl groups or carboxylic anhydride groups.

In the polymer comprising recurring units (U), (V), (W) and (X), recurring units (U) or (V) having a fluorinated hydroxyalkyl group are preferably present in a proportion of 5 to 80 mol %, more preferably 10 to 50 mol %, and even more preferably 20 to 30 mol % of the polymer, recurring units (W) are present in a proportion of 5 to 80 mol %, and more preferably 10 to 50 mol % of the polymer, and recurring units (X) are present in a proportion of 0 to 20 mol %, and more preferably 0 to 10 mol % of the polymer.

The polymer should preferably have a weight average molecular weight (Mw) in the range of 1,000 to 500,000, and preferably 2,000 to 30,000, as measured by GPC using polystyrene standards. As the Mw becomes higher, the resist material becomes more heat resistant, but with too high a Mw, it may be difficult to apply the second resist material so as to fill in between features of the first resist pattern.

The polymer comprising recurring units (U), (V) and (W) for use in the negative resist material should preferably have a narrow molecular weight distribution or dispersity (Mw/Mn). A narrow dispersity means an insignificant difference in polymer molecular weight and offers the advantage of solving the problems of foreign matter on the pattern and pattern profile degradation after exposure. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist material suitable for micropatterning to a small feature size. Also a blend of two or more polymers which differ in compositional ratio, molecular weight and/or dispersity is acceptable.

While the second negative resist composition comprises a polymer comprising recurring units of formulas (U), (V) and (W), other comonomers may be added for the purposes of improving adhesion, dry etching resistance and transparency. Exemplary additional comonomers include (meth)acrylic derivatives, styrene derivatives, hydroxystyrene derivatives, indene, benzofuran, indole, benzothiophene, methylene indane, acenaphthene derivatives, vinylnaphthalene derivatives, vinylanthracene derivatives, vinyl acetate, (meth)acrylonitrile, and vinyl pyrrolidone.

The polymer as used herein may be synthesized by any desired method, for example, by dissolving monomers corresponding to the respective units (U), (V) and (W) and optional monomers copolymerizable therewith in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

The organic solvent which can be used in the second negative resist material is not particularly limited as long as the base resin, acid generator, crosslinker and other additives are dissolvable therein. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, diethylene glycol dimethyl ether, 1-ethoxy-2-propanol and PGMEA, and mixtures thereof are preferred because the acid generator is most soluble therein.

The organic solvent is preferably used in an amount of 200 to 1,000 parts by weight, more preferably 400 to 800 parts by weight per 100 parts by weight of the base resin in the negative resist material.

In the negative resist material, an acid generator may be added for further promoting crosslinking reaction by heat. The acid generators include thermal acid generators capable of generating acid through thermal decomposition and photoacid generators capable of generating acid upon light exposure, either of which may be used herein. Examples of the acid generators used herein are the same as exemplified for the acid generators added to the positive resist material as the first resist composition, and their description is omitted herein.

The acid generator is preferably used in an amount of 0.1 to 50 parts by weight, more preferably 0.5 to 40 parts by weight per 100 parts by weight of the base resin in the negative resist material. Less than 0.1 phr of the acid generator generates a smaller amount of acid upon light exposure, leading to a lower sensitivity and resolution. More than 50 phr of the acid generator may result in a resist material having a lower transmittance and resolution.

In the negative resist material, a basic compound may be added for improving storage stability. An appropriate basic compound is a compound that plays the role of an acid quencher for preventing a minor amount of acid generated by the acid generator from driving crosslinking reaction. The inclusion of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. Examples of the basic compound used herein are the same as exemplified for the basic compounds added to the positive resist material as the first resist composition, and their description is omitted herein.

The basic compound is preferably used in an amount of 0.001 to 2 parts by weight, more preferably 0.01 to 1 part by weight per 100 parts by weight of the base resin in the negative resist material. Less than 0.001 phr of the basic compound may fail to achieve the desired addition effect whereas more than 2 phr may lead to a lower sensitivity.

For the negative resist material as the second resist composition, an acid crosslinker is essential. Suitable crosslinkers which can be used herein include melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having a double bond such as an alkenyl ether group. These compounds may be used as an additive or introduced into a polymer side chain as a pendant. Hydroxy-containing compounds may also be used as the crosslinker.

Of the foregoing crosslinkers, examples of suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide.

Examples of the alkenyl ether group-containing compound include ethylene glycol divinyl ether, triethylene glycol divinyl ether,
1,2-propanediol divinyl ether, 1,4-butanediol divinyl ether, tetramethylene glycol divinyl ether,
neopentyl glycol divinyl ether,
trimethylol propane trivinyl ether, hexanediol divinyl ether, 1,4-cyclohexanediol divinyl ether,
pentaerythritol trivinyl ether,
pentaerythritol tetravinyl ether, sorbitol tetravinyl ether, sorbitol pentavinyl ether, and
trimethylol propane trivinyl ether.

The crosslinker is preferably used in an amount of 5 to 50 parts by weight, more preferably 10 to 40 parts by weight per 100 parts by weight of the base resin in the negative resist material.

In the negative resist material, a surfactant may be added for the purposes of improving coating performance. Examples of the surfactant used herein are the same as exemplified for the surfactant in the first positive resist composition, and their description is omitted herein. The surfactant is preferably used in an amount of up to 2 parts by weight, more preferably up to 1 part by weight per 100 parts by weight of the solids in the negative resist material.

In another embodiment of the chemically amplified negative resist composition used in the double patterning process, the base resin comprises a polysiloxane compound, preferably a polysiloxane compound comprising structural units having the general formulae (2) and (3).

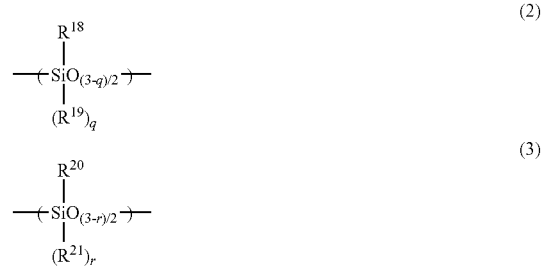

Herein $R^1$ is a $C_3$-$C_{20}$ monovalent organic group of straight, branched, cyclic or polycyclic structure which has a hydroxyl group on a carbon atom as a functional group, which has in total at least three fluorine atoms substituted on the carbon atoms bonded to the hydroxyl-bonded carbon atom, and which may contain a halogen, oxygen or sulfur atom in addition to the fluorine atoms. $R^{19}$ is a $C_1$-$C_6$ monovalent hydrocarbon group of straight, branched or cyclic structure. $R^{20}$ is a $C_3$-$C_{20}$ monovalent organic group of straight, branched, cyclic or polycyclic structure which has a hydroxymethyl group as a functional group, and which may further contain a halogen, oxygen or sulfur atom. $R^{21}$ is as defined for $R^{19}$. The subscript q is 0 or 1 and r is 0 or 1.

The unit having formula (2) is incorporated as a structural unit having a polar group capable of controlling swell. It contributes to this effect that unlike ordinary alcohols, the hydroxyl group on $R^{18}$ affords an adequate acidity because the density of electrons on oxygen is reduced due to the strong attraction of electrons by fluorine atoms bonded at adjacent positions. Fluorine atoms exert a substantial electron attracting effect when they are bonded to a carbon atom which is bonded to the hydroxyl-bonded carbon atom, but less such effect when bonded at a remoter position. To acquire this effect more efficiently, it is preferred to attach a trifluoromethyl group to the hydroxyl-bonded carbon atom. A typical partial structure is hexafluoroisopropyl group. A number of such fluorine-substituted alcohol derivatives have already been reported. A silicone structural unit can be obtained by effecting hydrosilylation between such an alcohol derivative having an unsaturated bond and a silane to form a silane monomer, followed by hydrolytic condensation. The skeleton of substituent group forming the side chain is a $C_3$-$C_{20}$ organic group of straight, branched, cyclic or polycyclic structure which may contain a halogen, oxygen or sulfur atom. Several of fluorinated silicone compounds having a hydroxyl group have already been disclosed (e.g., in JP-A 2002-268227 and JP-A 2003-173027) and they all can be generally used herein. Of the structural units belonging to this genus, a choice of a single unit may be made or a mixture of two or more different units may be used. Of these units, use of a structural unit having a norbornane skeleton is advantageous in purification or the like because the resulting resin is most likely solid. Some typical examples are given below. Note that Si is depicted in the formula to manifest the bond of the structure to a silicon atom.

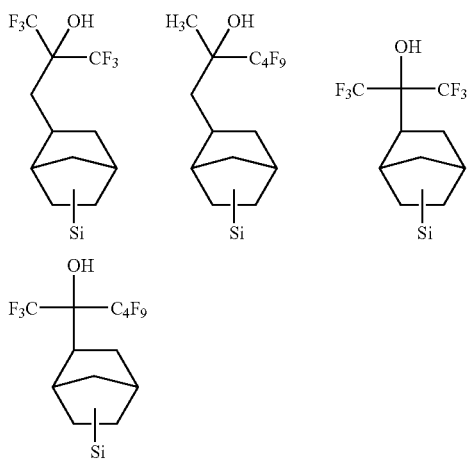

Of the structural units having formula (2), polysiloxane compounds having the following formula (Si-10) are preferred.

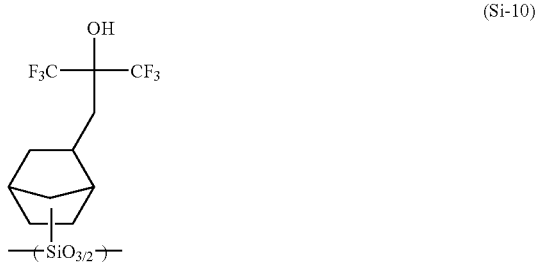

(Si-10)

Now that the second resist material is negative, the units having formula (3) have the function that as crosslinking reaction takes place between the units having formula (3) and the acid crosslinker, the siloxane compound as the base resin loses alkali solubility, whereby a negative pattern is formed. Exemplary structures of the units having formula (3) are shown below.

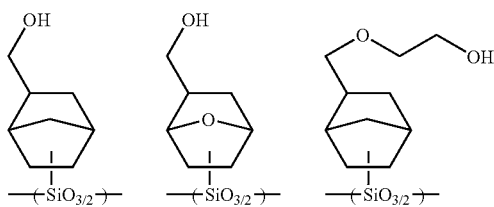

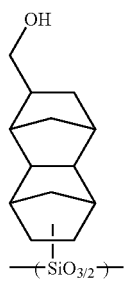

-continued

For the unit of formula (2) or (3), a single unit or a mixture of different units belonging to this genus may be used.

The structural units having formulae (2) and (3) may be either divalent structural units or trivalent silicone compounds. The situation where q or r is 0 means trivalent and the situation where q or r is 1 means divalent. When divalent structural units account for 50 mol % or more based on the entire structural units of formulae (2) and (3), a silicone resin resulting from condensation of these monomers is unlikely to solidify and thus difficult to purify.

When the divalent monomer is used, the other side chain $R^{19}$ or $R^{21}$ from silicon may be selected from simple groups because no particular function is assigned thereto. Since a carbon number in excess of 6 tends to interfere with purification by distillation or the like, a choice is preferably made of monovalent hydrocarbon groups having not more than 6 carbon atoms.

With respect to the proportion of structural units having formulae (2) and (3), the ratio of the structural unit of formula (2) to the entire silicone structural units is preferably 5 to 80 mol %, more preferably 10 to 50 mol %, based on the entire polysiloxane compound.

Then the amount of the structural units of formula (3) is preferably 20 to 95 mol %, more preferably 50 to 90 mol %, based on the entire polysiloxane compound. If these units are in short, the resist film will peel off during development, failing to form a satisfactory negative pattern.

With respect to the ratio of the structural unit of formula (2) to the structural unit of formula (3), if one structural unit is less than 10 mol % based on the total of these two structural units, the function of the one structural unit is not available. It is thus preferred that each structural unit be 10 to 90 mol % based on the total of structural units of formulae (2) and (3).

Further, divalent or more siloxane units other than the structural units of formulae (2) and (3) may be added as long as their amount is at most 30 mol % of the entire polysiloxane compound. For example, where every siloxane structural unit has a bulky side chain, in some cases, only a compound with a lower molecular weight can be obtained through mere adjustment of condensation conditions for polysiloxane synthesis. In such cases, the molecular weight can be increased by adding units having only an alkyl group of at most 4 carbon atoms, typically methylsiloxane. Also, where it is desired to enhance the transparency of a resin to exposure light of shorter wavelength, typically light of 157 nm, it is known effective to increase the number of fluorine atoms contained in the resin per unit weight. For imparting such transparency to the negative resist material, it is effective to introduce siloxane units having fluoroalkyl groups introduced therein.

These siloxane structure units can be synthesized by cohydrolytic condensation of a mixture of hydrolyzable silane compounds corresponding to the respective units, i.e., by contacting a mixture of silane monomers with water. The reaction may be effected in the presence of an acid catalyst or base catalyst and also in an organic solvent. Examples of suitable acid catalysts used in the reaction include hydrochloric acid, nitric acid, acetic acid, oxalic acid, sulfuric acid, methanesulfonic acid, p-toluenesulfonic acid, trifluoroacetic acid, trifluoromethanesulfonic acid, perchloric acid, phosphoric acid and citric acid. Examples of suitable base catalysts include ammonia, methylamine, dimethylamine, ethylamine, diethylamine, triethylamine, sodium hydroxide, potassium hydroxide, tetramethylammonium hydroxide, tetrapropylammonium hydroxide, choline, diethylhydroxylamine, DBU, and DBN. Suitable organic solvents include polar solvents such as ethanol, IPA, MIBK, acetonitrile, DMA, and DMF, and aromatic solvents such as benzene, toluene, and xylene, which may be used alone or in admixture.

The silicone resin or polysiloxane compound produced as the cohydrolytic condensate of a mixture of silane monomers should preferably have a weight average molecular weight (Mw) of 1,000 to 100,000, more preferably 1,000 to 30,000, and even more preferably 1,500 to 20,000, as measured by GPC versus polystyrene standards. Resins having a Mw in excess of 100,000 may be difficult to purify, resins having a Mw in excess of 30,000 tend to decline in resolution, though depending on a combination of monomers, and resins having a Mw in excess of 20,000 may have similar tendency. Resins having a Mw of less than 1,500 tend to have a rounded pattern profile, and resins having a Mw of less than 1,000 may have more tendency. During subsequent etching of the underlying film, such a rounded pattern profile can be a cause of preventing perpendicular etching of the film.

The second resist composition used in the double pattern forming process and comprising a polysiloxane compound as a base resin may further comprise an organic solvent, a compound capable of generating an acid in response to high-energy radiation (known as "acid generator"), an acid crosslinker, and optionally, a dissolution inhibitor, a basic compound, a surfactant, and other components. These components including organic solvent, acid generator, dissolution inhibitor, basic compound, and surfactant are previously described in conjunction with the first resist composition and their examples are also the same as previously illustrated, with their description omitted. In the embodiment wherein the second resist composition used in the double pattern forming process comprises a polysiloxane compound as a base resin, a polysiloxane compound having a higher silicon content is desirable. Where other additives are organic compounds so that the overall resist composition may have a lower silicon content, it is preferred to reduce the amounts of organic compounds.

Process

Now the double patterning process of the invention is illustrated. The first positive resist material is coated on a substrate to form a first resist film thereon. As shown in FIG. 1(A), a first resist film 30 of a positive resist material is formed on a processable substrate 20 disposed on a substrate 10 directly or via an intermediate intervening layer (not shown). The first resist film preferably has a thickness of 10 to 1,000 nm and more preferably 20 to 500 nm. Prior to exposure, the resist film is heated or prebaked, preferably at a temperature of 60 to 180° C., especially 70 to 150° C., even more preferably 80 to 120° C. for a time of 10 to 300 seconds, especially 15 to 200 seconds, even more preferably 30 to 120 seconds.

The substrate 10 used herein is generally a silicon substrate. The processable substrate 20 used herein includes $SiO_2$, SiN, SiON, SiOC, p-Si, α-Si, TiN, WSi, BPSG, SOG, Cr, CrO, CrON, MoSi, low dielectric constant film, and etch stopper film. The intermediate intervening layer includes hard masks of $SiO_2$, SiN, SiON or p-Si, an undercoat in the form of carbon film, a silicon-containing intermediate film, and an organic antireflective coating.

Where the second resist material used in the double patterning process of the invention is a negative resist material comprising a polysiloxane compound as defined above, the lower layer of the double pattern formed on the processable substrate is preferably made of an organic film-forming material so that the resultant double pattern may be used as the so-called bilayer resist.

Where the double pattern is used as a bilayer resist, the organic film-forming material of which the lower layer of the double pattern formed on the processable substrate is made may be selected from many well-known materials. The organic film is briefly described. Basically, aromatic resins are preferred. More preferred are those resins which are crosslinked upon film formation so that intermixing may not occur when the resist material is subsequently coated to form a film thereon.

Suitable aromatic resins include novolac resins and polyhydroxystyrene resins, and those resins having a fluorene or indene framework may be advantageously used in order to enhance the etch resistance of this organic film during etching of the substrate after pattern transfer to this organic film. Also an ARC may be formed on the organic film and a resist film according to the invention be formed thereon. The organic film having an antireflection function is preferred because the process becomes more simple. For such an antireflection function, it is preferred to use a resin having an anthracene or naphthalene framework or a benzene framework with conjugated unsaturated bond.

Crosslinks may be formed using thermosetting resins or a crosslinking technique employed in negative resist materials. One common method uses a composition in solution form comprising a resin having functional groups such as phenol, alkoxyphenyl, alcohol or carboxylic acid, a substance capable of generating an acid through thermal decomposition, and a crosslinker (e.g., hexaalkoxymethylmelamine) capable of forming crosslinks with the functional groups in the presence of an acid catalyst. The composition is coated onto a processable substrate and heated to generate the acid whereby crosslinks are formed.

Then the first resist film is exposed. For the exposure, preference is given to high-energy radiation having a wavelength of 140 to 250 nm, and especially ArF excimer laser radiation of 193 nm. The exposure may be done either in air or in a dry atmosphere with a nitrogen stream, or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface. The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably carried out so as to provide an exposure dose of about 1 to 200 mJ/cm$^2$, more preferably about 10 to 100 mJ/cm$^2$, and even more preferably 10 to 50 mJ/cm$^2$. This is followed by baking on a hot plate at 60 to 150° C. for 30 seconds to 5 minutes, preferably at 80 to 120° C. for 30 seconds to 3 minutes (post-exposure baking=PEB).

Thereafter the first resist film is developed with a developer in the form of an aqueous alkaline solution, for example, an aqueous solution of 0.1 to 5 wt %, preferably 2 to 3 wt % tetramethylammonium hydroxide (TMAH) for 0.1 to 3 minutes, preferably 0.5 to 2 minutes by conventional techniques such as dip, puddle and spray techniques. In this way, a desired resist pattern 30a is formed on the substrate as shown in FIG. 1(B).

The line pattern of the first resist film resulting from the above patterning process is removed, leaving a space pattern in a second resist film to which it is reversal transferred. When the space pattern to be reversal transferred to the second resist film is finished thin, such thin finish can be achieved by increasing the exposure dose of high-energy radiation applied in forming pattern 30a of the first resist film. FIG. 1(B-1) shows an exemplary pattern having a line size reduced by over-exposure of the first resist film.

Next, the first resist pattern is treated so as to eliminate acid labile groups in the polymer and to crosslink the polymer, forming a crosslinked pattern 30b as shown in FIG. 1(C). To induce elimination of acid labile groups and crosslinking to the polymer in the first resist pattern, acid and heat are necessary. In practice, an acid is generated, after which heat is applied to effect deprotection of acid labile groups and crosslinking at the same time.

The acid may be generated by a suitable method such as flood exposure of the wafer (pattern) as developed for decomposing the photoacid generator. The flood exposure uses an exposure wavelength of 180 to 400 nm and an exposure dose of 10 mJ/cm$^2$ to 1 J/cm$^2$. Radiation with a wavelength of less than 180 nm, specifically irradiation of excimer lasers of 172 nm, 146 nm and 122 nm or excimer lamps is undesirable because not only the generation of acid from photoacid generator, but also photo-induced crosslinking reaction are accelerated, leading to a decrease of alkaline dissolution rate due to excessive crosslinking. For the flood exposure, use is preferably made of an ArF excimer laser with a wavelength of 193 nm, a KrCl excimer lamp of 222 nm, a KrF excimer laser of 248 nm, a low-pressure mercury lamp centering at 254 nm, a XeCl excimer lamp of 308 nm, and i-line of 365 nm.

However, it is desired to avoid the use of an equipment for flood exposure because the equipment itself is expensive and because of the disadvantage that if it is built in the semiconductor device production line, the throughput of the line is reduced by an increased number of steps.

As mentioned above, in the step of treating the first resist pattern to eliminate acid labile groups in the polymer and to crosslink the polymer to form a crosslinked pattern 30b as shown in FIG. 1(C), acid and heat are necessary for elimination and crosslinking. To positively generate an acid, a thermal acid generator may be added to the first resist material.

In the embodiment wherein a thermal acid generator in the form of an ammonium salt is added to the positive resist material, an acid can be generated by heating. In this case, acid generation and crosslinking reaction take place simultaneously. Preferred heating conditions include a temperature of 180 to 220° C. and a time of 10 to 300 seconds, especially 30 to 60 seconds. As a result, a crosslinked resist pattern which is insoluble in the solvent of the second resist material or reversal film-forming composition is yielded.

Suitable ammonium salts serving as the thermal acid generator include compounds of the formula (P1a-2). The addition of a thermal acid generator to the first resist material is advantageous in that it helps the first resist pattern to exhibit alkali solubility and it promotes crosslinking reaction to impart resistance to the organic solvent used in coating of a second resist material. However, excess addition of a thermal acid generator gives rise to some problems. The thermal acid generator may be added in such amounts as to provide no impact on the lithography of patterning the first resist film, no impact on the thermal properties of the first resist pattern, and no impact on the second resist film. Specifically, the thermal acid generator may be added in an amount of up to 5%, preferably up to 3%, and more preferably 0.01 to 1% by weight based on the weight of the base resin in the first resist material.

(P1a-2)

Herein K$^-$ is a sulfonate having at least one fluorine substituted at α-position, or perfluoroalkylimidate or perfluoroalkylmethidate. $R^{101d}$, $R^{101a}$, $R^{101f}$, and $R^{101g}$ are each independently hydrogen, a straight, branched or cyclic $C_1$-$C_{12}$ alkyl, alkenyl, oxoalkyl or oxoalkenyl group, a $C_6$-$C_{20}$ aryl group, or a $C_7$-$C_{12}$ aralkyl or aryloxoalkyl group, in which some or all hydrogen atoms may be substituted by alkoxy groups. Alternatively, $R^{101d}$ and $R^{101e}$, or $R^{101d}$, $R^{101a}$ and $R^{101f}$ may bond together to form a ring with the nitrogen atom to which they are attached, and $R^{101e}$ and $R^{101f}$ or $R^{101d}$, $R^{101e}$ and $R^{101f}$, taken together, denote a $C_3$-$C_{10}$ alkylene group or a hetero-aromatic ring having incorporated therein the nitrogen atom when they form a ring.

Examples of K$^-$ include perfluoroalkanesulfonates such as triflate and nonaflate, imidates such as bis(trifluoromethylsulfonyl)imide, bis(perfluoroethylsulfonyl)imide, and bis(perfluorobutylsulfonyl)imide, methidates such as tris(trifluoromethylsulfonyl)methide and tris(perfluoroethylsulfonyl)methide, and sulfonates having fluorine substituted at α-position, represented by the formula (K-1), and sulfonates having fluorine substituted at α-position, represented by the formula (K-2).

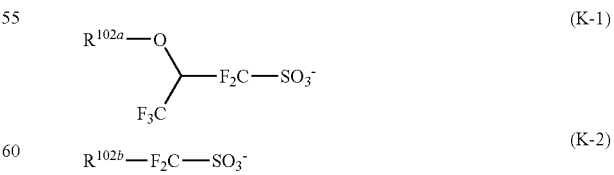

In formula (K-1), $R^{102a}$ is hydrogen, a straight, branched or cyclic $C_1$-$C_{20}$ alkyl or acyl group, $C_2$-$C_{20}$ alkenyl group or $C_6$-$C_{20}$ aryl or aryloxy group, which may have an ether, ester, carbonyl group or lactone ring and in which some or all hydrogen atoms may be substituted by fluorine atoms. In formula (K-2), $R^{102b}$ is hydrogen, a straight, branched or cyclic $C_1$-$C_{20}$ alkyl group, $C_2$-$C_{20}$ alkenyl group or $C_6$-$C_{20}$ aryl group.

Apart from the embodiment of performing flood exposure and the embodiment of adding a thermal acid generator to positively generate an acid in the first resist pattern, there is a possible embodiment wherein a minor amount of residual acid which has diffused from the exposed area and remains in the first resist pattern react with acid labile groups at elevated temperature whereby the acid labile groups are eliminated so that the first positive resist pattern turns to be alkali soluble, and crosslinking reaction take place under the action of that acid and heat so that the pattern is endowed with solvent resistance. It has been observed that some acid labile groups are thermally eliminated by heating at high temperature. It has also been observed that the first resist pattern is converted from a positive behavior to be insoluble in alkaline developer to an alkaline developer soluble behavior by heating at high temperature. As long as the first resist material according to the invention is used, acid-assisted elimination of acid labile groups for the first resist pattern to convert from alkaline developer insolubility to solubility and impartment of resistance to organic solvent in the second resist material for reversal transfer can be accomplished simply by heating at high temperature. In the step of heating at high temperature to facilitate conversion of the first resist pattern to be alkali soluble and crosslinking reaction to impart resistance to organic solvent used in coating of the second resist material, an appropriate temperature is at least 150° C., and more preferably in the range of 180 to 220° C. In general, a photo-acid generator and basic compound in a resist material serve as plasticizers, with the tendency that the resist pattern has a lower Tg and thermal flow begins at a lower temperature. Since the photoacid generator and basic compound are commonly incorporated in the resist material, it is necessary to select a base resin having a high Tg while taking into account the plasticizing effect by the addition of photoacid generator and basic compound. An appropriate Tg of base resin is at least 150° C., and more preferably at least 180° C. If the temperature reached by heating to induce crosslinking reaction is higher than 220° C., then an optimum first resist pattern for reversal transfer to the second resist film cannot be obtained due to substantial thermal shrinkage or thermal damage to the first resist pattern. If the temperature reached by heating to induce crosslinking reaction is lower than 150° C., then crosslinking reaction may occur short.

Next, as shown in FIG. 1(D), the second resist material (or reversal film-forming composition) is coated and built up until it covers or overlies the crosslinked first resist pattern 30b, forming a second resist film (or reversal film) 40.

In another embodiment, the second resist material is coated to form a second resist film having a thickness lower than the height of the first resist pattern as shown in FIG. 1(D-1). Then the first resist pattern which has been converted to be soluble in alkaline developer may be exposed to an alkaline developer whereby the first resist pattern may be removed from the second resist film serving as the reversal transfer film.

In the embodiment shown in FIG. 1(D), the second resist film (serving as the reversal transfer film) overlying the first resist pattern must be removed so that the first resist pattern which has been converted (or reversed) to be soluble in alkaline developer may be contacted with an alkaline developer. Understandably, the second resist film made of negative resist material is characterized by an initial rate of alkaline dissolution and susceptibility to slimming. Then the second resist film (serving as the reversal transfer film) overlying the first resist pattern is somewhat slimmed, allowing the alkaline developer to access and contact the reversed first resist pattern, without a need to make the first resist pattern physically exposed. Then the first resist pattern is dissolved away in the alkaline developer.

For the first resist pattern which has been reversed solely by the heating step at high temperature and for the second resist film (serving as reversal transfer film) overlying the reversed first resist pattern, the coating thicknesses of first and second resist films become crucial. Appropriate thicknesses of first and second resist films to be coated are discussed below. Relative to the thickness of a first resist film coated onto a flat substrate, the thickness of a second resist film coated onto the flat substrate is preferably 60 to 50%. If the coating thickness of a second resist film is thicker than the range, the second resist film overlying the first resist pattern may not be removed, an alkaline developer may not gain access to the first resist pattern, and reversal and removal of the first resist pattern may not be done. If the coating thicknesses are too thin, a double pattern obtained after patterning of the second resist film including a pattern of reversal transfer of the first resist pattern may not have a certain thickness.

On the other hand, the first resist pattern which has been converted to be soluble in alkaline developer ensures that reversal of the first resist pattern and pattern formation of the second resist film take place simultaneously during the development step for patterning the second resist film.

Generally, patterning of the second resist film may be performed by two modes which have their own advantage.

One mode is by effecting exposure to form a second resist pattern so that spaces thereof (exposed areas 50) are disposed between features (lines) of the reversed first resist pattern as shown in FIG. 1(E-1). In this case, the first resist pattern converted to be alkali soluble is dissolved away in an alkaline developer to leave spaces, and the second resist pattern defines spaces therebetween. As a result, a double patterning process of forming closely packed lines and spaces becomes possible as shown in FIG. 1(E-2). Notably the second resist film is made of negative resist material. Exposure is made in areas 50 overlying the first resist pattern (for reversal transfer) as shown in FIG. 1(E-1), the second negative resist film in the exposed areas 50 undergoes crosslinking reaction and becomes difficulty soluble in alkaline developer, and as a result, spaces of the second resist pattern are formed between features of the first resist pattern (for reversal transfer).

Advantageously this double patterning process of forming a closely packed line-and-space pattern has an ability to form lines and spaces of a size which cannot be achieved by the single patterning process.

The other mode of exposure of the second resist film is by effecting exposure at a position remote from the first resist pattern to be reversed into spaces as shown in FIG. 1(E-3). Notably the second resist film is made of negative resist material. In the case of transfer of the first resist pattern (for reversal transfer) to the second resist film to form spaces in the second resist film, the second resist film overlying the first resist pattern must be crosslinked and insolubilized in alkaline developer so as to leave a pattern, and thus, exposure must be performed on the second resist film overlying the first resist pattern in areas where the first resist pattern lies below. At the same time, exposure to the desired pattern is also performed on the second resist film at a position remote from the reversed first resist pattern. A patterning process of forming a fine size space pattern and an isolated line pattern at the same time is very difficult because their characteristics are in trade-off relationship. The double patterning process of the invention succeeds in overcoming the trade-off because a fine size space pattern can be formed by reversal transfer of the first resist pattern and an isolated line pattern can be formed by patterning the second resist film. The process is advantageous in processing a layer to form fine size spaces and isolated lines in combination as shown in FIG. 1(E-4).

Furthermore, as seen from FIGS. 1(E-2) and (E-4), using the resulting double pattern as a mask, the intermediate intervening layer of hard mask or the like (if any) may be etched, and the processable substrate 20 further etched. For etching of the intermediate intervening layer of hard mask or the like, dry etching with fluorocarbon or halogen gases may be used. For etching of the processable substrate, the etching gas and conditions may be properly chosen so as to establish an etching selectivity relative to the hard mask, and specifically, dry etching with fluorocarbon, halogen, oxygen, hydrogen or similar gases may be used. Thereafter, the crosslinked resist film and second resist film are removed. Removal of these films may be carried out after etching of the intermediate intervening layer of hard mask or the like. It is noted that removal of the crosslinked resist film may be achieved by dry etching with oxygen or radicals and removal of the second resist film may be achieved as previously described, or using strippers such as amines, sulfuric acid/aqueous hydrogen peroxide or organic solvents.

EXAMPLE

Examples of the invention are given below by way of illustration and not by way of limitation. The abbreviations used herein are GPC for gel permeation chromatography, Mw for weight average molecular weight, Mn for number average molecular weight, Mw/Mn for molecular weight distribution or dispersity, NMR for nuclear magnetic resonance, PAG for photoacid generator, TAG for thermal acid generator, Me for methyl, and Et for ethyl. For all polymers, Mw and Mn are determined by GPC versus polystyrene standards.

Synthesis Example 1

Polymers for use in first resist compositions for reversal and second resist compositions subject to reversal transfer of first resist film were prepared by combining various monomers, effecting copolymerization reaction in tetrahydrofuran solvent, crystallization in methanol, repeatedly washing with hexane, isolation, and drying. The resulting polymers (Resist Polymers 1 to 10 and Comparative Resist Polymers 11 to 13) had the composition shown below. Notably, a phenol group on a monomer was substituted by an acetoxy group, which was converted back to a phenol group by alkaline hydrolysis after polymerization. The composition of each polymer was analyzed by $^1$H-NMR, and the Mw and Mw/Mn determined by GPC.

Resist Polymer 1
(polymer for use in first resist composition)
Mw=8,300
Mw/Mn=1.73

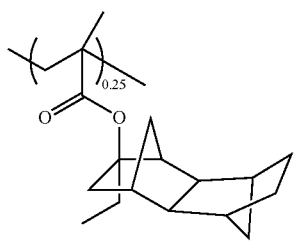

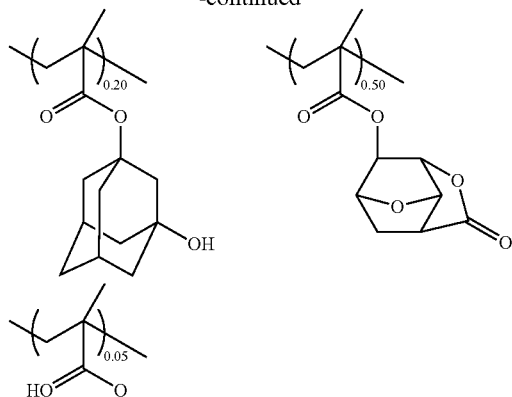

Resist Polymer 2
(polymer for use in first resist composition)
Mw=7,300
Mw/Mn=1.67

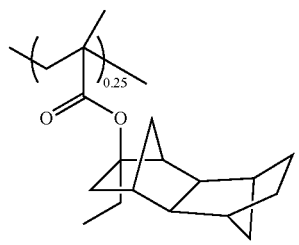

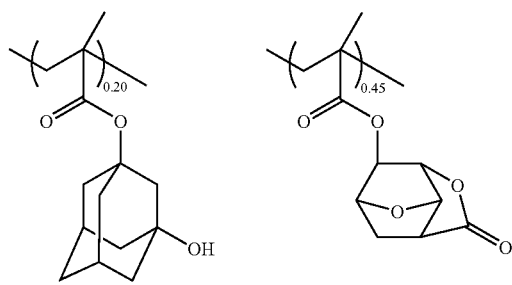

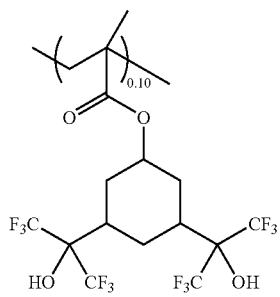

Resist Polymer 3
(polymer for use in first resist composition)
Mw=7,700
Mw/Mn=1.68
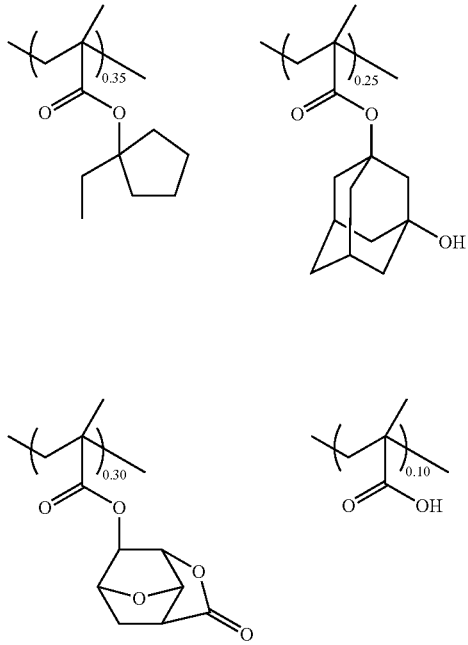
Resist Polymer 4
(polymer for use in first resist composition)
Mw=7,500
Mw/Mn=1.67
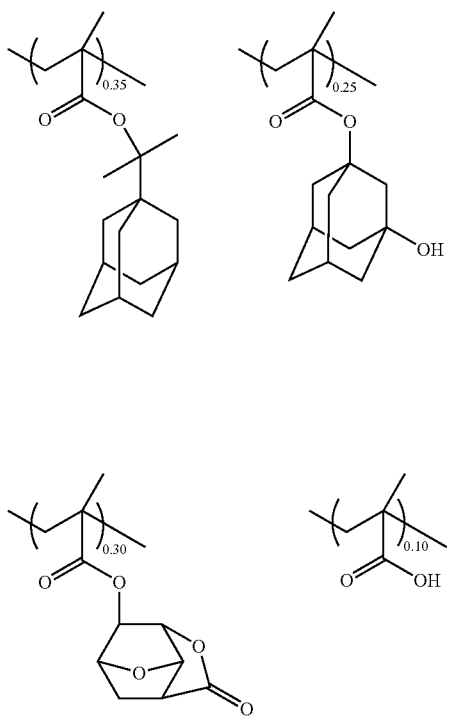
Resist Polymer 5
(polymer for use in first resist composition)
Mw=8,000
Mw/Mn=1.71
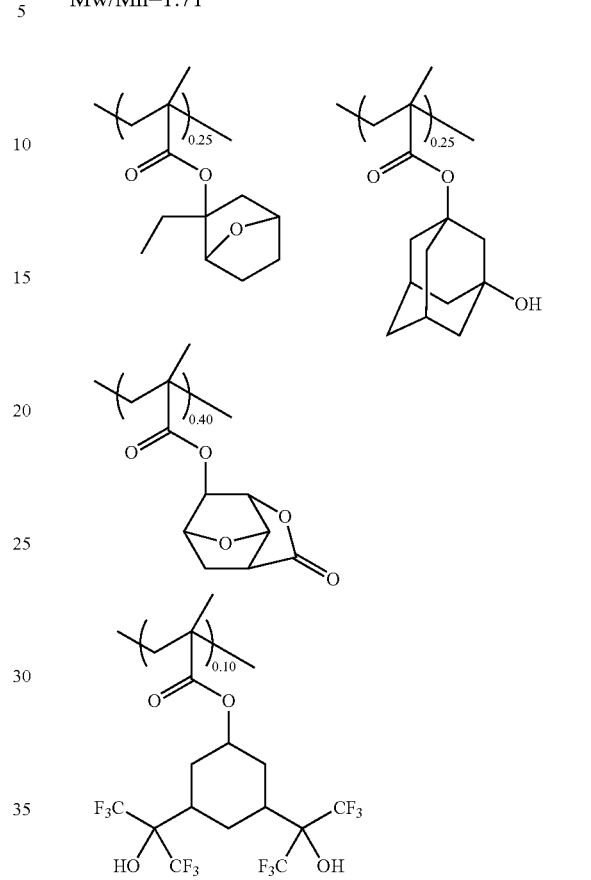
Resist Polymer 6
(polymer for use in first resist composition)
Mw=6,700
Mw/Mn=1.67
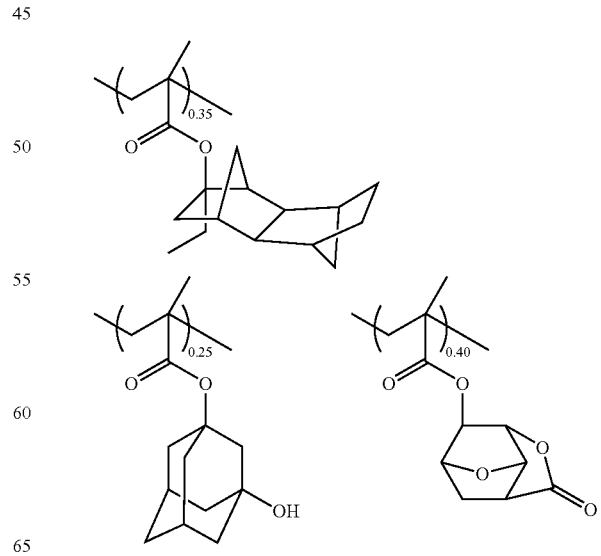

Resist Polymer 7
(polymer for use in first resist composition)
Mw=7,800
Mw/Mn=1.66
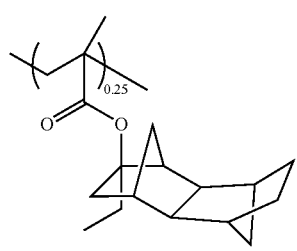
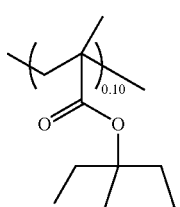
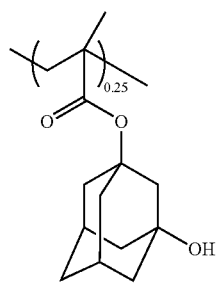
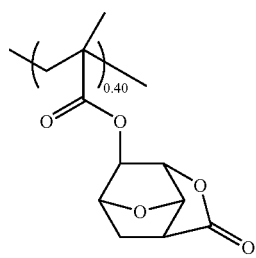
Resist Polymer 8
(polymer for use in second resist composition)
Mw=8,400
Mw/Mn=1.80
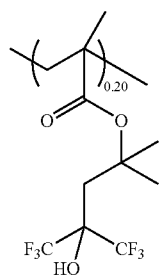
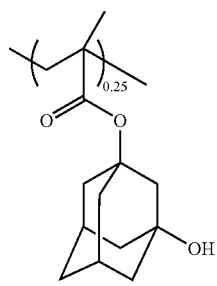
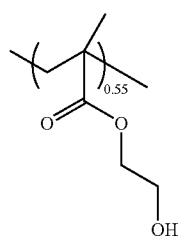
Resist Polymer 9
(polymer for use in second resist composition)
Mw=8,000
Mw/Mn=1.91
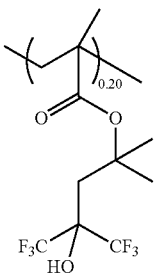
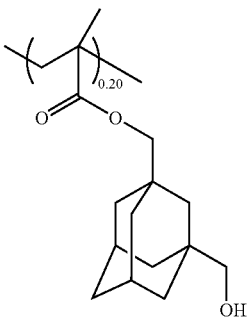
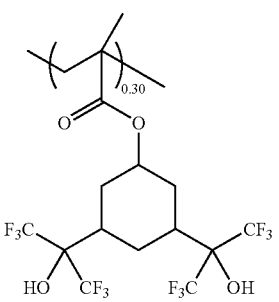
Resist Polymer 10
(polymer for use in second resist composition)
Mw=8,700
Mw/Mn=1.88
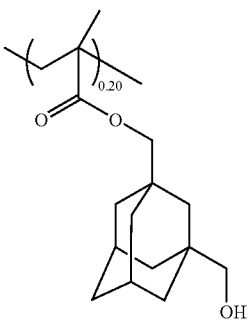
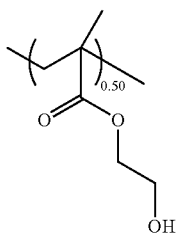

Resist Polymer 11

(comparative polymer for use in first resist composition)

Mw=7,700

Mw/Mn=1.68

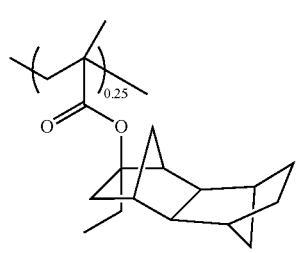
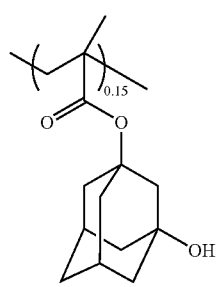
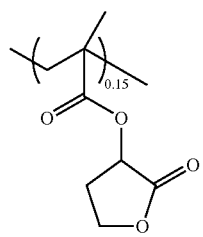

Resist Polymer 12

(comparative polymer for use in first resist composition)

Mw=6,600

Mw/Mn=1.67

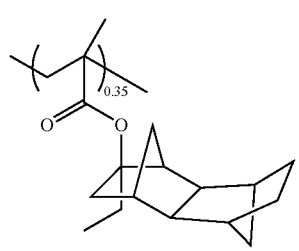
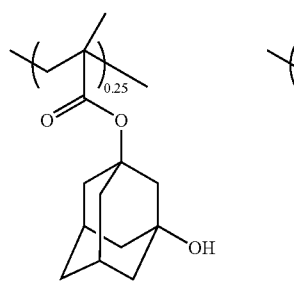

Resist Polymer 13

(comparative polymer for use in first resist composition)

Mw=7,500

Mw/Mn=1.80

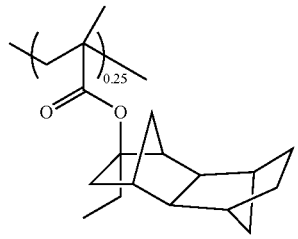
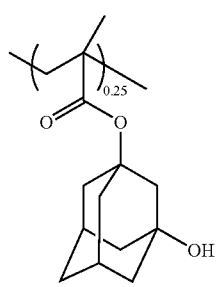
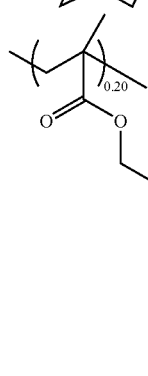

Polysiloxanes for use in second resist compositions for reversal transfer were synthesized as follows.

Synthesis Example 2

A 200-ml four-neck flask equipped with a stirrer, reflux condenser, dropping funnel, and thermometer was charged with 0.2 g of acetic acid, 20 g of water and 20 g of ethanol and kept at 30° C. To the flask, a solution of 9.1 g (30 mmol) of triethoxysilane compound A and 31.8 g (70 mmol) of triethoxysilane compound B in 40 g of ethanol was added dropwise over 3 hours.

triethoxysilane compound A

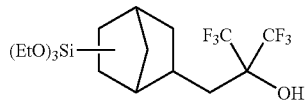

triethoxysilane compound B

The reaction mixture was aged at 30° C. for a further 20 hours, diluted with methyl isobutyl ketone, repeatedly washed with water until the organic layer became neutral, and concentrated, yielding 27.6 g of an oligomer.

Using 50 g of toluene, the oligomer was transferred into a 100-ml three-neck flask equipped with a stirrer, reflux condenser, and thermometer. Then 56 mg of potassium hydroxide was added to the solution, which was heated under reflux for 20 hours. The reaction solution was cooled, diluted with methyl isobutyl ketone, repeatedly washed with water until the organic layer became neutral, and concentrated, yielding 23.8 g of a polymer.

On NMR and GPC analysis, the product was identified to be Resist Polymer 14 of the following compositional formula, having a Mw of 3,500.

Resist Polymer 14

(polysiloxane for use in second resist composition)

Mw=3,400

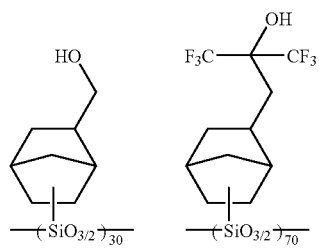

Variants of the ethoxysilane compound of the structure shown above could be formed by changing the silicon-bonded substituent structure. Thereafter, using an ethoxysilane variant, a polysiloxane compound of different constituent units (designated Resist Polymer 15) was synthesized by the same procedure as the above synthesis example.

Resist Polymer 15

(polysiloxane for use in second resist composition)

Mw=3,400

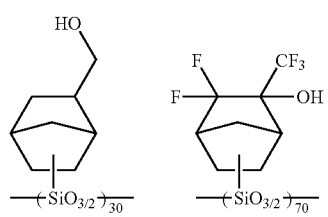

Example and Comparative Example

The polymers synthesized above were combined with a photoacid generator, basic compound, surfactant, thermal acid generator, and organic solvent, and in the case of second resist composition, an acid crosslinker. The ingredients were thoroughly mixed to form resist compositions.

Acid generator: PAG1 of the following structural formula

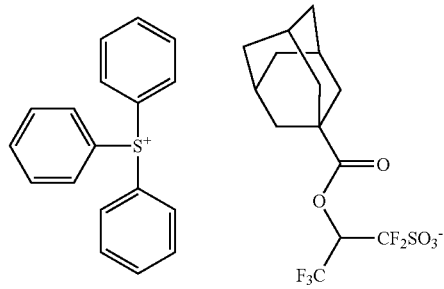

Acid generator: PAG2 of the following structural formula

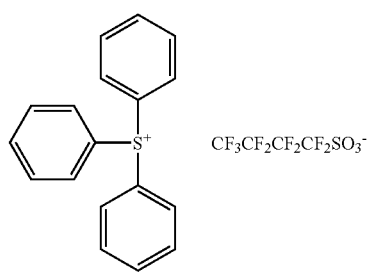

Basic compound: Quencher 1 of the following structural formula

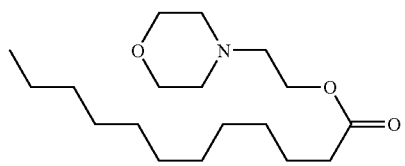

Basic compound: Quencher 2 of the following structural formula

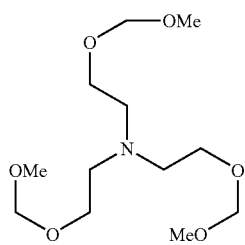

Basic compound: Quencher 3 of the following structural formula

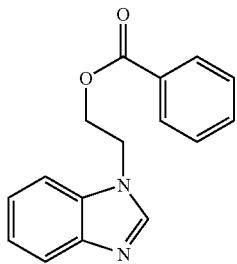

Thermal Acid Generator:
TAG1 of the following structural formula

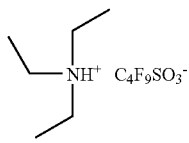

Crosslinker: CL of the following structural formula

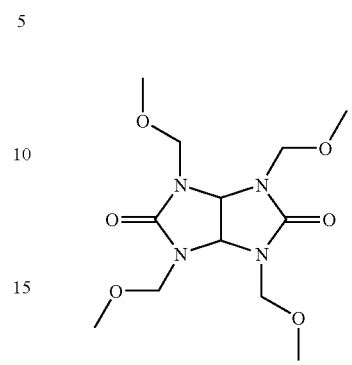

Organic solvent: propylene glycol monomethyl ether acetate (PGMEA)
Organic solvent: 2-methyl-1-butanol Table 1 tabulates the formulation of first resist composition, second resist composition and comparative first resist composition.

TABLE 1

| Resist composition | Formulation No. | Polymer (pbw) | PAG (pbw) | Basic compound (pbw) | TAG (pbw) | Acid crosslinker (pbw) | Solvent (pbw) |
|---|---|---|---|---|---|---|---|
| 1st resist | I-001 | Resist Polymer 1 (100) | PAG1 (16) | Quencher 1 (3) | — | — | PGMEA (2,700) |
| 1st resist | I-002 | Resist Polymer 2 (100) | PAG1 (16) | Quencher 1 (3) | — | — | PGMEA (2,700) |
| 1st resist | I-003 | Resist Polymer 3 (100) | PAG1 (16) | Quencher 1 (3) | — | — | PGMEA (2,700) |
| 1st resist | I-004 | Resist Polymer 4 (100) | PAG1 (16) | Quencher 1 (3) | — | — | PGMEA (2,700) |
| 1st resist | I-005 | Resist Polymer 4 (100) | PAG1 (16) | Quencher 1 (3) | TAG 1 (0.5) | — | PGMEA (2,700) |
| 1st resist | I-006 | Resist Polymer 5 (100) | PAG1 (16) | Quencher 1 (3) | — | — | PGMEA (2,700) |
| 1st resist | I-007 | Resist Polymer 6 (100) | PAG1 (16) | Quencher 1 (3) | — | — | PGMEA (2,700) |
| 1st resist | I-008 | Resist Polymer 7 (100) | PAG1 (16) | Quencher 1 (3) | — | — | PGMEA (2,700) |
| Comparative 1st resist | I-009 | Resist Polymer 11 (100) | PAG1 (16) | Quencher 1 (3) | — | — | PGMEA (2,700) |
| Comparative 1st resist | I-010 | Resist Polymer 12 (100) | PAG1 (16) | Quencher 1 (3) | — | — | PGMEA (2,700) |
| Comparative 1st resist | I-011 | Resist Polymer 13 (100) | PAG1 (16) | Quencher 1 (3) | — | — | PGMEA (2,700) |
| 2nd resist | II-001 | Resist Polymer 8 (100) | PAG2 (5) | Quencher 2 (1.4) | — | CL (3.5) | 2-Me-1-Butanol (5,000) |
| 2nd resist | II-002 | Resist Polymer 9 (100) | PAG2 (5) | Quencher 2 (1.4) | — | CL (3.5) | 2-Me-1-Butanol (5,000) |
| 2nd resist | II-003 | Resist Polymer 10 (100) | PAG2 (5) | Quencher 2 (1.4) | — | CL (3.5) | 2-Me-1-Butanol (5,000) |
| 2nd resist | II-004 | Resist Polymer 14 (100) | PAG2 (3.6) | Quencher 3 (1.13) | — | CL (3.2) | PGMEA (3,500) |
| 2nd resist | II-005 | Resist Polymer 15 (100) | PAG2 (3.6) | Quencher 3 (1.13) | — | CL (3.2) | PGMEA (3,500) |

Table 2 tabulates the patterning data of first resist compositions of Examples 1 to 8 and Comparative Examples 1 to 3.

The resist compositions prepared according to the formulation shown in Table 1 were filtered through a filter having a pore size of 0.2 μm, yielding positive resist film-forming coating solutions.

On a substrate (silicon wafer) having deposited thereon an antireflective coating (ARC-29A, Nissan Chemical Industries, Ltd.) of 90 nm thick, each resist solution was spin coated and prebaked on a hot plate at an optimum temperature for 60 seconds to form a resist film of 1,200 Å thick. As used herein, the term "optimum temperature" refers to the prebaking temperature which ensures that a pattern resulting from subsequent processing has a satisfactory profile which is highly rectangular and free of bridges or pattern edge chipping, when observed under top-down scanning electron microscope (TDSEM) S9320 (Hitachi, Ltd.). The optimum prebaking temperature is shown in Table 2.

The first resist film thus formed was subjected to patternwise exposure by means of an ArF scanner S-307E (Nikon Corp., NA 0.85, σ 0.93-0.62, dipole illumination). The mask used was a 6% halftone phase shift mask (HTPSM) bearing thereon a line-and-space design consisting of 70-nm lines and 160-nm pitches (equivalent resist pattern size). Exposure of the resist film was done while selecting an optimum focus and varying the exposure dose from a minimum dose to a maximum dose.

Following exposure, the resist film was baked for 60 seconds on a hot plate (post-exposure bake, PEB). The appropriate PEB temperature for each resist composition is also reported in Table 2. The appropriate PEB temperature refers to the temperature at which a wide process margin is observed for that resist composition. PEB was followed by development in a 2.38 wt % tetramethylammonium hydroxide (TMAH) aqueous solution for 30 seconds, yielding a positive pattern.

TABLE 2

| | 1st resist formulation No. | Prebake temp. (° C. × 60 sec) | PEB temp. (° C. × 60 sec) | Optimum exposure dose capable of 40 nm finish from mask design of 70 nm line/ 160 nm pitch (mJ) | Line size after 200° C. × 60 sec heating (nm) |
|---|---|---|---|---|---|
| Example 1 | I-001 | 100 | 100 | 50 | 37 |
| Example 2 | I-002 | 100 | 90 | 52 | 39 |
| Example 3 | I-003 | 100 | 90 | 52 | 38 |
| Example 4 | I-004 | 115 | 110 | 47 | 38 |
| Example 5 | I-005 | 115 | 110 | 43 | 39 |
| Example 6 | I-006 | 105 | 95 | 53 | 38 |
| Example 7 | I-007 | 100 | 100 | 45 | 38 |
| Example 8 | I-008 | 100 | 100 | 45 | 37 |
| Comparative Example 1 | I-009 | 100 | 100 | 50 | 45 |
| Comparative Example 2 | I-010 | 100 | 100 | 50 | 43 |
| Comparative Example 3 | I-011 | 95 | 90 | 50 | 52 |

Table 2 also reports the optimum exposure dose at which 40-nm lines were finished from the line-and-space design consisting of 70-nm lines and 160-nm pitches (equivalent resist pattern size) on the mask.

Now, to convert the first resist film to be alkali soluble and to impart thereto resistance to solvent for a second resist film to which the first resist pattern is to be transferred, the first resist film was heated at a high temperature. This heating was done on a hot plate at a temperature of 200° C. for 60 seconds. After this heating, a change in the size of 40-nm lines finished as above was measured. Table 2 reports the line size after heating.

In Comparative Example 3, the 40 nm lines after patterning were changed to be thicker by 200° C.×60 sec heating. A thermal flow was observed in the first resist pattern of Comparative Example 3 because the resist composition had a low glass transition temperature (Tg). The resist composition of Comparative Example 3 is inadequate because of a failure of nano-scale patterning of the first resist as reversal transfer pattern.

Next, a second resist composition was coated onto the first resist pattern obtained in Examples 1 to 8 and Comparative Examples 1 and 2. The coating thickness of the second resist composition was set at 600 Å on a flat substrate. Table 3 shows a change of the first resist pattern when the second resist composition was coated thereon. The prebaking temperature in coating of the second resist composition is also reported in Table 3.

In Comparative Examples 4 and 5 corresponding to Comparative Examples 1 and 2, respectively, the first resist pattern was disrupted by attack of the solvent in the second resist composition. Since the polymers in the first resist compositions of Comparative Examples 4 and 5 were not crosslinked during the high-temperature heating step for imparting organic solvent resistance, they were dissolved in the second resist solvent.

TABLE 3

| | 1st resist pattern | 2nd resist formulation No. | 2nd resist prebaking temp. (° C. × 60 sec) | 2nd resist coating thickness on flat substrate (Å) | 1st resist pattern after 2nd resist coating |
|---|---|---|---|---|---|
| Example 9 | pattern of Example 1 | II-004 | 130 | 600 | 2nd resist was properly coated on 1st resist |
| Example 10 | pattern of Example 2 | II-004 | 130 | 600 | 2nd resist was properly coated on 1st resist |
| Example 11 | pattern of Example 3 | II-004 | 130 | 600 | 2nd resist was properly coated on 1st resist |
| Example 12 | pattern of Example 4 | II-004 | 130 | 600 | 2nd resist was properly coated on 1st resist |

TABLE 3-continued

| | 1st resist pattern | 2nd resist formulation No. | 2nd resist prebaking temp. (° C. × 60 sec) | 2nd resist coating thickness on flat substrate (Å) | 1st resist pattern after 2nd resist coating |
|---|---|---|---|---|---|
| Example 13 | pattern of Example 5 | II-004 | 130 | 600 | 2nd resist was properly coated on 1st resist |
| Example 14 | pattern of Example 6 | II-004 | 130 | 600 | 2nd resist was properly coated on 1st resist |
| Example 15 | pattern of Example 7 | II-004 | 130 | 600 | 2nd resist was properly coated on 1st resist |
| Example 16 | pattern of Example 8 | II-004 | 130 | 600 | 2nd resist was properly coated on 1st resist |
| Comparative Example 4 | pattern of Comparative Example 1 | II-004 | 130 | 600 | 1st resist was dissolved in 2nd resist solution, pattern was disrupted |
| Comparative Example 5 | pattern of Comparative Example 2 | II-004 | 130 | 600 | 1st resist was dissolved in 2nd resist solution, pattern was disrupted |

After the second resist composition was coated on the first resist pattern which had been converted (or reversed) to be soluble in alkaline developer, the second resist film was exposed under the following conditions so as to define a pattern of spaces between features of the first resist pattern. Patternwise exposure was carried out by means of an ArF scanner S-307E (Nikon Corp., NA 0.85, σ 0.93-0.62, dipole illumination).

The mask used was a 6% HTPSM bearing thereon a line-and-space design consisting of 90-nm lines and 160-nm pitches and disposed such that exposure was performed over the first resist pattern to define an unexposed area at the center between lines of the first resist pattern. On patternwise exposure of the second resist film, the mask was carefully aligned so that the exposure region overlay the first resist pattern (for reversal transfer). The unexposed areas of the second resist film resulted in spaces (space pattern).

Exposure of the second resist film was done while selecting an optimum focus and varying the exposure dose from a minimum dose to a maximum dose.

In an experiment, the mask bore thereon a line-and-space design consisting of 90-nm lines and 160-nm pitches (or 70-nm spaces), a second resist space pattern of 40 nm was resolved at a high exposure dose, and the space pattern size resulting from reversal transfer of the first resist was intended to be 40 nm. This succeeded in a double patterning process capable of forming repeat patterns of 40-nm lines (and spaces) and 80-nm pitches. The results are shown in Table 4. Table 4 also reports the exposure dose of resolving the second resist film to 40 nm and the profile following double patterning.

TABLE 4

| | 1st resist pattern | 2nd resist formulation No. | 2nd resist prebake temp. (° C. × 60 sec) | 2nd resist coating thickness on flat substrate (Å) | 2nd resist PEB temp. (° C. × 60 sec) | Optimum exposure for space 40 nm finish from 2nd resist mask design of 90 nm line/ 160 nm pitch (mJ) | Profile after double patterning |
|---|---|---|---|---|---|---|---|
| Example 17 | pattern of Example 1 | II-001 | 110 | 600 | 80 | 35 | rectangular, good |
| Example 18 | pattern of Example 2 | II-001 | 110 | 600 | 80 | 36 | rectangular, good |
| Example 19 | pattern of Example 3 | II-001 | 110 | 600 | 80 | 38 | rectangular, good |
| Example 20 | pattern of Example 4 | II-001 | 110 | 600 | 80 | 36 | rectangular, good |
| Example 21 | pattern of Example 5 | II-001 | 110 | 600 | 80 | 36 | rectangular, good |
| Example 22 | pattern of Example 6 | II-001 | 110 | 600 | 80 | 37 | rectangular, good |
| Example 23 | pattern of Example 7 | II-001 | 110 | 600 | 80 | 38 | rectangular, good |
| Example 24 | pattern of Example 8 | II-001 | 110 | 600 | 80 | 38 | rectangular, good |
| Example 25 | pattern of Example 4 | II-002 | 110 | 600 | 80 | 40 | some top loss |
| Example 26 | pattern of Example 4 | II-003 | 110 | 600 | 80 | 38 | rectangular, good |
| Example 27 | pattern of Example 4 | II-004 | 130 | 600 | 110 | 36 | rectangular, good |
| Example 28 | pattern of Example 4 | II-005 | 130 | 600 | 110 | 33 | rectangular, good |

Japanese Patent Application No. 2008-098024 is incorporated herein by reference.

Although some preferred embodiments have been described, many modifications and variations may be made thereto in light of the above teachings. It is therefore to be understood that the invention may be practiced otherwise than as specifically described without departing from the scope of the appended Claims.

The invention claimed is:

1. A double pattern forming process comprising the steps of:
   coating a chemically amplified positive resist composition onto a processable substrate, said resist composition comprising a resist polymer comprising recurring units having an alkali-soluble group protected with an acid labile group which is eliminatable with acid, a photoacid generator, and a solvent, and prebaking the resist composition to remove the solvent and form a resist film,
   exposing the resist film to high-energy radiation in a first pattern of exposed and unexposed areas, post-exposure baking for causing the acid generated by the acid generator upon exposure to act on the acid labile groups on the resist polymer whereby the acid labile groups on the resist polymer in the exposed area undergo elimination reaction so that the resist polymer in the exposed area becomes alkali soluble, and developing the exposed resist film with an alkaline developer to form a first positive resist pattern,
   treating the first resist pattern so as to eliminate the acid labile groups on the resist polymer in the first resist pattern and to induce crosslinking in the resist polymer to such an extent that the resist polymer does not lose solubility in an alkaline developer, for thereby endowing the first resist pattern with resistance to an organic solvent to be used in a reversal film-forming composition,
   coating a reversal film-forming composition thereon to form a second resist film, said reversal film-forming composition being a chemically amplified negative resist composition comprising a resist polymer comprising recurring units having an alkali-soluble group, a photoacid generator, an acid crosslinker, and a solvent, and prebaking the resist composition to remove the solvent and form the second resist film, and
   exposing the second resist film to high-energy radiation in a second pattern of exposed and unexposed areas, post-exposure baking for causing the acid generated upon exposure to act on the crosslinker, thereby converting the resist polymer in the exposed area to be insoluble in alkaline developer, and developing the exposed second resist film with an alkaline developer to form a second negative resist pattern,
   wherein the last step of developing the exposed second resist film with an alkaline developer to form a second negative pattern includes the reversal transfer step of dissolving away the first positive pattern which has been converted to be soluble in the alkaline developer, so as to define a space pattern in the second negative resist film, thereby forming a reversal transfer pattern of the first positive resist film as well as the step of forming the second negative pattern.

2. The process of claim 1 wherein in the step of exposing, baking and developing to form a second negative resist pattern,
   exposure to the second pattern is performed over the first positive pattern so as to define spaces, which are removable by alkaline development, between spaces in the space pattern resulting from reversal transfer of the first positive pattern, whereby alternate patterns of lines and spaces are formed on the processable substrate.

3. The process of claim 1 wherein in the step of exposing, baking and developing to form a second negative resist pattern,
   exposure to the second pattern is performed at a position remote from the first positive pattern, whereby the second negative resist pattern is formed on the processable substrate apart from the pattern resulting from reversal transfer of the first resist pattern.

4. The process of claim 1 wherein in said chemically amplified positive resist composition, the resist polymer comprises (A) recurring units having a lactone ring and (B) recurring units of alicyclic structure having an alkali-soluble group protected with an acid labile group which is eliminatable with acid.

5. The process of claim 4 wherein in said chemically amplified positive resist composition, the resist polymer comprises (A) recurring units having a 7-oxanorbornane ring and (B) recurring units having an alkali-soluble group protected with an acid labile group of alicyclic structure which is eliminatable with acid, and
   the step of treating the first resist pattern so as to eliminate the acid labile groups on the resist polymer in the first resist pattern is performed by heating whereby elimination of acid labile groups and crosslinking of the resist polymer simultaneously take place.

6. The process of claim 4 wherein the recurring units (A) are recurring units having the general formula (a):

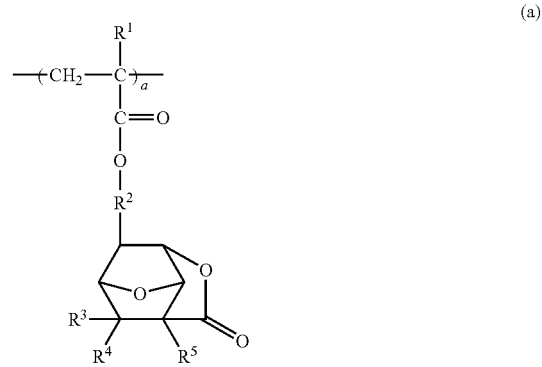

wherein $R^1$ is hydrogen or methyl, $R^2$ is a single bond or a straight, branched or cyclic $C_1$-$C_6$ alkylene group which may have an ether or ester group, and which has a primary or secondary carbon atom through which it is linked to the ester moiety in the formula, $R^3$, $R^4$, and $R^5$ are each independently hydrogen or a straight, branched or cyclic $C_1$-$C_6$ alkyl group, and "a" is a number in the range: $0<a<1.0$.

7. The process of claim 4 wherein the recurring units (B) are recurring units having the general formula (b):

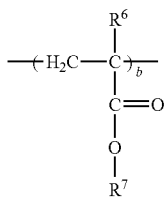

(b)

wherein $R^6$ is hydrogen or methyl, $R^7$ is an acid labile group, and b is a number in the range: $0<b\leqq0.8$.

8. The process of claim 1 wherein in said chemically amplified negative resist composition, the resist polymer comprises recurring units having an alkali-soluble group which is a fluorinated hydroxyalkyl group.

9. The process of claim 8 wherein the recurring units having a fluorinated hydroxyalkyl group are recurring units having the general formula (U) or (V):

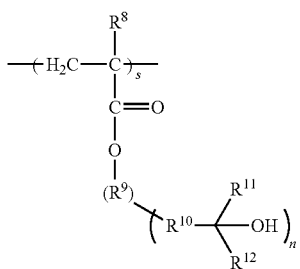

(U)

wherein $R^8$ is hydrogen or methyl, $R^9$ is a (n+1)-valent $C_1$-$C_{20}$ hydrocarbon group which may contain a heteroatom, $R^{10}$ is a single bond, $C_1$-$C_4$ alkylene group, or $C_1$-$C_4$ alkylene group in which some or all hydrogen atoms are substituted by fluorine atoms, $R^{11}$ and $R^{12}$ are each independently hydrogen, fluorine, $C_1$-$C_4$ alkyl group, or $C_1$-$C_4$ alkyl group in which some or all hydrogen atoms are substituted by fluorine atoms, at least either one of $R^{11}$ and $R^{12}$ contains fluorine, or either one of $R^{11}$ and $R^{12}$ may bond with $R^9$ to form a ring, n is 1 or 2, and s is a number in the range: $0<s\leqq0.8$,

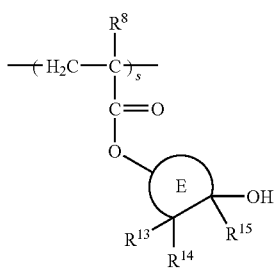

(V)

wherein $R^8$ is hydrogen or methyl, E is a $C_3$-$C_{12}$ cyclic hydrocarbon or bridged cyclic hydrocarbon group, which may contain hydroxy, —O— or —S—, $R^{13}$, $R^{14}$ and $R^{15}$ are each independently hydrogen, fluorine, or trifluoromethyl, at least one of $R^{13}$, $R^{14}$ and $R^{15}$ contains at least one fluorine atom, and s is a number in the range: $0<s\leqq0.8$.

10. The process of claim 8 wherein in said chemically amplified negative resist composition, the resist polymer comprises in addition to the recurring units having a fluorinated hydroxyalkyl group, recurring units having the general formula (W):

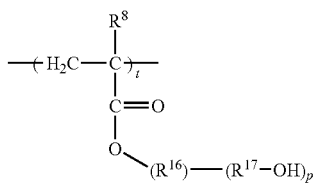

(W)

wherein $R^8$ is hydrogen or methyl, $R^{16}$ is a (p+1)-valent $C_1$-$C_{20}$ hydrocarbon group which may contain a heteroatom, $R^{17}$ is a single bond or $C_1$-$C_3$ alkylene group, p is an integer of 1 to 3, and t is a number in the range: $0<t\leqq0.8$.

11. The process of claim 1 wherein in said chemically amplified negative resist composition, the resist polymer comprises recurring units having an alkali-soluble group which is a fluorinated hydroxyalkyl group, the resist polymer being a polysiloxane compound.

12. The process of claim 11 wherein the polysiloxane compound comprises recurring structural units having the general formulae (2) and (3):

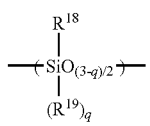

(2)

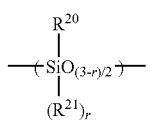

(3)

wherein $R^{18}$ is a $C_3$-$C_{20}$ monovalent organic group of straight, branched, cyclic or polycyclic structure which has a hydroxyl group on a carbon atom as a functional group, which has in total at least three fluorine atoms substituted on the carbon atoms bonded to the hydroxyl-bonded carbon atom, and which may contain a halogen, oxygen or sulfur atom in addition to the fluorine atoms, $R^{19}$ is a $C_1$-$C_6$ monovalent hydrocarbon group of straight, branched or cyclic structure, $R^{20}$ is a $C_3$-$C_{20}$ monovalent organic group of straight, branched, cyclic or polycyclic structure which has a hydroxymethyl group as a functional group, and which may further contain a halogen, oxygen or sulfur atom, $R^{21}$ is as defined for $R^{19}$, q is 0 or 1, and r is 0 or 1.

13. The process of claim 1 wherein the step of treating the first resist pattern for endowing the first resist pattern with resistance to an organic solvent to be used in a reversal film-forming composition includes heating at a higher temperature than in the prebaking and PEB steps.

14. A double pattern forming process comprising the steps of:
  coating a chemically amplified positive resist composition onto a processable substrate, said resist composition comprising a resist polymer comprising recurring units having an alkali-soluble group protected with an acid labile group which is eliminatable with acid, a photoacid generator, and a solvent, and prebaking the resist composition to remove the solvent to form a resist film, coating a protective film-forming composition onto the resist film and heating to remove solvent to form a protective film, exposing the resist film to high-energy radiation in a first pattern of exposed and unexposed areas, post-exposure baking for causing the acid generated by the acid generator upon exposure to act on the acid labile groups on the resist polymer whereby the acid labile groups on the resist polymer in the exposed area undergo elimination reaction so that the resist polymer in the exposed area becomes alkali soluble, and developing the exposed resist film with an alkaline developer to form a first positive resist pattern, treating the first resist pattern so as to eliminate the acid labile groups on the resist polymer in the first resist pattern and to induce crosslinking in the resist polymer to such an extent that the resist polymer does not lose solubility in an alkaline developer, for thereby endowing the first resist pattern with resistance to an organic solvent to be used in a reversal film-forming composition, coating a reversal film-forming composition thereon to form a second resist film, said reversal film-forming composition being a chemically amplified negative resist composition comprising a resist polymer comprising recurring units having an alkali-soluble group, a photoacid generator, an acid crosslinker and a solvent, and prebaking the second resist composition to remove the solvent to form the second resist film, coating a protective film-forming composition onto the reversal film and heating to remove solvent to form a protective film, and exposing the second resist film to high-energy radiation in a second pattern of exposed and unexposed areas, post-exposure baking for causing the acid generated upon exposure to act on the crosslinker whereby the resist polymer in the exposed area is converted to be insoluble in alkaline developer, and developing the exposed second resist film with an alkaline developer to form a second negative resist pattern, wherein the last step of developing the exposed second resist film with an alkaline developer to form a second negative pattern includes the reversal transfer step of dissolving away the first positive pattern which has been converted to be soluble in the alkaline developer, so as to define a space pattern in the second negative resist film, thereby forming a reversal transfer pattern of the first positive resist film as well as the step of forming the second negative pattern.

\* \* \* \* \*